(12) United States Patent
Hirano et al.

(10) Patent No.: US 7,374,860 B2
(45) Date of Patent: May 20, 2008

(54) POSITIVE RESIST COMPOSITION AND PATTERN FORMING METHOD USING THE SAME

(75) Inventors: Shuji Hirano, Shizuoka (JP); Kazuyoshi Mizutani, Shizuoka (JP)

(73) Assignee: Fuji Film Corporation, Tokyo (JP)

( * ) Notice: Subject to any disclaimer, the term of this patent is extended or adjusted under 35 U.S.C. 154(b) by 235 days.

(21) Appl. No.: 11/276,990

(22) Filed: Mar. 20, 2006

(65) Prior Publication Data

US 2006/0216635 A1 Sep. 28, 2006

(30) Foreign Application Priority Data

Mar. 22, 2005 (JP) ............................. 2005-081527

(51) Int. Cl.
*G03F 7/004* (2006.01)
*G03F 7/32* (2006.01)

(52) U.S. Cl. .................. 430/270.1; 430/326; 430/905; 430/910

(58) Field of Classification Search ............ 430/270.1, 430/326, 905, 910
See application file for complete search history.

(56) References Cited

U.S. PATENT DOCUMENTS 6,613,492 B2 * 9/2003 Lee .......................... 430/270.1
6,680,157 B1 1/2004 Fedynyshyn
2002/0090568 A1 7/2002 Lee
2003/0129531 A1 7/2003 Oberlander et al.
2004/0058270 A1 3/2004 Iwai et al.

FOREIGN PATENT DOCUMENTS

| EP | 1480078 A1 | 5/2004 |
|---|---|---|
| JP | 55-060503 A | 5/1980 |
| JP | 2002-55457 A | 2/2002 |
| JP | 2003-345023 A | 12/2003 |

OTHER PUBLICATIONS

European Search Report for EP 06005780 dated Oct. 9, 2007.

* cited by examiner

*Primary Examiner*—John S. Chu
(74) *Attorney, Agent, or Firm*—Sughrue Mion, PLLC

(57) ABSTRACT

The invention provides a positive resist composition for the pattern formation by the use of actinic rays or radiation, ensuring that the sensitivity, resolution and pattern profile are good, the line edge roughness is small and the surface roughness is satisfied, and a pattern forming method using the composition, wherein the positive resist composition is a positive resist composition comprising (A) a compound capable of generating an acid upon irradiation with actinic rays or radiation, and (B) a resin of which solubility in an alkali developer increases under the action of an acid, the resin comprising a specific repeating unit; and a pattern forming method using the composition.

11 Claims, No Drawings

POSITIVE RESIST COMPOSITION AND PATTERN FORMING METHOD USING THE SAME

BACKGROUND OF THE INVENTION

1. Field of the Invention

The present invention relates to a positive resist composition suitably used in the ultramicrolithography process for producing, for example, VLSI or high-capacity microchip or in other photofabrication processes, and a pattern forming method using the composition. More specifically, the present invention relates to a positive resist composition capable of forming a highly refined pattern with use of KrF excimer laser light, electron beam, EUV light or the like, and a pattern forming method using the composition, that is, the present invention relates to a positive resist composition suitably usable for fine processing of a semiconductor device, where KrF excimer laser light, electron beam or EUV light is used, and a pattern forming method using the composition.

2. Background Art

In the process of producing a semiconductor device such as IC and LSI, fine processing by lithography using a photoresist composition has been conventionally performed. Recently, the integration degree of an integrated circuit is becoming higher and formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using electron beam, X ray or EUV light is proceeding.

The lithography using electron beam or EUV light is positioned as a next-generation or next-next-generation pattern formation technique and a positive resist with high sensitivity and high resolution is being demanded. In particular, the elevation of sensitivity for shortening the wafer processing time is very important but in the positive resist for use with electron beam or EUV, when higher elevation is sought for, not only reduction of resolution but also worsening of line edge roughness are brought about and development of a resist satisfying these properties at the same time is strongly demanded. The line edge roughness as used herein means that the resist edge at the interface between the pattern and the substrate irregularly fluctuates in the direction perpendicular to the line direction due to the resist property and when the pattern is viewed from right above, the edge gives an uneven appearance. This unevenness is transferred by the etching step using the resist as a mask and causes deterioration of electric property, giving rise to decrease in the yield. Particularly, in the ultrafine region of 0.25 µm or less, the improvement of line edge roughness is an essential problem to be solved. The high sensitivity is in a trade-off relationship with high resolution, good pattern profile and good line edge roughness and it is very important how to satisfy these matters at the same time.

Furthermore, also in the lithography using X-ray or EUV light, it is similarly very important to satisfy high sensitivity, surface roughness and the like at the same time, and this problem needs to be solved.

As for the resist suitable for the lithography process using electron beam, X-ray or EUV light, a chemical amplification-type resist utilizing an acid catalytic reaction is mainly used from the standpoint of elevating the sensitivity and in the case of a positive resist, a chemical amplification-type resist composition mainly comprising an acid generator and a phenolic polymer which is insoluble or sparingly soluble in an alkali developer but becomes soluble in an alkali developer under the action of an acid (hereinafter simply referred to as a "phenolic acid-decomposable resin"), is being effectively used.

With respect to the positive resist for use with electron beam, X-ray or EUV, some resist compositions containing a phenolic acid-decomposable resin have been heretofore known (see, for example, Patent Documents 1 and 2: JP-A-2003-345023 (the term "JP-A" as used herein means an "unexamined published Japanese patent application") and JP-A-2002-55457, respectively).

However, it is impossible at present by any of these combinations to satisfy high resolution and good line edge roughness in the ultrafine region at the same time.

Furthermore, unlike a conventional light source, in the case of irradiating a high-energy ray such as EUV light, an outgassing problem becomes prominent, where a compound in the resist film is destroyed by fragmentation and volatizes as a low molecular component during exposure to contaminate the environment in the exposure apparatus. Various studies are being made for the reduction of outgassing and various techniques are attempted, such as a technique of providing a topcoat layer to suppress the volatilization of a low molecular compound (see, for example, Patent Document 3: European Patent 1,480,078) or a technique of adding a radical trapping agent for suppressing the decomposition of a polymer (see, for example, Patent Document 4: U.S. Pat. No. 6,680,157). Thus, an effort for reducing the outgassing is demanded also in terms of the acid generator.

SUMMARY OF THE INVENTION

An object of the present invention is to provide a positive resist composition for the pattern formation by the use of actinic rays or radiation, preferably by the use of electron beam, EUV light (extreme ultraviolet, wavelength: in the vicinity of 13 nm) or X-ray, ensuring that the sensitivity, resolution and pattern profile are good, the line edge roughness is small and the surface roughness is satisfied, and a pattern forming method using the composition.

Another object of the present invention is to provide a positive resist composition assured of high contrast under exposure to EUV light and good PEB temperature dependency and free of an outgassing problem at the exposure, and a pattern forming method using the composition.

The positive resist composition and the pattern forming method using the composition of the present invention have the following constitutions.

1. A positive resist composition comprising: (A) a compound capable of generating an acid upon irradiation with actinic rays or radiation; and (B) a resin of which solubility in an alkali developer increases under the action of an acid, the resin comprising at least a repeating unit represented by the following formula (B1) or (B2):

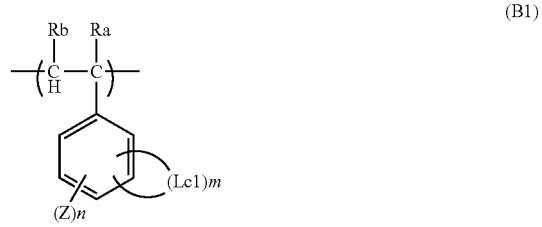

-continued

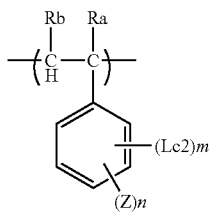

(B2)

wherein

Z represents an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group, Lc1 represents an atomic group for forming a lactone structure together with two carbon atoms of the aromatic ring, Lc2 represents a group having a lactone structure, Ra and Rb each independently represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkyl-carbonyloxy group or an aralkyl group, m represents an integer of 1 to 4, and n represents an integer of 0 to 4.

2. The positive resist composition as described in the item 1, wherein in formula (B1), the lactone structure formed by Lc1 is a lactone structure represented by the following formula (X1) and said lactone structure shares two adjacent carbon atoms with the aromatic ring of formula (B1):

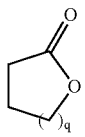

(X1)

wherein q represents an integer of 0 to 20.

3. The positive resist composition as described in the item 1 or 2, wherein in formula (B2), Lc2 is represented by the following formula (X2):

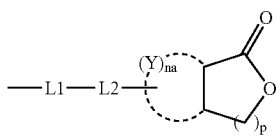

(X2)

wherein

L1 represents a single bond or a divalent linking group,

L2 represents a single bond or a group selected from alkylene, —O—, —OCO—, —COO—, —NHCO—, —CONH—, —S—, —SO$_2$— and —SO$_3$—, Y represents an atomic group for forming a crosslinked alicyclic structure together with two carbon atoms of the lactone structure, provided that when na is 0, L2 may be linked to any carbon atom of the lactone structure, na represents 0 or 1, and p represents an integer of 0 to 20.

4. The positive resist composition as described in any one of the items 1 to 3, wherein the compound (A) is a compound capable of generating an organic sulfonic acid upon irradiation with actinic rays or radiation.

5. The positive resist composition as described in any one of the items 1 to 3, wherein the compound (A) is a compound capable of generating a benzenesulfonic acid upon irradiation with actinic rays or radiation.

6. The positive resist composition as described in any one of the items 1 to 3, wherein the compound (A) is a sulfonium salt (AI) containing a cation represented by the following formula (AI):

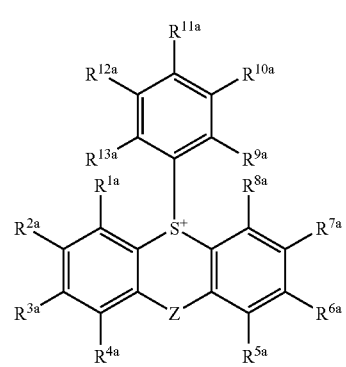

(AI)

wherein $R^{1a}$ to $R^{13a}$ each independently represents a hydrogen atom or a substituent and may combine with each other to form a ring, and Z represents a single bond or a divalent linking group.

7. The positive resist composition as described in any one of the items 1 to 3, wherein the compound (A) is a compound (AII) represented by the following formula (AII):

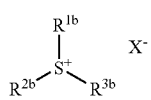

(AII)

wherein $R^{1b}$, $R^{2b}$ and $R^{3b}$ each independently represents an alkyl group, a cycloalkyl group or an aryl group, provided that the compounds ($R^{1b}$—H), ($R^{2b}$—H) and ($R^{3b}$—H) all have a boiling point of 160° C. or more (1 atm), and $X^-$ represents a non-nucleophilic anion.

8. The positive resist composition as described in any one of the items 1 to 7, which further comprises an organic basic compound.

9. The positive resist composition as described in any one of the items 1 to 8, wherein the actinic rays or radiation is EUV.

10. The positive resist composition as described in any one of the items 1 to 8, wherein the actinic rays or radiation is KrF.

11. A pattern forming method comprising: forming a resist film from the positive resist composition described in any one of the items 1 to 11; and exposing and developing said resist film.

According to the present invention, a positive resist composition ensuring that in the pattern formation by the irradiation with actinic rays or radiation, preferably with electron beam, EUV light or X-ray, the sensitivity and resolution are high and the pattern profile, line edge roughness and surface roughness are also satisfied, and a pattern forming method using the composition can be provided.

Furthermore, according to the present invention, a positive resist composition assured of sufficiently high contrast under irradiation with EUV light, no outgassing problem at the exposure and good PEB temperature dependency, and a pattern forming method using the composition, can be provided.

DETAILED DESCRIPTION OF THE INVENTION

The present invention is described in detail below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

[1] (A) Compound Capable of Generating an Acid Upon Irradiation with Actinic Rays or Radiation The compound capable of generating an acid upon irradiation with actinic rays or radiation (acid generator), which can be used in the present invention, may be appropriately selected from a photoinitiator for photocationic polymerization, a photoinitiator for photoradical polymerization, a photo-decoloring agent for dyes, a photo-discoloring agent, a known compound used for microresist or the like and capable of generating an acid upon irradiation with actinic rays or radiation, and a mixture thereof.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, a compound where such a group or compound capable of generating an acid upon irradiation with actinic rays or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid under irradiation with actinic rays or radiation described, for example, in U.S. Pat. No. 3,779,778 and European Patent 126,712 may also be used.

Among the compounds capable of generating an acid upon irradiation with actinic rays or radiation, preferred are the compounds represented by the following formulae (ZI), (ZII) and (ZIII):

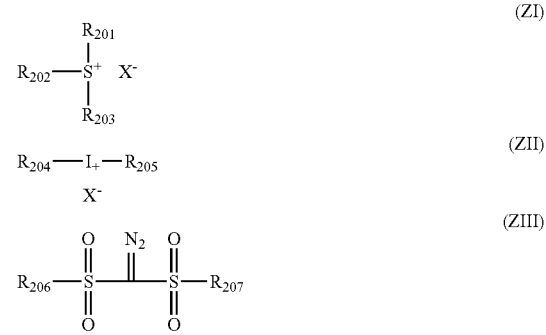

In formula (ZI), $R_{201}$, $R_{202}$ and $R_{203}$ each independently represents an organic group, and $X^-$ represents a non-nucleophilic anion.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group.

Examples of the group formed by combining two members out of $R_{201}$ to $R_{203}$ include an alkylene group (e.g., butylene, pentylene).

Specific examples of the organic group as $R_{201}$, $R_{202}$ and $R_{203}$ include corresponding groups in the compounds (ZI-1), (ZI-2) and (ZI-3) which are described later.

The compound may be a compound having a plurality of structures represented by formula (ZI). For example, the compound may be a compound having a structure that at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (Z1) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, a diarylcycloalkylsulfonium compound, an aryldialkylsulfonium compound and an aryldicycloalkylsulfonium compound.

The aryl group in the arylsulfonium compound is preferably a phenyl group or a naphthyl group, more preferably a phenyl group. In the case where the arylsulfonium compound has two or more aryl groups, these two or more aryl groups may be the same of different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably an alkyl group having a carbon number of 1 to 12, a cycloalkyl group having a carbon number of 3 to 12, or an alkoxy group having a carbon number of 1 to 12, and most preferably an alkyl group having a carbon number of 1 to 4 or an alkoxy group having a carbon number of 1 to 4. The substituent may be substituted to any one of three members $R_{201}$ to $R_{203}$ or may be substituted to all of these three members. In the case where $R_{201}$ to $R_{203}$ each is an aryl group, the substituent is preferably substituted at the p-position of the aryl group.

The alkyl group of $R_{201}$ to $R_{203}$ may have, as the substituent, the same cycloalkyl group, aryl group, alkoxy group, halogen atom, hydroxyl group or phenylthio group as the substituent for the aryl group and cycloalkyl group.

Examples of the non-nucleophilic anion of $X^-$ include a sulfonate anion, a carboxylate anion, a sulfonylimide anion, a bis(alkylsulfonyl)imide anion and a tris(alkylsulfonyl)methyl amnon.

The non-nucleophilic anion is an anion having an extremely low ability of causing a nucleophilic reaction, and this anion can suppress the decomposition in aging due to intramolecular nucleophilic reaction. By virtue of this anion, the aging stability of the resist is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

Preferred examples of the aliphatic hydrocarbon group in the aliphatic sulfonate anion include an alkyl group having a carbon number of 1 to 30, such as methyl group, ethyl group, propyl group, isopropyl group, n-butyl group, isobutyl group, sec-butyl group, pentyl group, neopentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group and eicosyl group, and a cycloalkyl group having a carbon number of 3 to 30, such as cyclopropyl group, cyclopentyl group, cyclohexyl group, adamantyl group, norbornyl group and boronyl group.

Preferred examples of the aromatic group in the aromatic sulfonate anion include an aryl group having a carbon number of 6 to 14, such as phenyl group, tolyl group and naphthyl group.

The alkyl group, cycloalkyl group and aryl group in the aliphatic sulfonate anion and aromatic sulfonate anion each may have a substituent.

Examples of the substituent include a halogen atom, an alkyl group, an alkoxy group and an alkylthio group.

Examples of the halogen atom include a chlorine atom, a bromine atom, a fluorine atom and an iodine atom.

Preferred examples of the alkyl group include an alkyl group having a carbon number of 1 to 15, such as methyl group, ethyl group, propyl group, isopropyl group, n-butyl group, isobutyl group, sec-butyl group, pentyl group, neopentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group and eicosyl group.

Preferred examples of the alkoxy group include an alkoxy group having from 1 to 5 carbon atoms, such as methoxy group, ethoxy group, propoxy group and butoxy group.

Preferred examples of the alkylthio group include an alkylthio group having a carbon number of 1 to 15, such as methylthio group, ethylthio group, propylthio group, isopropylthio group, n-butylthio group, isobutylthio group, sec-butylthio group, pentylthio group, neopentylthio group, hexylthio group, heptylthio group, octylthio group, nonylthio group, decylthio group, undecylthio group, dodecylthio group, tridecylthio group, tetradecylthio group, pentadecylthio group, hexadecylthio group, heptadecylthio group, octadecylthio group, nonadecylthio group and eicosylthio group. The alkyl group, alkoxy group and alkylthio group each may be further substituted by a halogen atom (preferably a fluorine atom).

Examples of the aliphatic hydrocarbon group in the aliphatic carboxylate anion are the same as those of the aliphatic hydrocarbon group in the aliphatic sulfonate anion.

Examples of the aromatic group in the aromatic carboxylate anion are the same as those of the aromatic group in the aromatic sulfonate anion.

Preferred examples of the aralkyl group in the aralkylcarboxylate anion include an aralkyl group having a carbon number of 6 to 12, such as benzyl group, phenethyl, naphthylmethyl, naphthylethyl group and naphthylmethyl group.

The alkyl group, cycloalkyl group, aryl group and aralkyl group in the aliphatic carboxylate anion, aromatic carboxylate anion and aralkylcarboxylate anion each may have a substituent, and examples of the substituent include the same halogen atom, alkyl group, alkoxy group and alkylthio group as those for the aliphatic sulfonate anion and aromatic sulfonate anion.

Examples of the sulfonylimide anion include a saccharine anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. This alkyl group may have a substituent, and examples of the substituent include a halogen atom, an alkoxy group substituted by a halogen atom, an alkoxy group and an alkylthio group, with an alkyl group substituted by fluorine atom being preferred.

Other examples of the non-nucleophilic anion include a phosphorus fluoride anion, a boron fluoride anion and an antimony fluoride anion.

The non-nucleophilic anion of $X^-$ is preferably an aliphatic sulfonate anion substituted by fluorine atom, an aromatic sulfonate anion substituted by fluorine atom or a group having fluorine atom, a bis(alkylsulfonyl)imide anion with the alkyl group being substituted by fluorine atom, or a tris(alkylsulfonyl)methide anion with the alkyl group being substituted by fluorine atom.

The non-nucleophilic anion of $X^-$ is more preferably a fluorine-substituted aliphatic sulfonate anion having a carbon number of 4 to 8, still more preferably nonafluorobutanesulfonate anion or perfluorooctanesulfonate anion.

The compound (ZI-2) is described below.

The compound (ZI-2) is a compound where $R_{201}$ to $R_{203}$ in formula (ZI) each independently represents an aromatic ring-free organic group. The aromatic ring as used herein includes an aromatic ring containing a heteroatom.

The aromatic ring-free organic group as $R_{201}$ to $R_{203}$ generally has a carbon number of 1 to 30, preferably from 1 to 20.

$R_{201}$ to $R_{203}$ each is independently preferably an aliphatic hydrocarbon group, more preferably a linear, branched or cyclic 2-oxoalkyl group or an alkoxycarbonylmethyl group, and most preferably a linear or branched 2-oxoalkyl group.

The aliphatic hydrocarbon group as $R_{201}$ to $R_{203}$ may be either a linear or branched alkyl group or a cycloalkyl group, and preferred examples thereof include a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl). The aliphatic hydrocarbon group is more preferably a 2-oxoalkyl group or an alkoxycarbonylmethyl group.

The 2-oxoalkyl group, which may be linear, branched or cyclic, is preferably a group having >C=O at the 2-position of the above-described alkyl or cycloalkyl group.

Preferred examples of the alkoxy group in the alkoxycarbonylmethyl group include an alkoxy group having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

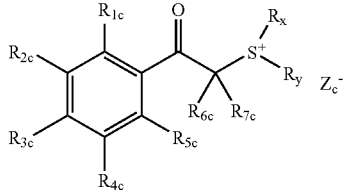

(ZI-3)

In formula (ZI-3), $R_{1c}$ to $R_{5c}$ each independently represents a hydrogen atom, an alkyl group, a cycloalkyl group, an alkoxy group or a halogen atom, $R_{6c}$ and $R_{7c}$ each independently represents a hydrogen atom, an alkyl group or a cycloalkyl group, and $R_x$ and $R_y$ each independently represents an alkyl group, a cycloalkyl group, an allyl group or a vinyl group.

Any two or more members out of $R_{1c}$ to $R_{5c}$ or a pair of $R_{6c}$ and $R_{7c}$ or of $R_x$ and $R_y$ may combine with each other to form a ring structure, and the ring structure may contain an oxygen atom, a sulfur atom, an ester bond or an amide bond. Examples of the group formed by combining any two or more members out of $R_{1c}$ to $R_{5c}$ or combining a pair of $R_{6c}$ and $R_{7c}$ or of $R_x$ and $R_y$ include a butylene group and a pentylene group.

$Z_c^-$ represents a non-nucleophilic anion having the same meaning as the non-nucleophilic anion of $X^-$ in formula (ZI).

The alkyl group as $R_{1c}$ to $R_{7c}$, which may be linear or branched, is, for example, a linear or branched alkyl group having a carbon number of 1 to 20, preferably a linear or branched alkyl group having a carbon number of 1 to 12 (e.g., methyl, ethyl, linear or branched propyl, linear or branched butyl, linear or branched pentyl).

The cycloalkyl group as $R_{1c}$ to $R_{7c}$ is, for example, a cycloalkyl group having a carbon number of 3 to 20, preferably a cycloalkyl group having a carbon number of 3 to 8 (e.g., cyclopentyl, cyclohexyl).

The alkoxy group as $R_{1c}$ to $R_{5c}$, which may be linear, branched or cyclic, is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. In this case, the solubility in a solvent is more enhanced and the generation of particles during storage is suppressed.

Examples of the alkyl group and cycloalkyl group as $R_x$ and $R_y$ are the same as those of the alkyl group and cycloalkyl group as $R_{1c}$ to $R_{7c}$. Among these, a 2-oxoalkyl group and an alkoxymethyl group are preferred.

Examples of the 2-oxoalkyl group include a group having >C=O at the 2-position of the alkyl group or cycloalkyl group as $R_{1c}$ to $R_{7c}$.

Examples of the alkoxy group in the alkoxycarbonylmethyl group are the same as those of the alkoxy group as $R_{1c}$ to $R_{5c}$.

$R_x$ and $R_y$ each is preferably an alkyl or cycloalkyl group having a carbon number of 4 or more, more preferably 6 or more, still more preferably 8 or more.

In formulae (ZIT) and (ZIII), $R_{204}$ to $R_{207}$ each independently represents an aryl group, an alkyl group or a cycloalkyl group.

The aryl group of $R_{204}$ to $R_{207}$ is preferably a phenyl group or a naphthyl group, more preferably a phenyl group.

The alkyl group of $R_{204}$ to $R_{207}$, which may be linear or branched, is preferably a linear or branched alkyl group having a carbon number of 1 to 10 (e.g., methyl, ethyl, propyl, butyl, pentyl).

The cycloalkyl group of $R_{204}$ to $R_{207}$ is preferably a cycloalkyl group having a carbon number of 3 to 10 (e.g., cyclopentyl, cyclohexyl, norbornyl).

The aryl group, alkyl group and cycloalkyl group of $R_{204}$ to $R_{207}$ each may have a substituent. Examples of the substituent which the aryl group, alkyl group and cycloalkyl group of $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents a non-nucleophilic anion having the same meaning as the non-nucleophilic anion of $X^-$ in formula (ZI).

Other examples of the compound capable of generating an acid upon irradiation with actinic rays or radiation include the compounds represented by the following formulae (ZIV) to (ZVII):

$$Ar_3-SO_2-SO_2-Ar_4 \quad (ZIV)$$

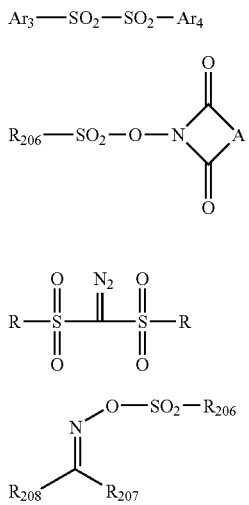

(ZV)

(ZVI)

(ZVII)

In formulae (ZIV) to (ZVII), $Ar_3$ and $Ar_4$ each independently represents an aryl group, $R_{206}$ represents an alkyl group, a cycloalkyl group or an aryl group, A represents an alkylene group, an alkenylene group or an arylene group.

R each independently represents an alkyl group, a cycloalkyl group or an aryl group, $R_{207}$ represents an electron-withdrawing group, preferably a cyano group or a fluoroalkyl group, and $R_{208}$ represents an alkyl group, a cycloalkyl group or an aryl group.

Among the compounds capable of generating an acid upon irradiation with actinic rays or radiation, the compounds represented by formulae (ZI) to (ZIII) are preferred.

Among the compounds capable of generating an acid upon irradiation with actinic rays or radiation, more preferred is a sulfonium salt represented by formula (ZI), still more preferred is a sulfonium salt having a carbonyl group, and most preferred are a compound where in the compound (ZI-2), any one of $R_{201}$ to $R_{203}$ has a 2-oxoalkyl group, and a compound represented by formula (ZI-3). By virtue of using a compound having a carbonyl group, the sensitivity is particularly enhanced.

Specific examples of the organic sulfonic acid which is particularly preferred out of the compounds capable of generating an acid upon irradiation with actinic rays or radiation, are set forth below.

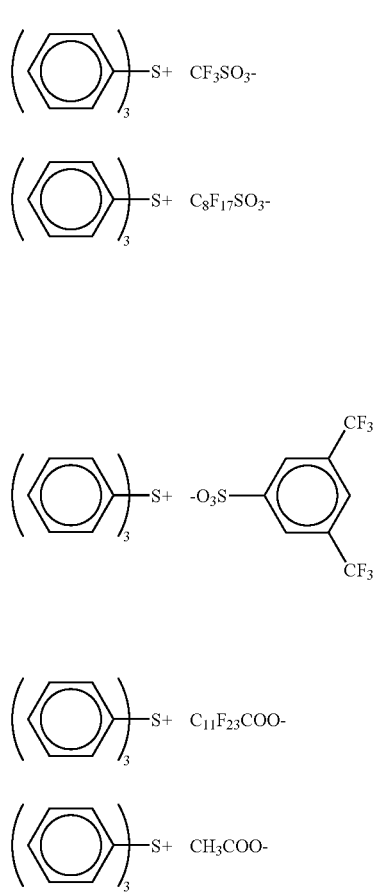

-continued
(z10)
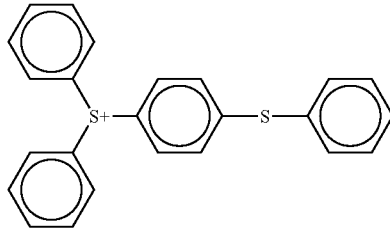 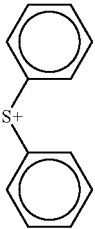 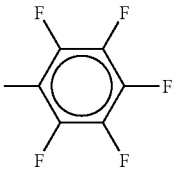
(z11) (z12)
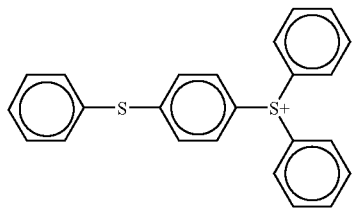 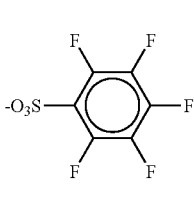 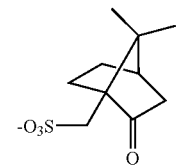
(z13) (z14)
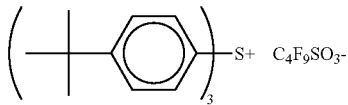 C$_4$F$_9$SO$_3$- 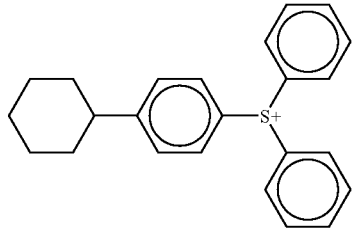 C$_4$F$_9$SO$_3$-
(z15) (z16)
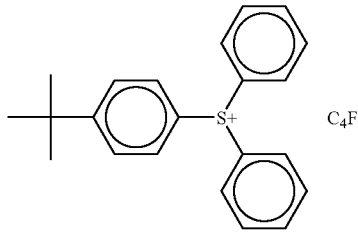 C$_4$F$_9$SO$_3$- 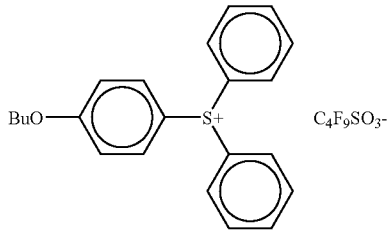 C$_4$F$_9$SO$_3$-
(Z17) (z18)
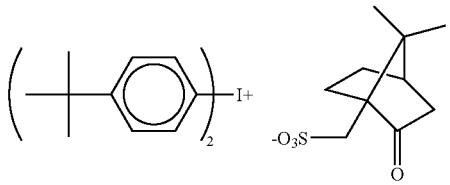 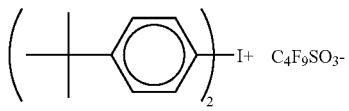 C$_4$F$_9$SO$_3$-
(z19) (z20)
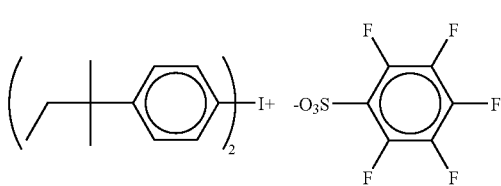 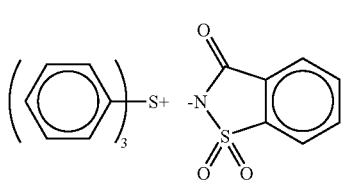
(z21) (z22)
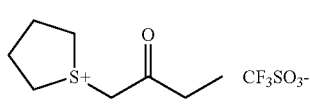 CF$_3$SO$_3$- 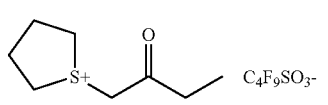 C$_4$F$_9$SO$_3$-
(z23) (z24)
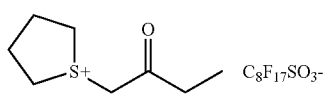 C$_8$F$_{17}$SO$_3$- 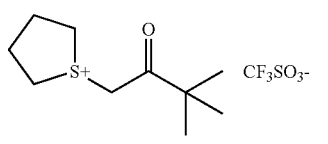 CF$_3$SO$_3$-

-continued
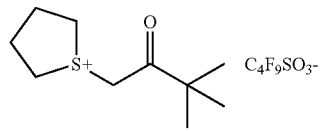 (z25)
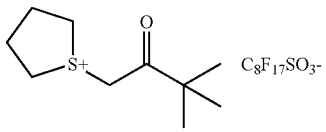 (z26)
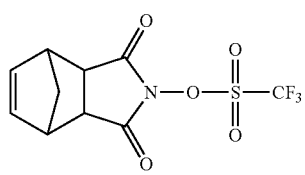 (z27)
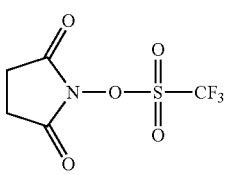 (z28)
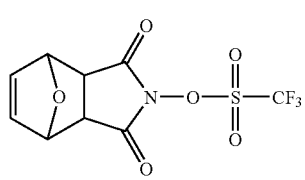 (z29)
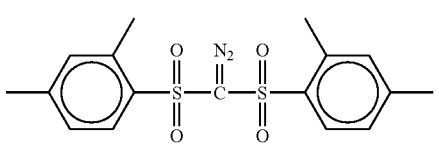 (z30)
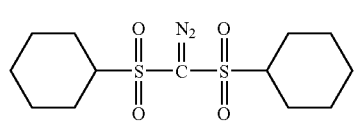 (z31)
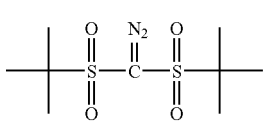 (z32)
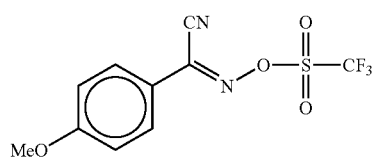 (z33)
 (z34)
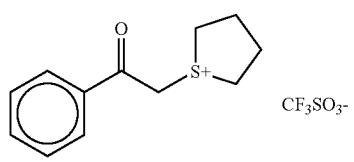 (z35)
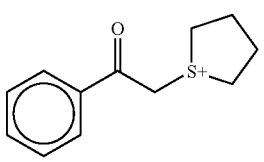 (z36)
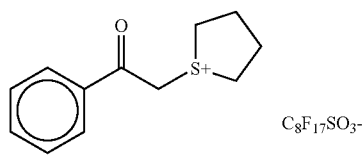 (z37)
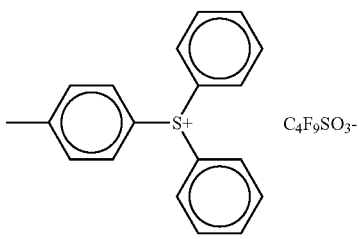 (z38)
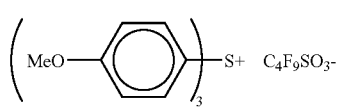 (z39)
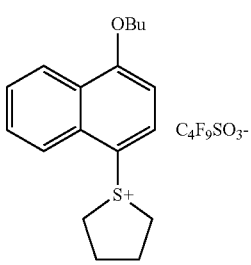 (z40)

-continued
(z41) 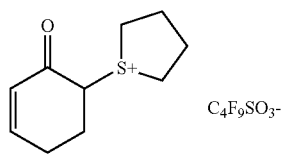 C4F9SO3-
(z42) 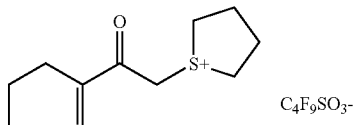 C4F9SO3-
(z43) 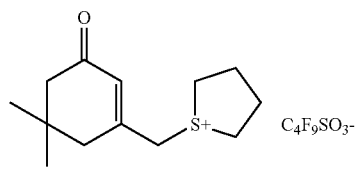 C4F9SO3-
(z44) 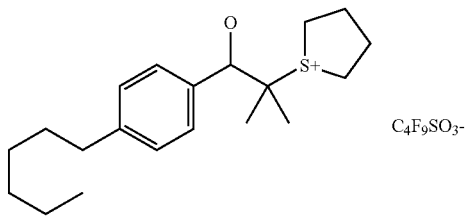 C4F9SO3-
(z45) 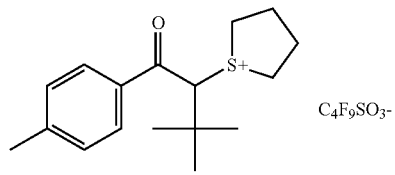 C4F9SO3-
(z46) 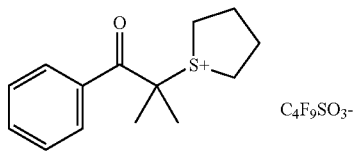 C4F9SO3-
(z47) 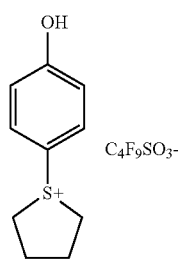 C4F9SO3-
(z48) 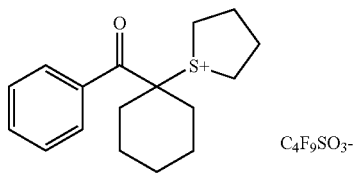 C4F9SO3-
(z49) 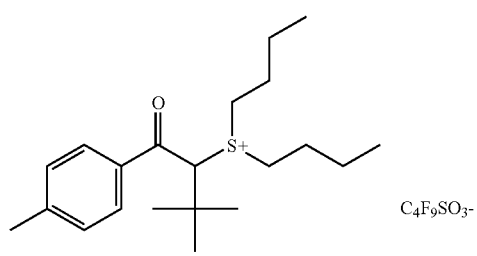 C4F9SO3-
(z50) 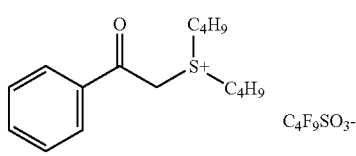 C4F9SO3-
(z51) 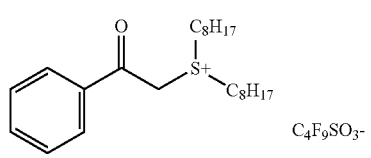 C4F9SO3-
(z52) 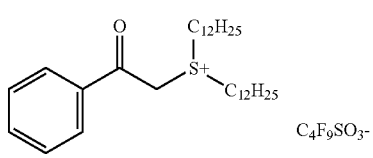 C4F9SO3-
(z53) 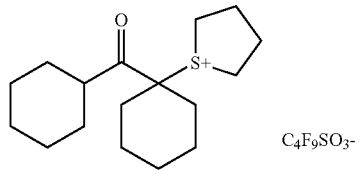 C4F9SO3-
(z54) 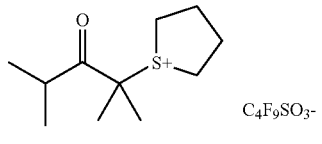 C4F9SO3-

Among these compounds, a compound capable of generating an organic sulfonic acid upon irradiation with actinic rays or radiation is preferred, and a compound capable of generating a benzenesulfonic acid upon irradiation with actinic rays or radiation, such as (z4), (z5), (z10), (z11), (z19) and (z20), is more preferred.

The compound capable of generating an acid upon irradiation with actinic rays or radiation is more preferably a sulfonium salt (AI) containing a cation represented by the following formula (AI):

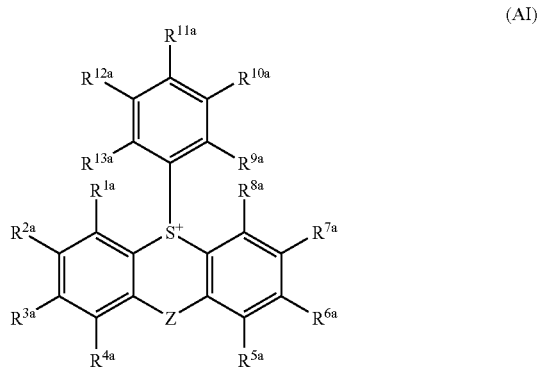

wherein
$R^{1a}$ to $R^{13a}$ each independently represents a hydrogen atom or a substituent and may combine with each other to form a ring, and Z represents a single bond or a divalent linking group.

The substituent of $R^{1a}$ to $R^{13a}$ in formula (AI) is not particularly limited and may be any substituent, but examples thereof include a halogen atom, an alkyl group (including here a cycloalkyl group, a bicycloalkyl group and a tricycloalkyl group), an alkenyl group (including here a cycloalkenyl group and a bicycloalkenyl group), an alkynyl group, an aryl group, a heterocyclic group (may also be called a hetero-ring group), a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl- or aryl-sulfonylamino group, a mercapto group, an alkylthio group, an arylthio group, a heterocyclic thio group, a sulfamoyl group, a sulfo group, an alkyl- or aryl-sulfinyl group, an alkyl- or aryl-sulfonyl group, an acyl group, an aryloxycarbonyl group, an alkoxycarbonyl group, a carbamoyl group, an aryl or heterocyclic azo group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H) and other known substituents.

Two members out of $R^{1a}$ to $R^{13a}$ may form a ring in cooperation (may form an aromatic or non-aromatic hydrocarbon ring or a heterocyclic ring). Examples of the combination of two or more members out of $R^{1a}$ to $R^{13a}$ include a pair of $R^{1a}$ and $R^{13a}$ and a pair of $R^{8a}$ and $R^{9a}$.

The ring formed may be a polycyclic condensed ring. Specific examples of the ring include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring and a phenazine ring.

$R^{1a}$ to $R^{13a}$ each is preferably a hydrogen atom, a halogen atom, an alkyl group (including here a cycloalkyl group, a bicycloalkyl group and a tricycloalkyl group), an alkenyl group (including here a cycloalkenyl group and a bicycloalkenyl group), an alkynyl group, an aryl group, a cyano group, a hydroxyl group, a carboxyl group, an alkoxy group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkyl- or aryl-sulfonylamino group, an alkylthio group, an arylthio group, a sulfamoyl group, an alkyl- or aryl-sulfonyl group, an aryloxycarbonyl group, an alkoxycarbonyl group, a carbamoyl group, an imido group, a silyl group or a ureido group.

$R^{1a}$ to $R^{13a}$ each is more preferably a hydrogen atom, a halogen atom, an alkyl group (including here a cycloalkyl group, a bicycloalkyl group and a tricycloalkyl group), a cyano group, a hydroxyl group, an alkoxy group, an acyloxy group, an acylamino group, an aminocarbonylamino group, an alkoxycarbonylamino group, an alkyl- or aryl-sulfonylamino group, an alkylthio group, a sulfamoyl group, an alkyl- or aryl-sulfonyl group, an alkoxycarbonyl group or a carbamoyl group.

$R^{1a}$ to $R^{13a}$ each is still more preferably a hydrogen atom, an alkyl group (including here a cycloalkyl group, a bicycloalkyl group and a tricycloalkyl group), a cyano group, a hydroxyl group, an alkoxy group or an alkylsulfonyl group.

The substituent as $R^{1a}$ to $R^{13a}$ preferably has a carbon number of 20 or less, more preferably 15 or less.

Examples of the divalent linking group of Z include an alkylene group, an arylene group, a carbonyl group, a sulfonyl group, a carbonyloxy group, a carbonylamino group, a sulfonylamido group, an ether group, a thioether group, an amino group, a disulfide group, an acyl group, an alkylsulfonyl group, —CH=CH—, —C≡C—, an aminocarbonylamino group and an aminosulfonylamino group, and each group may have a substituent. Examples of the substituent of these groups are the same as those of the substituent described above for $R^{1a}$ to $R^{13a}$.

The linking group as Z preferably has a carbon number of 15 or less, more preferably 10 or less.

Z is preferably a single bond, an alkylene group, a carbonyl group, a sulfonyl group, an ester group, an ether group or a thioether group, more preferably a single bond, an alkylene group, a carbonyl group or a sulfonyl group.

The sulfonium salt (AI) containing a cation represented by formula (AI) has a counter anion. The counter anion is preferably an organic anion. The organic anion indicates an anion having at least one carbon atom. The organic anion is preferably a non-nucleophilic anion. The non-nucleophilic anion is an anion having an extremely low ability of causing a nucleophilic reaction, and this anion can suppress the decomposition in aging due to intra-molecular nucleophilic reaction.

Examples of the non-nucleophilic anion include a sulfonate anion, a carboxylate anion, a sulfonylimide anion, a bis(alkylsulfonyl)imide anion and a tris(alkylsulfonyl)methyl anion.

Examples of the non-nucleophilic sulfonate anion include an aliphatic sulfonate anion, an aromatic sulfonate anion and a camphorsulfonate anion. Examples of the non-nucleophilic carboxylate anion include an aliphatic carboxylate anion, an aromatic carboxylate anion and an aralkylcarboxylate anion.

The aliphatic moiety in the aliphatic sulfonate anion may be an alkyl group or a cycloalkyl group and is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group.

The aromatic group in the aromatic sulfonate anion is preferably an aryl group having a carbon number of 6 to 14, and examples thereof include a phenyl group, a tolyl group and a naphthyl group.

Examples of the substituent for the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 5), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), and an alkoxycarbonyloxy group (preferably having a carbon number of 2 to 7). As for the aryl group or ring structure in each group, examples of the substituent further include an alkyl group (preferably having a carbon number of 1 to 15).

Examples of the aliphatic moiety in the aliphatic carboxylate anion include the same alkyl group and cycloalkyl group as those in the aliphatic sulfonate anion. Examples of the aromatic group in the aromatic carboxylate anion include the same aryl group as those in the aromatic sulfonate anion. The aralkyl group in the aralkylcarboxylate anion is preferably an aralkyl group having a carbon number of 6 to 12, and examples thereof include a benzyl group, a phenethyl group, a naphthylethyl group and a naphthylmethyl group.

Examples of the substituent for the alkyl group, cycloalkyl group, aryl group and aralkyl group in the aliphatic carboxylate anion, aromatic carboxylate anion and aralkylcarboxylate anion include the same halogen atom, alkyl group, cycloalkyl group, alkoxy group and alkylthio group as those in the aromatic sulfonate anion. Examples of the sulfonylimide anion include a saccharine anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of this alkyl group include a halogen atom, an alkoxy group substituted by a halogen atom, an alkoxy group and an alkylthio group.

Other examples of the non-nucleophilic anion include phosphorus fluoride, boron fluoride and antimony fluoride.

The counter anion of the sulfonium salt (AI) containing a cation represented by formula (AI) is preferably a sulfonate anion, more preferably an arylsulfonate.

Specific preferred examples of the counter anion include (B2-1) methanesulfonate anion, (B2-2) trifluoromethanesulfonate anion, (B2-3) pentafluoroethanesulfonate anion, (B2-4) heptafluoropropanesulfonate anion, (B2-5) perfluorobutanesulfonate anion, (B2-6) perfluorohexanesulfonate anion, (B2-7) perfluorooctanesulfonate anion, (B2-8) pentafluorobenzenesulfonate anion, (B2-9) 3,5-bistrifluoromethylbenzenesulfonate anion, (B2-10) 2,4,6-triisopropylbenzenesulfonate anion, (B2-11) perfluoroethoxyethanesulfonate anion, (B2-12) 2,3,5,6-tetrafluoro-4-dodecyloxybenzenesulfonate anion, (B2-13) methanesulfonate anion, (B2-14) p-toluenesulfonate anion, (B2-15) 3,5-bistrifluorobenzenesulfonate anion, (B2-16) pentafluorobenzenesulfonate anion and (B2-17) 2,4,6-trimethylbenzenesulfonate anion.

The anion present together with the cation represented by formula (AI) in the sulfonium salt (AI) may be monovalent or may be divalent or more. In the case where the anion is divalent or more, the sulfonium salt (AI) may have two or more cations represented by formula (AI).

The molecular weight of the sulfonium salt (AI) containing a cation represented by formula (AI) is generally from 250 to 1,500, preferably from 250 to 1,000.

The sulfonium salt (AI) containing a cation represented by formula (AI) can be synthesized by converting a cyclic sulfide compound into a sulfoxide through oxidation with hydrogen peroxide, reacting a diphenylsulfoxide compound therewith in the presence of an acid catalyst to produce a triphenylsulfonium salt structure, and then performing salt exchange with a desired anion.

Specific examples of the cation represented by formula (AI) are set forth below, but the present invention is not limited thereto.

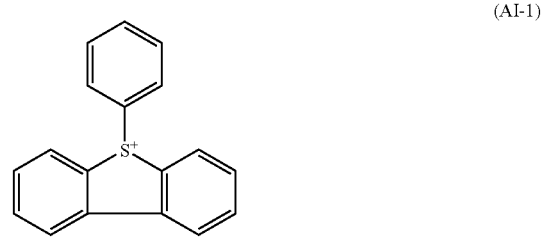

(AI-1)

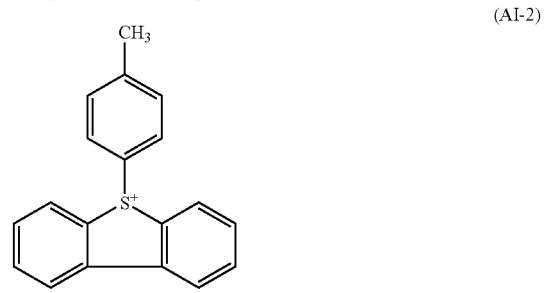

(AI-2)

-continued
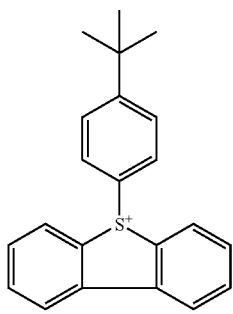
(AI-3)
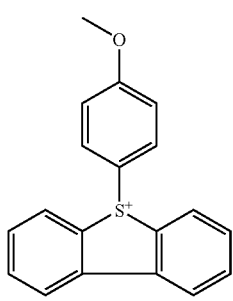
(AI-4)
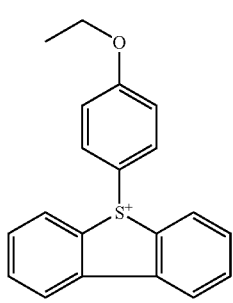
(AI-5)
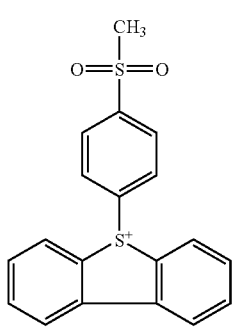
(AI-6)
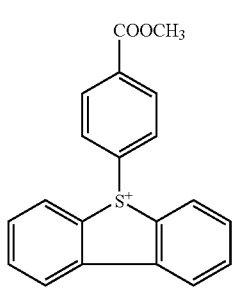
(AI-7)
-continued
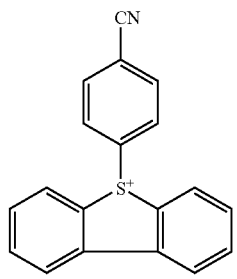
(AI-8)
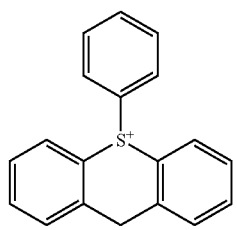
(AI-9)
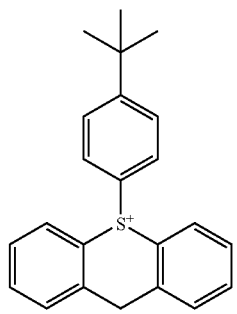
(AI-10)
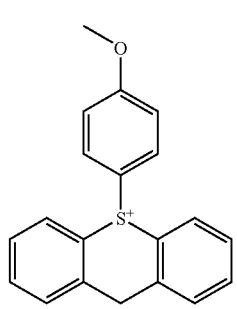
(AI-11)
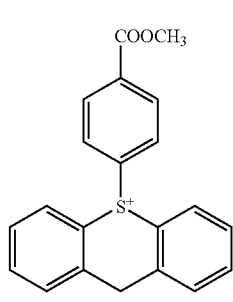
(AI-12)

-continued
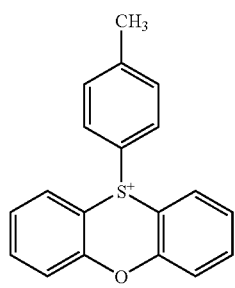
(AI-13)
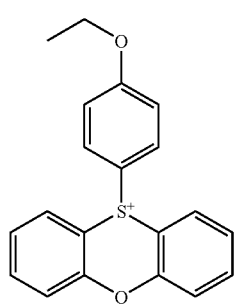
(AI-14)
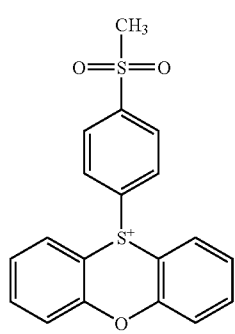
(AI-15)
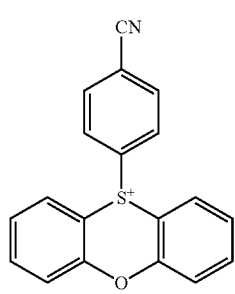
(AI-16)
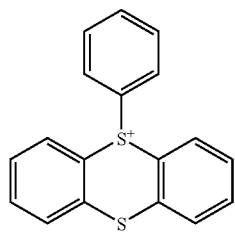
(AI-17)
-continued
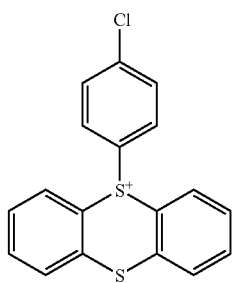
(AI-18)
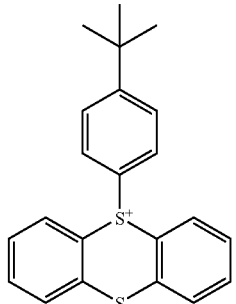
(AI-19)
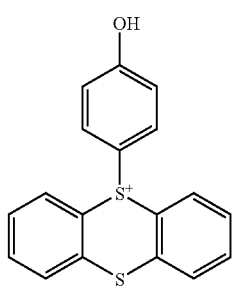
(AI-20)
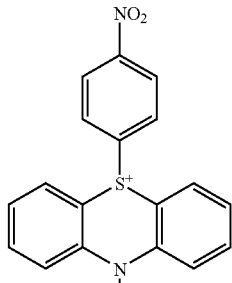
(AI-21)
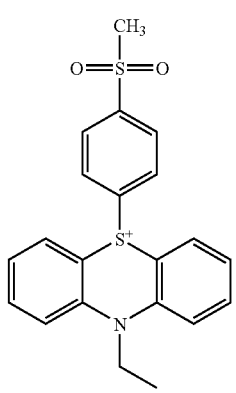
(AI-22)

-continued
(AI-23)
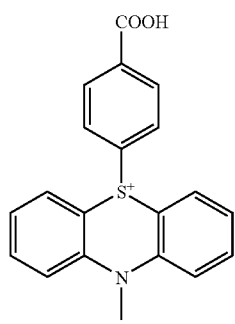
(AI-27)
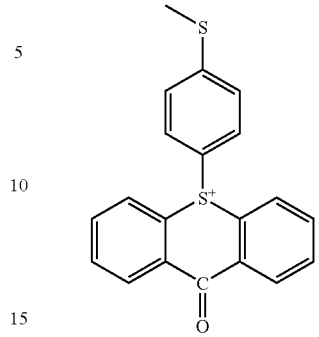
(AI-24)
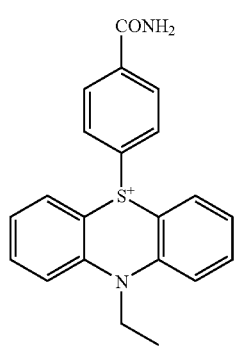
(AI-28)
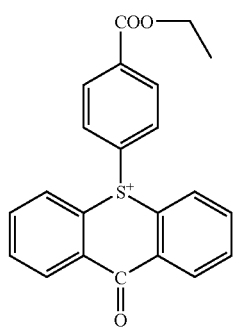
(AI-25)
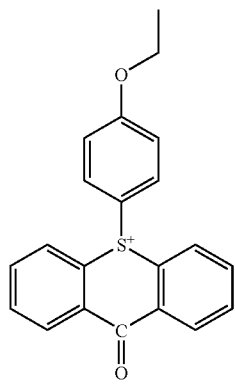
(AI-29)
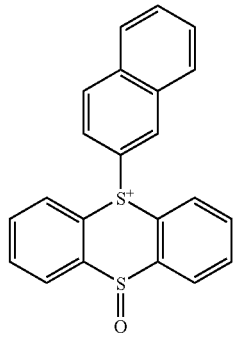
(AI-26)
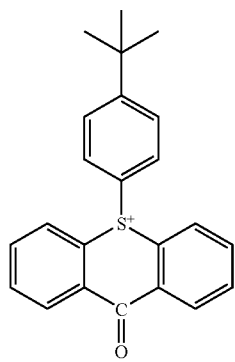
(AI-30)
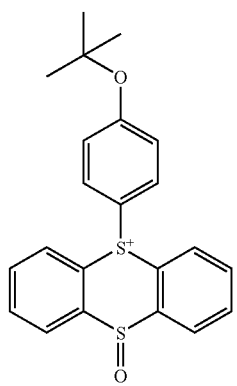

-continued
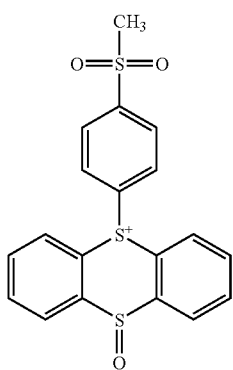 (AI-31)
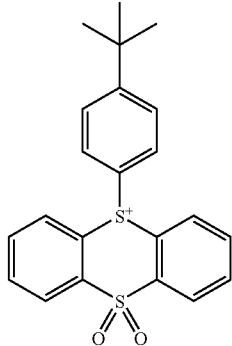 (AI-35)
(AI-32)
(AI-36)
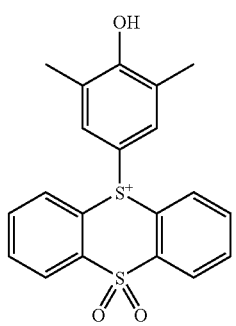
(AI-33)
(AI-37)
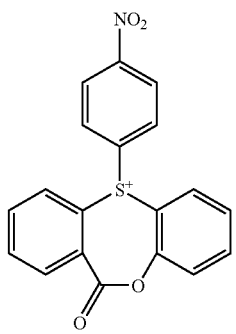
(AI-34)
(AI-38)
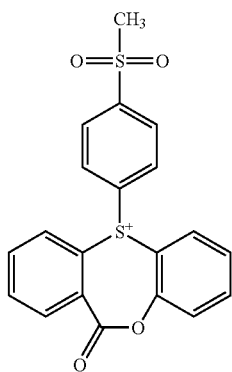

-continued
(AI-39)
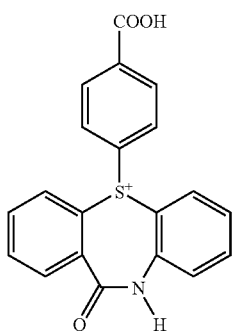
(AI-40)
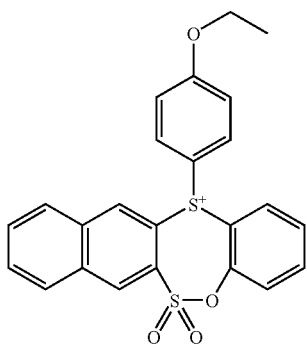
(AI-41)
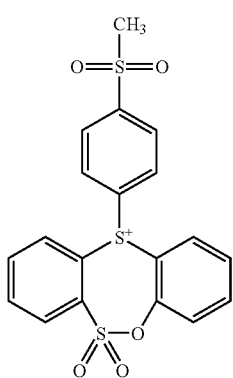
(AI-42)
-continued
(AI-43)
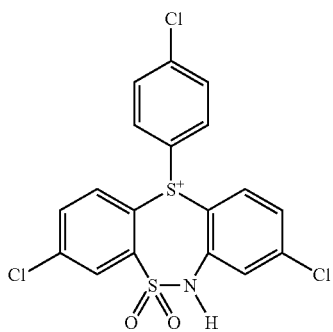
(AI-44)
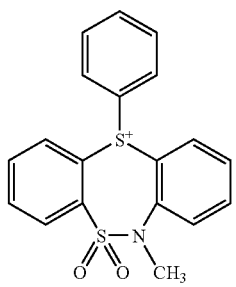
Specific examples of the sulfonium salt (AI) containing a cation represented by formula (AI) are set forth below, but the present invention is not limited thereto.
(Za1)
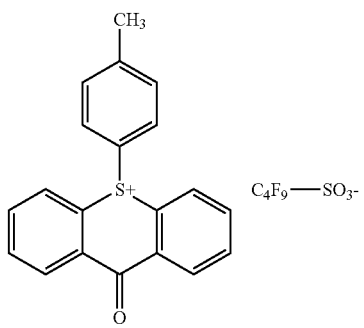
(Za2)
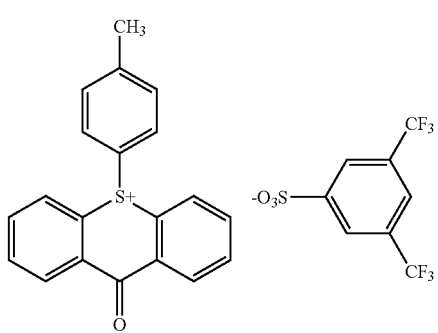

-continued
(Za3)
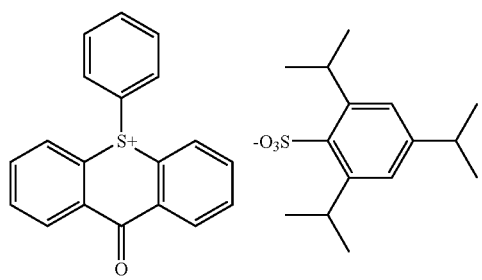 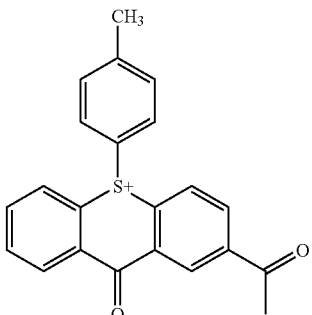
(Za4)
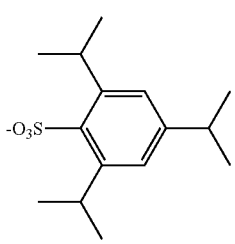   C₄F₉—SO₃⁻
(Za5)
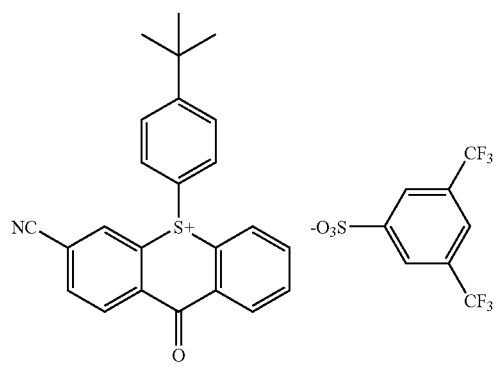
(Za6)
-continued
(Za7)
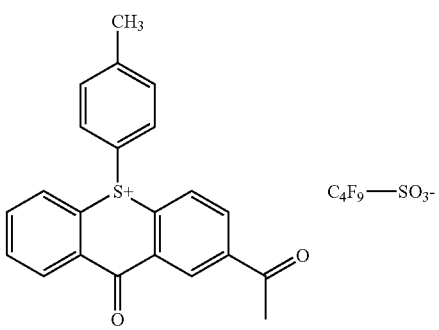
(Za8)
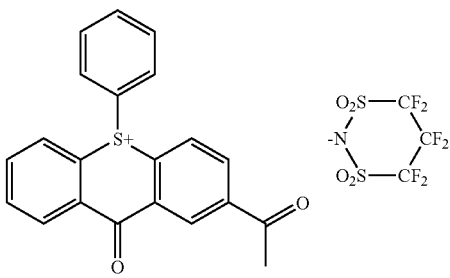   C₄F₉—SO₃⁻
(Za9)
(Za10)
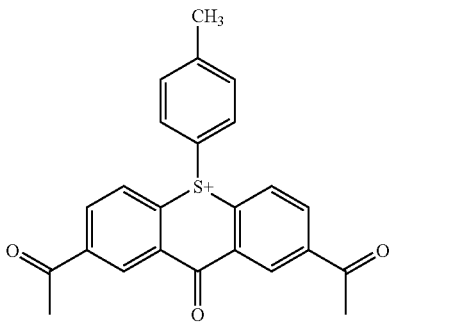

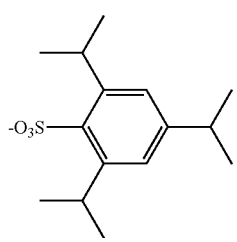
(Za11)
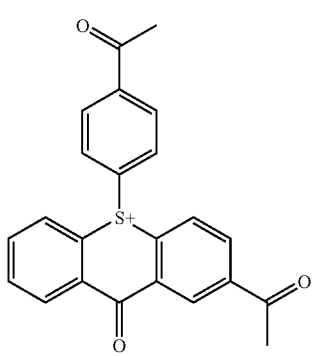
(Za12)
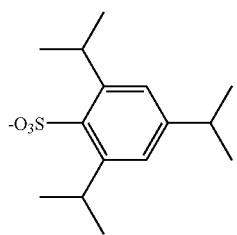
(Za13)
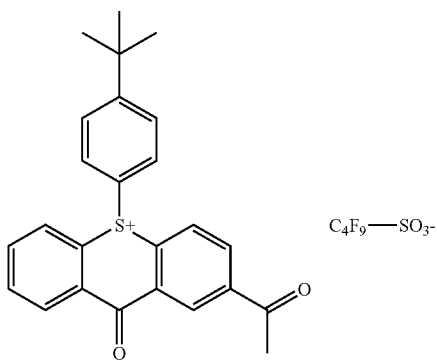
(Za14)
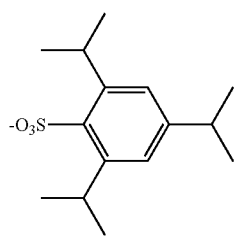
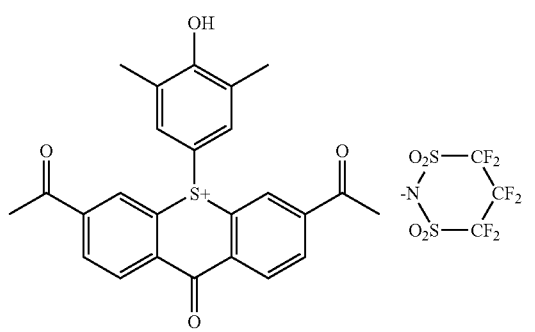
(Za15)
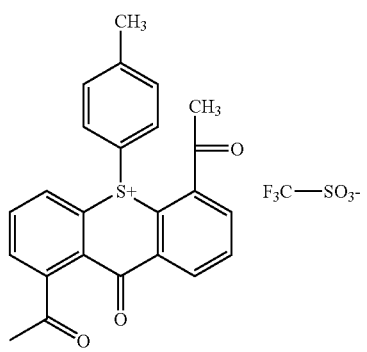
(Za16)
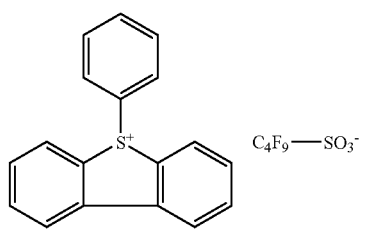
(Za17)
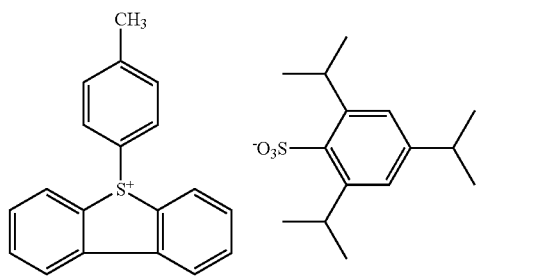
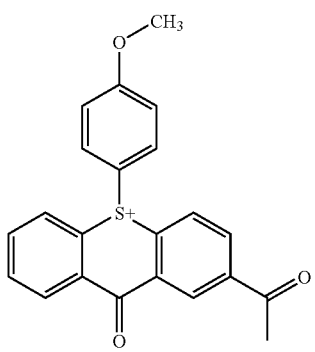

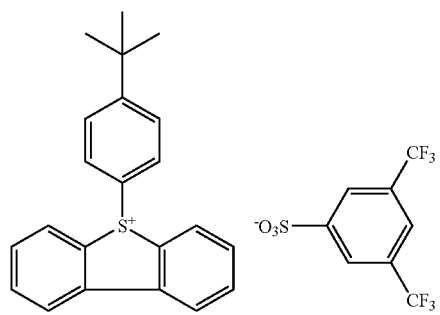 (Za18)
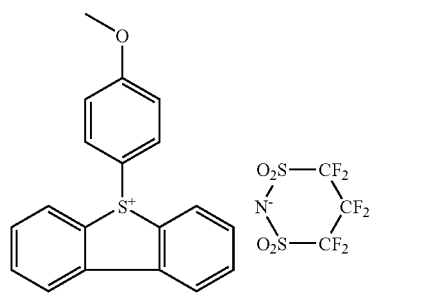 (Za19)
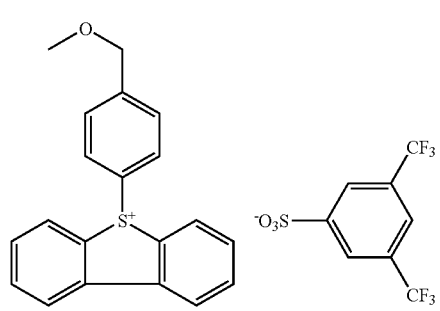 (Za20)
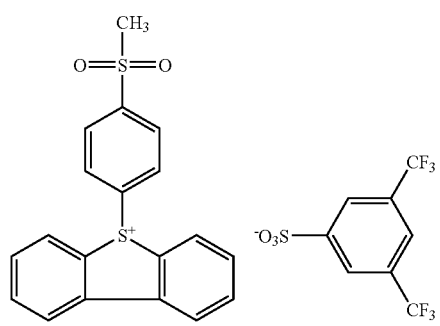 (Za21)
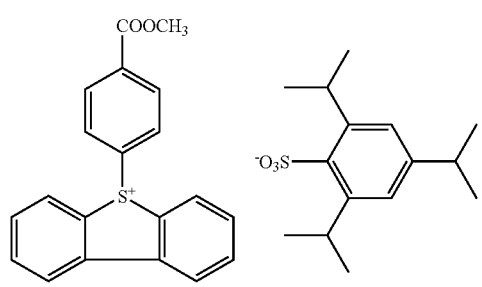 (Za22)
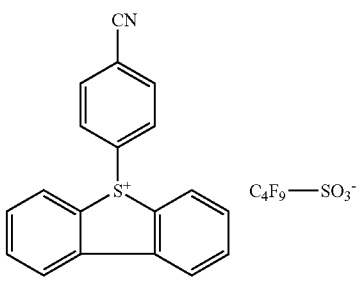 (Za23)
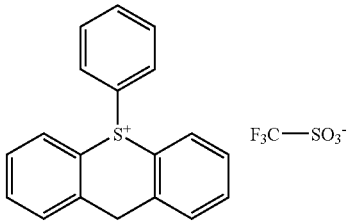 (Za24)
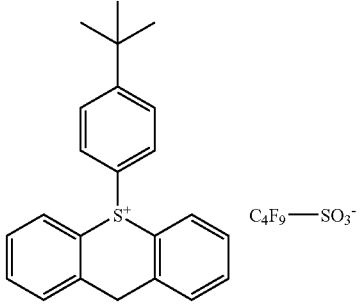 (Za25)
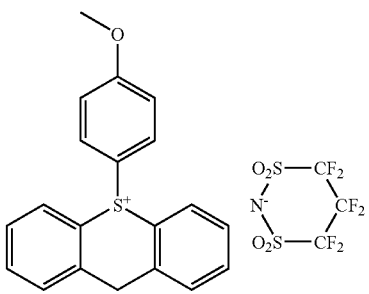 (Za26)
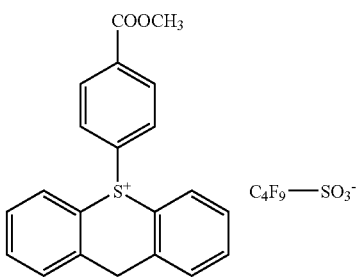 (Za27)

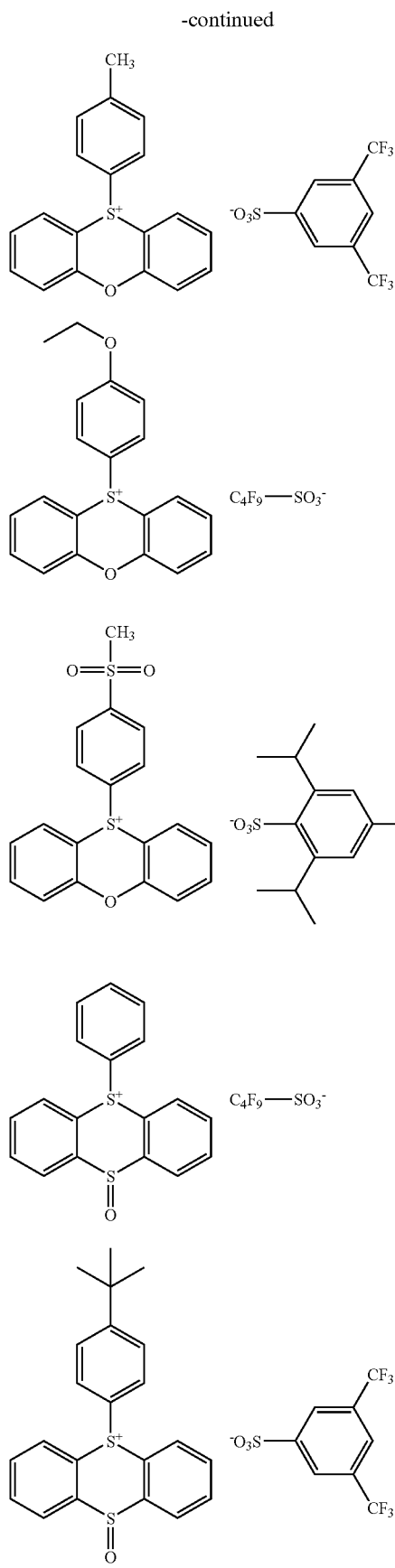
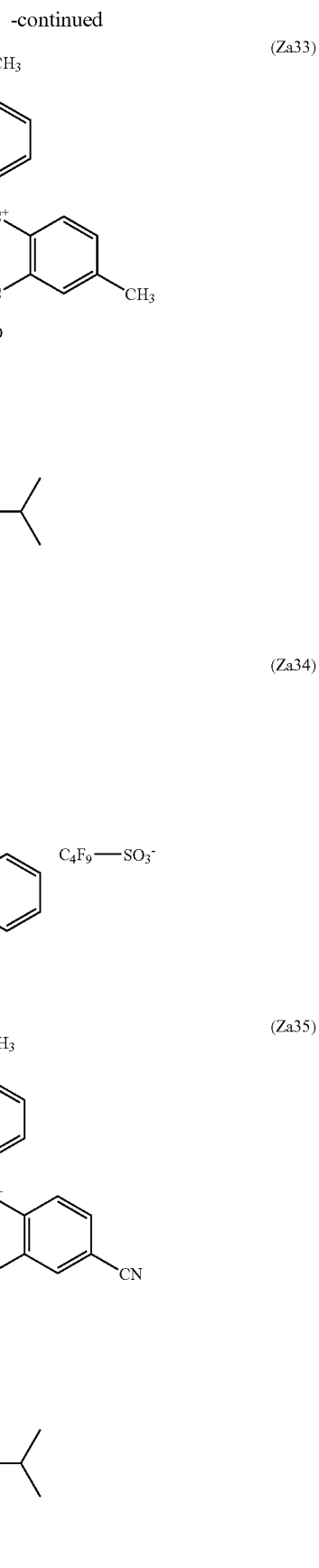

-continued
(Za36)
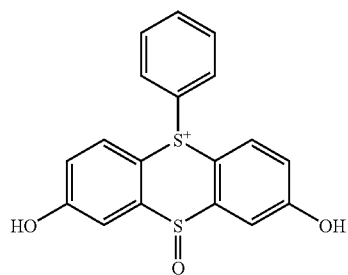
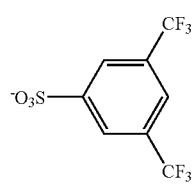
(Za37)
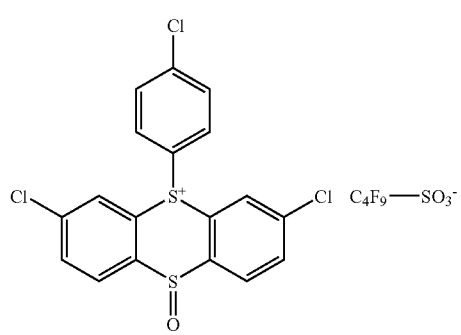
(Za38)
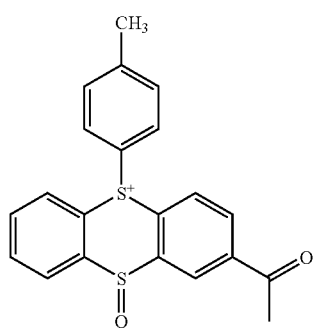
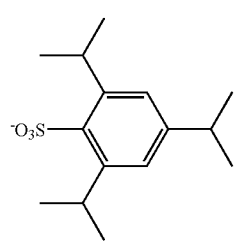
-continued
(Za39)
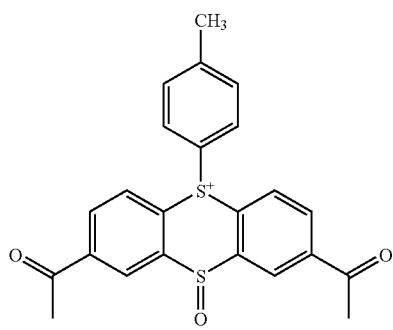 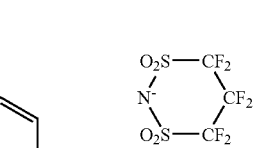
(Za40)
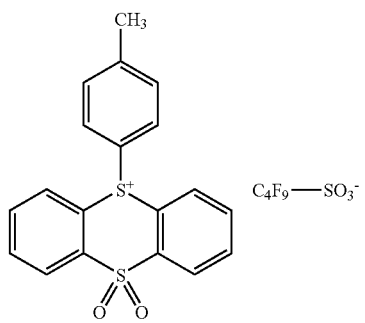 $C_4F_9$—$SO_3^-$
(Za41)
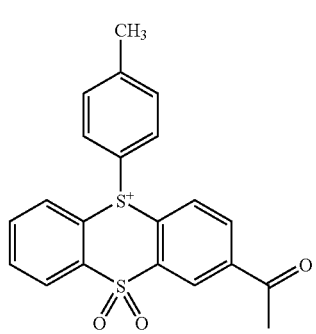
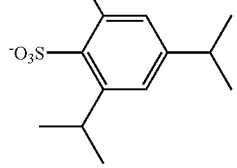
(Za42)
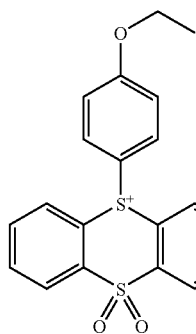 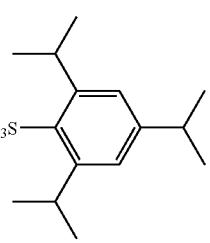

-continued
(Za43)
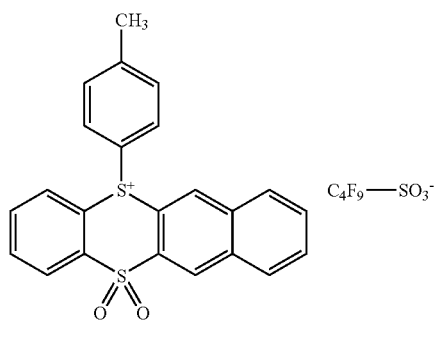
(Za44)
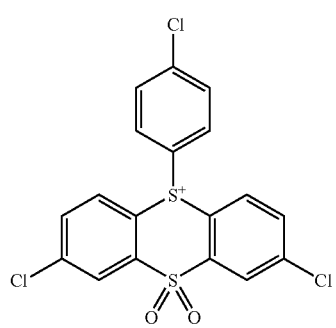
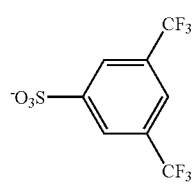
(Za45)
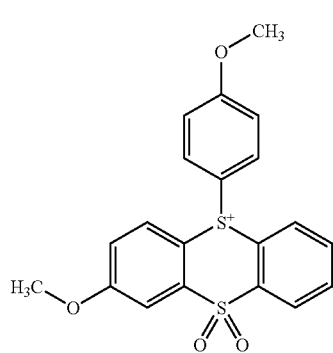
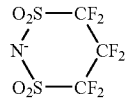
(A46)
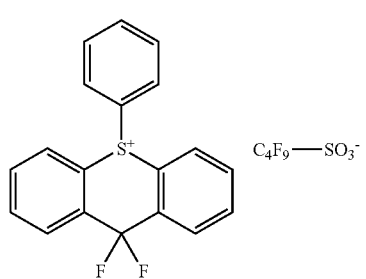
-continued
(A47)
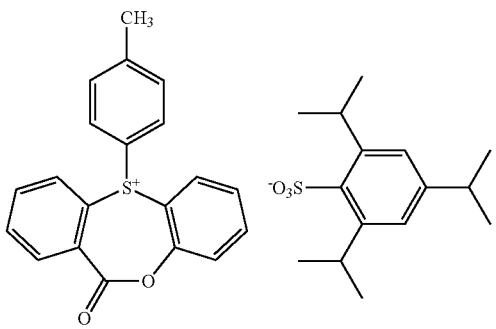
(A48)
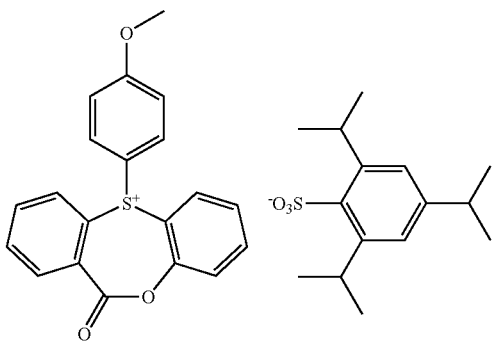
(A49)
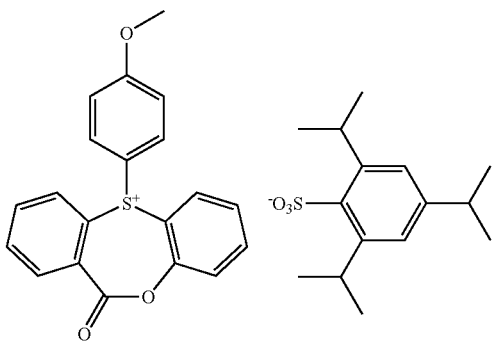
(A50)
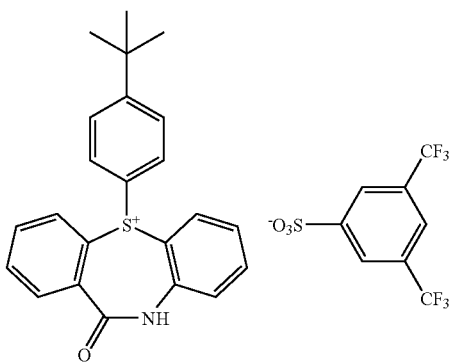

-continued (A51)

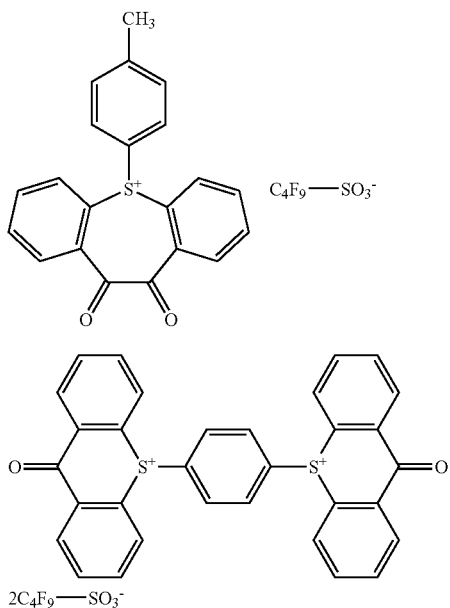

(A52)

(A53)

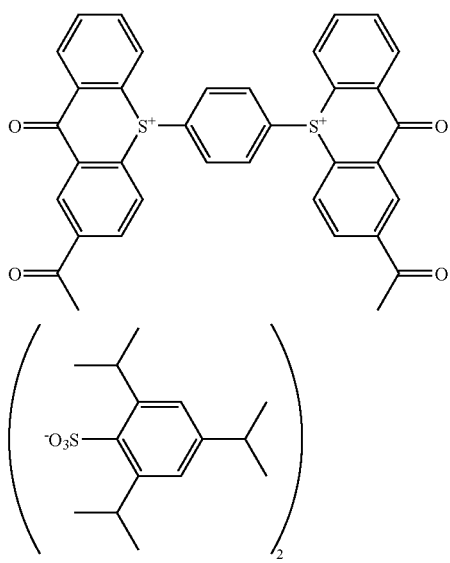

(A54)

(A55)

In the case of irradiating the positive resist composition of the present invention with EUV light, the compound capable of generating an acid upon irradiation with actinic rays or radiation is more preferably a compound (AII) represented by the following formula (AII):

(AII)

wherein $R^{1b}$, $R^{2b}$ and $R^{3b}$ each independently represents an alkyl group, a cycloalkyl group or an aryl group, provided that the decomposition compounds ($R^{1b}$—H), ($R^{2b}$—H) and ($R^{3b}$—H) from the cation moiety all have a boiling point of 160° C. or more at 1 atm, and $X^-$ represents a non-nucleophilic anion.

The alkyl group of $R^{1b}$ to $R^{3b}$ in formula (AII) is preferably an alkyl group having a carbon number of 1 to 15, and examples thereof include a methyl group, an ethyl group, a propyl group, an n-butyl group, a sec-butyl group, a tert-butyl group, a pentyl group, a neopentyl group, a hexyl group, a heptyl group, an octyl group, a nonyl group and a decyl group.

The cycloalkyl group of $R^{1b}$ to $R^{3b}$ is preferably a cycloalkyl group having a carbon number of 3 to 15, and examples thereof include a cyclobutyl group, a cyclopentyl group and a cyclohexyl group.

The aryl group of $R^{1b}$ to $R^{3b}$ is preferably an aryl group having a carbon number of 6 to 14, and examples thereof include a phenyl group and a naphthyl group.

$R^{1b}$ to $R^{3b}$ each is preferably an aryl group.

The alkyl group, cycloalkyl group and aryl group of $R^{1b}$ to $R^{3b}$ each may further have a substituent, and examples of the substituent include a halogen atom, an alkyl group (including here a cycloalkyl group, a bicycloalkyl group and a tricycloalkyl group), an alkenyl group (including here a cycloalkenyl group and a bicycloalkenyl group), an alkynyl group, an aryl group, a cyano group, a hydroxyl group, a nitro group, a carboxyl group, an alkoxy group, an aryloxy group, a silyloxy group, an acyloxy group, a carbamoyloxy group, an alkoxycarbonyloxy group, an aryloxycarbonyloxy group, an aminocarbonylamino group, an alkoxycarbonylamino group, an aryloxycarbonylamino group, a sulfamoylamino group, an alkyl- or aryl-sulfonylamino group, a mercapto group, an alkylthio group, an arylthio group, a sulfamoyl group, a sulfo group, an alkyl- or aryl-sulfinyl group, an alkyl- or aryl-sulfonyl group, an acyl group, an aryloxycarbonyl group, an alkoxycarbonyl group, a carbamoyl group, an imido group, a silyl group and a ureido group.

The substituent of $R^{1b}$ to $R^{3b}$ is preferably an aryl group, a cyano group, a hydroxyl group, a nitro group, a carboxyl group, an alkoxy group, an aryloxy group, an acyloxy group, an aminocarbonylamino group, an alkoxycarbonylamino group, an aryloxycarbonylamino group, a sulfamoylamino group, an alkyl- or aryl-sulfonylamino group, a mercapto group, an alkylthio group, an arylthio group, a sulfamoyl group, a sulfo group, an alkyl- or aryl-sulfinyl group, an alkyl- or aryl-sulfonyl group, an acyl group, an aryloxycarbonyl group, an alkoxycarbonyl group or a carbamoyl group, more preferably a cyano group, an alkoxy group, an acyl group, an alkoxycarbonyl group or a carbamoyl group.

The number of carbons contained in each of $R^{1b}$ to $R^{3b}$ is preferably 12 or less, more preferably 8 or less, still more preferably 7 or less.

The compounds ($R^{1b}$—H), ($R^{2b}$—H) and ($R^{3b}$—H) each is a compound which is formed by combining a hydrogen atom with a monovalent group represented by $R^{1b}$ to $R^{3b}$, and corresponds to a compound that is generated as a decomposition product of the compound represented by the formula (AII) by irradiation of EUV.

The decomposition compounds ($R^{1b}$—H), ($R^{2b}$—H) and ($R^{3b}$—H) from the cation moiety all have a boiling point at 1 atm of 160° C. or more, preferably 180° C. or more, more preferably 190° C. or more, still more preferably 200° C. or more.

$X^-$ is a non-nucleophilic anion. The non-nucleophilic anion is an anion having an extremely low ability of causing a nucleophilic reaction, and this anion can suppress the decomposition in aging due to intramolecular nucleophilic reaction. Examples of the non-nucleophilic anion include a sulfonate anion, a carboxylate anion and a bissulfonylimide anion, with a sulfonate anion being preferred. Examples of the sulfonate anion include an aliphatic sulfonate anion, an aromatic sulfonate anion and a camphorsulfonate anion.

Specific preferred examples of the sulfonate anion include trifluoromethanesulfonate anion, pentafluoroethanesulfonate anion, heptafluoropropanesulfonate anion, perfluorobutanesulfonate anion, perfluorohexanesulfonate anion, perfluorooctanesulfonate anion, pentafluorobenzenesulfonate anion, 3,5-bistrifluoromethylbenzenesulfonate anion, 2,4,6-triisopropylbenzenesulfonate anion, perfluoroethoxyethanesulfonate anion and 2,3,5,6-tetrafluoro-4-dodecyloxybenzenesulfonate anion.

Specific examples of the cation moiety in the compound (AII) represented by formula (AII) are set forth below, but the present invention is not limited thereto.

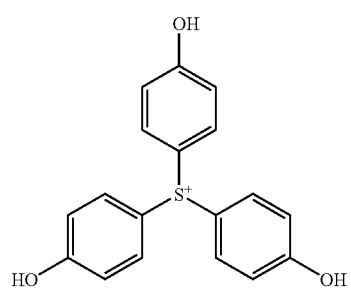

(AII-1)

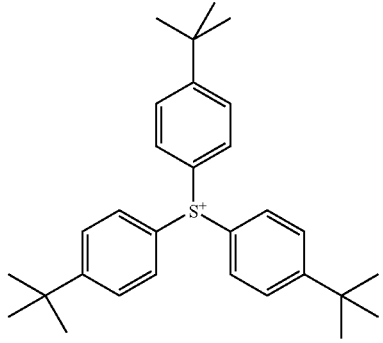

(AII-2)

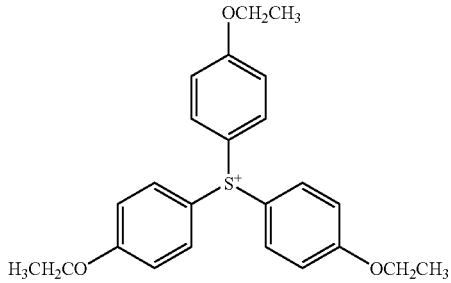

(AII-3)

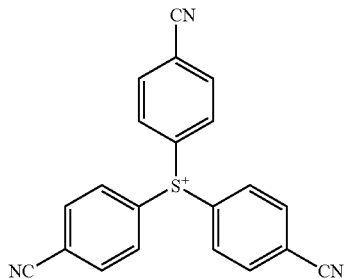

(AII-4)

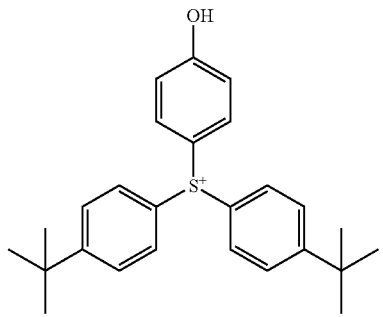

(AII-5)

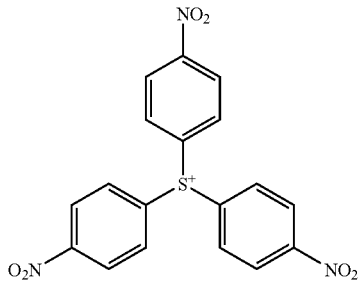

(AII-6)

-continued
(AII-7)
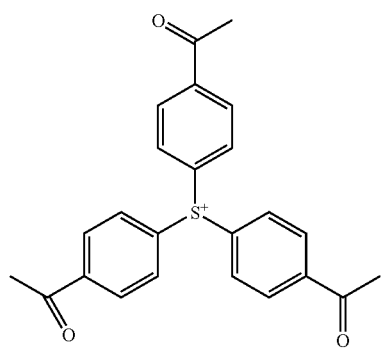
(AII-8)
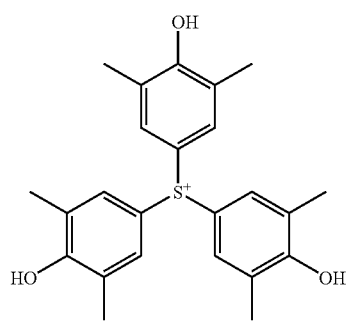
(AII-9)
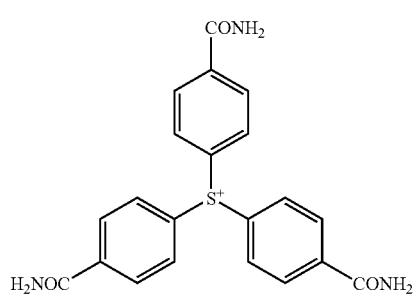
(AII-10)
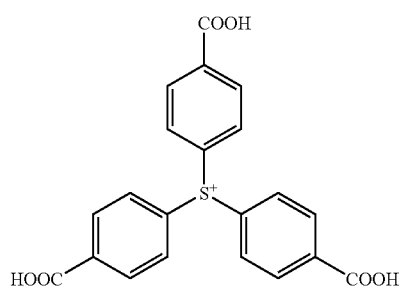
-continued
(AII-11)
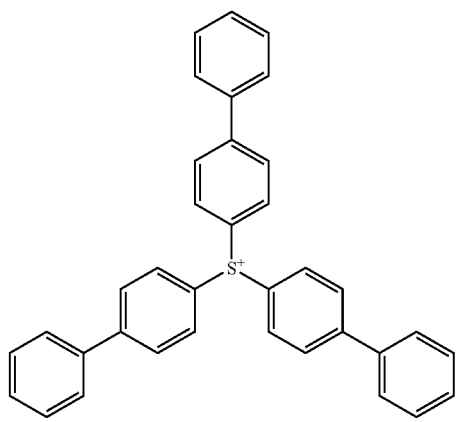
(AII-12)
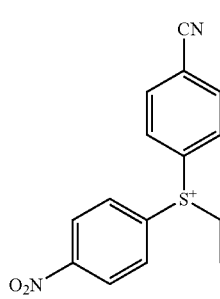
(AII-13)
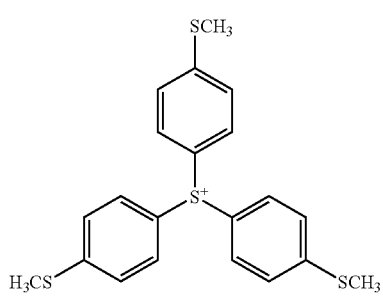
(AII-14)
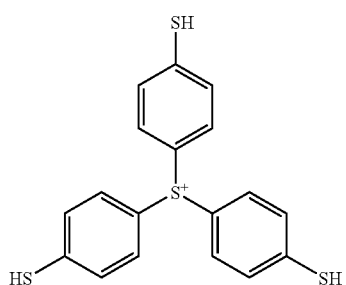

(AII-15)

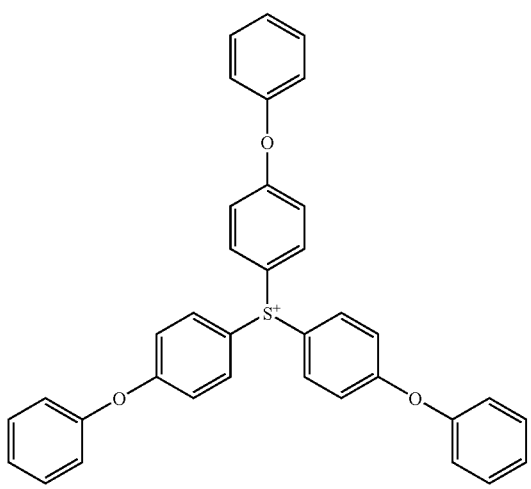

With respect to the compound ($R^{1b}$—H), compound ($R^{2b}$—H) and compound ($R^{3b}$—H) in these specific examples of the cation moiety, the boiling point (measured value) of compound and the literature value of boiling point are shown in Table 1 below. The literature value of boiling point is a value determined by referring to *Kagobutsu no Jiten* (*Dictionary of Compounds*), first edition, Asakura-shoten (Nov. 20, 1997). The boiling point (measured value) is a value determined by measuring the boiling point of compound according to the method described in *Dai 4-Han Jikken Kagaku Koza* (*Courses in Experimental Chemistry, 4th Ed.*), compiled by The Chemical Society of Japan, Maruzen (publisher) (Feb. 5, 1992).

TABLE 1

| Cation moiety | (AII-1) (AII-5) | (AII-2) (AII-5) | (AII-3) | (AII-4) (AII-12) |
|---|---|---|---|---|
| Compound | OH-phenyl | t-Bu-phenyl | OCH$_2$CH$_3$-phenyl | CN-phenyl |
| Boiling point (° C.) measured | 182 | 169 | 169 | 191 |
| Literature value of boiling point (° C.) | 181.8 | 168.5 | 170 | 191.1 |

| Cation moiety | (AII-6) (AII-12) | (AII-7) | (AII-8) |
|---|---|---|---|
| Compound | NO$_2$-phenyl | acetyl-phenyl | 2,6-dimethylphenol |
| Boiling point (° C.) measured | 210 | 202 | 203 |
| Literature value of boiling point (° C.) | 211.03 | 202 | 201 |

TABLE 1-continued

| Cation moiety | (AII-9) | (AII-10) | (AII-14) |
|---|---|---|---|
| Compound | CONH$_2$-phenyl | COOH-phenyl | SH-phenyl |
| Boiling point (° C.) measured | >250 | >250 | 169 |
| Literature value of boiling point (° C.) | 290 | 250 | 169.5 |

| Cation moiety | (AII-12) (AII-13) | (AII-11) | (AII-15) |
|---|---|---|---|
| Compound | SCH$_3$-phenyl | biphenyl | diphenyl ether |
| Boiling point (° C.) measured | 188 | 255 | 259 |
| Literature value of boiling point (° C.) | 193 | 255.3 | 259 |

Specific examples of the compound (AII) represented by formula (AII) are set forth below, but the present invention is not limited thereto.

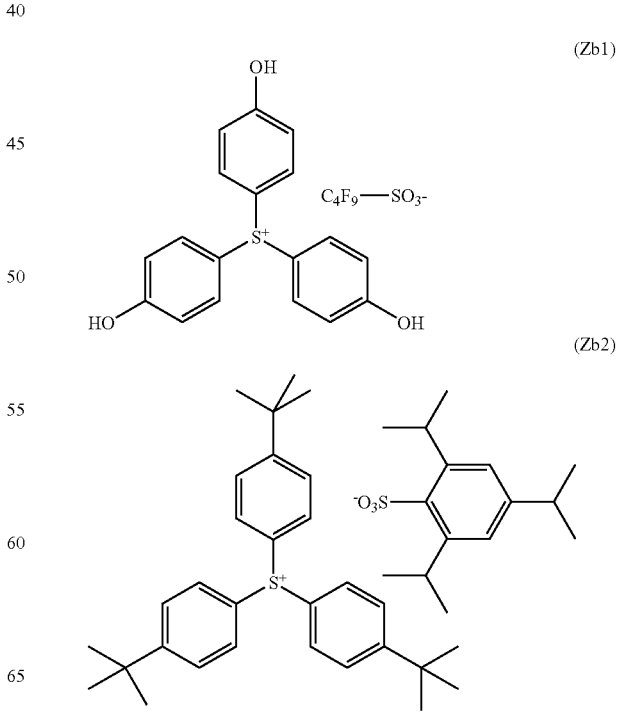

(Zb1)

(Zb2)

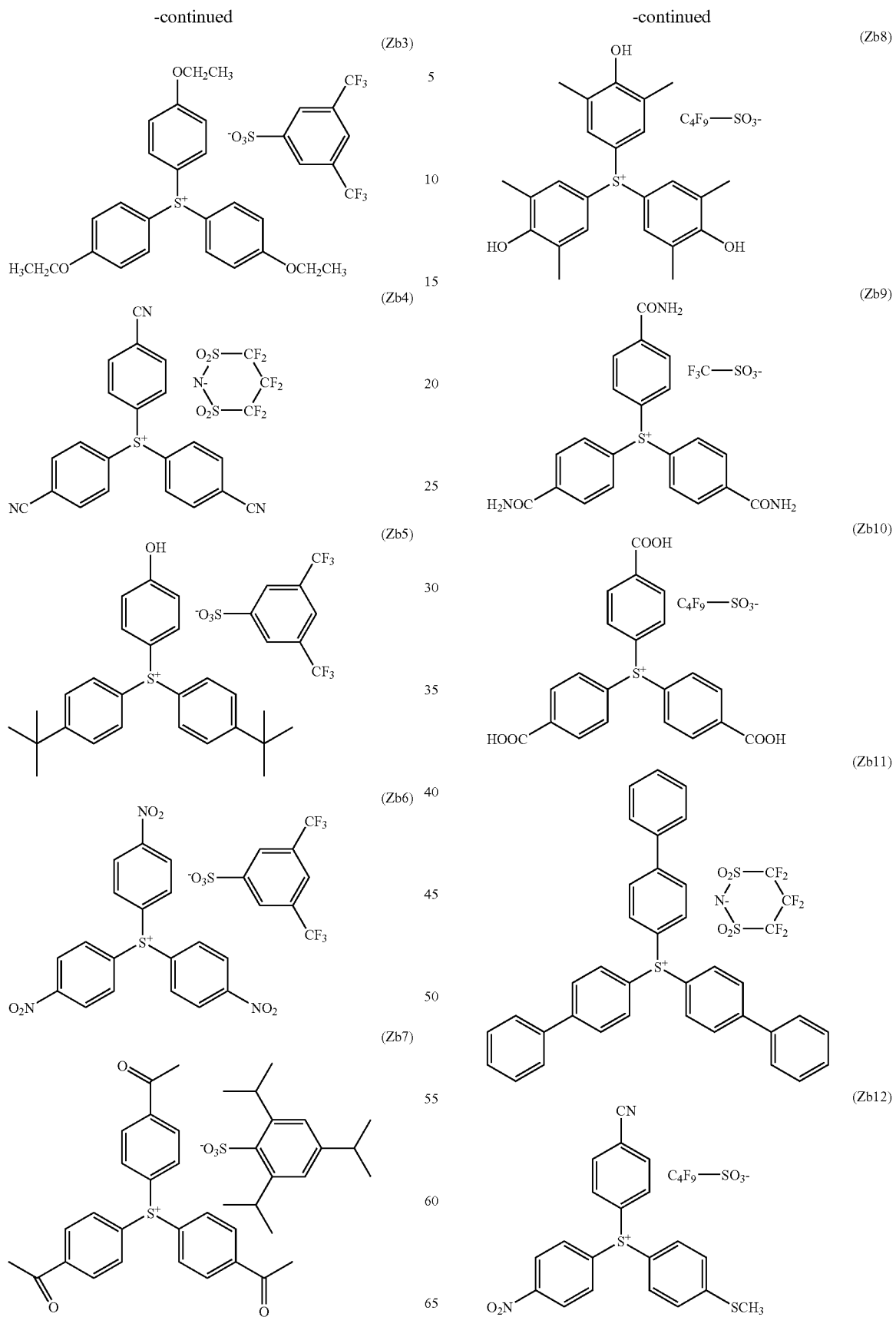

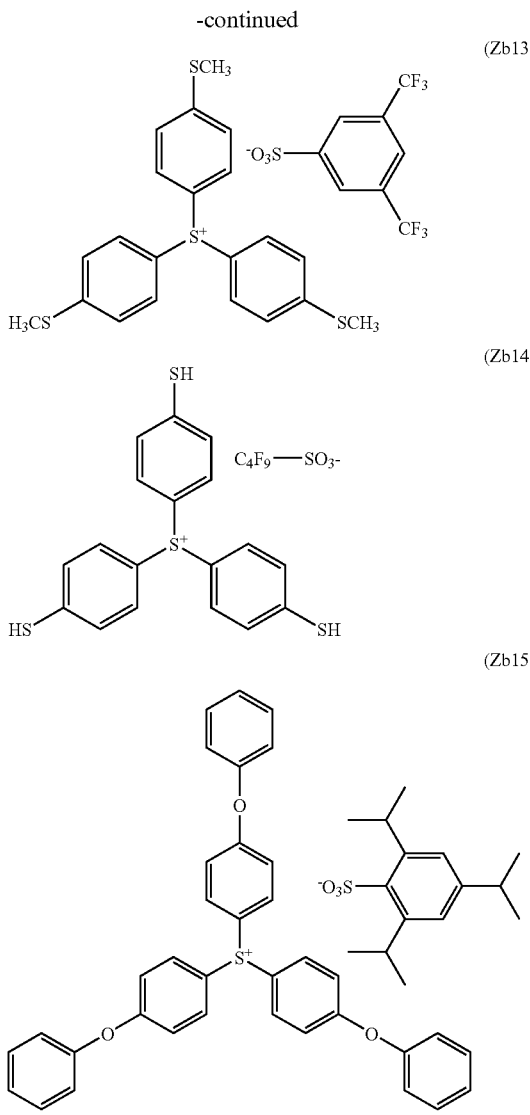

The compound (AII) can be synthesized by a known method after selecting the substituents in $R^{1b}$ to $R^{3b}$ to satisfy the above-described requirement.

The acid generator content in the positive resist composition of the present invention is preferably from 0.001 to 40 mass %, more preferably from 0.01 to 20 mass %, still more preferably from 0.1 to 10 mass %, based on the entire solid content of the composition. Also, one kind of an acid generator may be used or two or more kinds of acid generators may be used.

[2] (B) Resin of which Solubility in an Alkali Developer Increases Under the Action of an Acid, the Resin Comprising at Least a Repeating Unit Represented by Formula (B1) or (B2)

The positive resist composition of the present invention comprises a resin of which solubility in an alkali developer increases under the action of an acid, the resin comprising at least a repeating unit represented by the following formula (B1) or (B2) (hereinafter sometime referred to as an "acid-decomposable resin (B)").

wherein

Z represents an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group, Lc1 represents an atomic group for forming a lactone structure together with two carbon atoms of the aromatic ring, Lc2 represents a group having a lactone structure, Ra and Rb each independently represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkyl-carbonyloxy group or an aralkyl group, m represents an integer of 1 to 4, and n represents an integer of 0 to 4.

The alkyl group of Z in formulae (B1) and (B2) may have a substituent and may be linear or branched. The linear alkyl group preferably has a carbon number of 1 to 30, more preferably from 1 to 20, and examples thereof include a methyl group, an ethyl group, an n-propyl group, an n-butyl group, a sec-butyl group, a tert-butyl group, an n-pentyl group, an n-hexyl group, an n-heptyl group, an n-octyl group, an n-nonyl group and an n-decanyl group. The branched alkyl group preferably has a carbon number of 3 to 30, more preferably from 3 to 20, and examples thereof include an i-propyl group, an i-butyl group, a tert-butyl group, an i-pentyl group, a tert-pentyl group, an i-hexyl group, a tert-hexyl group, an i-heptyl group, a tert-heptyl group, an i-octyl group, a tert-octyl group, an i-nonyl group and a tert-decanoyl group.

The alkoxy group of Z, which may have a substituent, is preferably an alkoxy group having a carbon number of 1 to 12, and examples thereof include a methoxy group, an ethoxy group and a butoxy group.

Examples of the halogen atom of Z include a fluorine atom, a chlorine atom, a bromine atom and an iodine atom.

The acyl group of Z, which may have a substituent, is preferably an acyl group having a carbon number of 1 to 8, and examples thereof include a formyl group, an acetyl group, a propionyl group, a butyryl group, a valeryl group, a pivaloyl group and a benzoyl group.

The acyloxy group of Z, which may have a substituent, is preferably an acyloxy group having a carbon number of 2 to 8, and examples thereof include an acetoxy group, a propionyloxy group, a butyryloxy group, a valeryloxy group, a pivaloyloxy group, a hexanoyloxy group, an octanoyloxy group and a benzoyloxy group.

The cycloalkyl group of Z may have a substituent and may be monocyclic, polycyclic or crosslinked. For example, the cycloalkyl group may have a crosslinked structure. The monocyclic cycloalkyl group is preferably a cycloalkyl group having a carbon number of 3 to 8, and examples thereof include a cyclopropyl group, a cyclopentyl group, a cyclohexyl group, a cyclobutyl group and a cyclooctyl group. Examples of the polycyclic cycloalkyl group include a cycloalkyl group having a bicyclo-tricyclo- or tetracyclo-structure with a carbon number of 5 or more. A cycloalkyl group having a carbon number of 6 to 20 is preferred, and examples thereof include an adamantyl group, a norbornyl group, an isoboronyl group, a camphanyl group, a dicyclopentyl group, an α-pinel group, a tricyclodecanyl group, a tetracyclododecyl group, an androstanyl group and structures shown below. In the cycloalkyl group, a part of the carbon atoms may be substituted by a heteroatom such as oxygen atom.

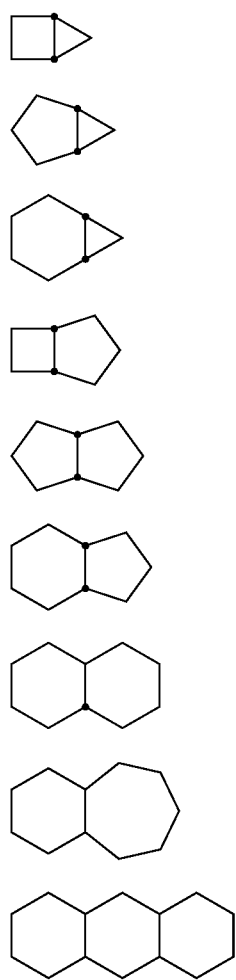

(1) (2) (3) (4) (5) (6) (7) (8) (9)

-continued

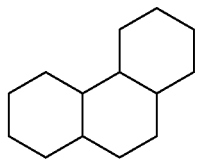
(10)

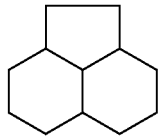
(11)

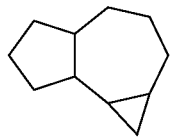
(12)

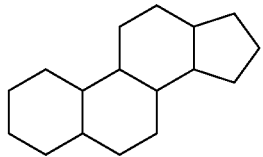
(13)

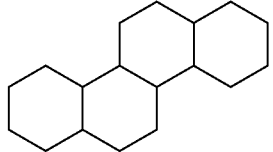
(14)

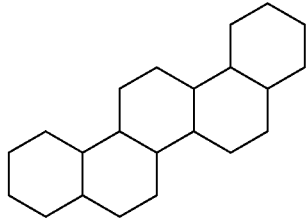
(15)

(16)

(17)

(18)

(19)

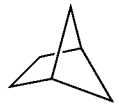
(20)

-continued
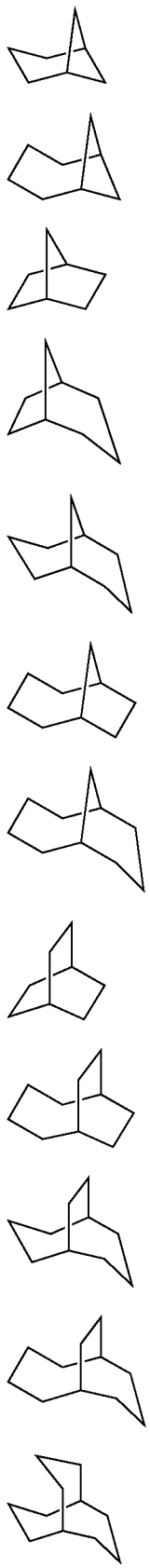
-continued
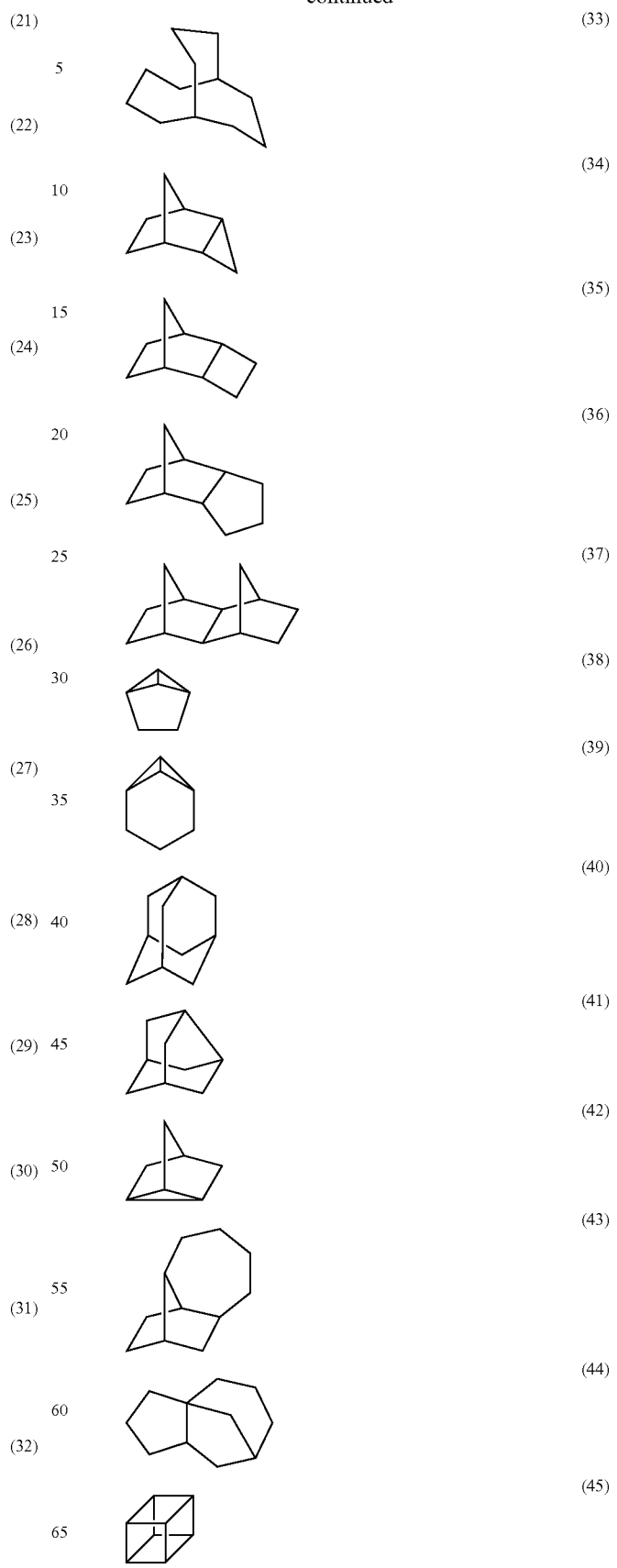

-continued

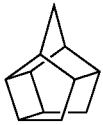

(46)

(47)

(48)

(49)

(50)

Among these alicyclic moieties, preferred are an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group, more preferred are an adamantyl group, a decalin group, a norbornyl group, a cedrol group, a cyclohexyl group, a cycloheptyl group, a cyclooctyl group, a cyclodecanyl group, a cyclododecanyl group and a tricyclodecanyl group.

Examples of the substituent of such an alicyclic structure include an alkyl group, a halogen atom, a hydroxyl group, an alkoxy group, a carboxyl group and an alkoxycarbonyl group. The alkyl group is preferably a lower alkyl group such as methyl group, ethyl group, propyl group, isopropyl group and butyl group, more preferably a methyl group, an ethyl group, a propyl group or an isopropyl group. The alkoxy group is preferably an alkoxy group having a carbon number of 1 to 4, such as methoxy group, ethoxy group, propoxy group and butoxy group. Examples of the substituent which the alkyl group and alkoxy group may have, include a hydroxyl group, a halogen atom and an alkoxy group (preferably having a carbon number of 1 to 4).

Examples of the substituent which the above-described group may further have, include a hydroxyl group, a halogen atom (e.g., fluorine, chlorine, bromine, iodine), a nitro group, a cyano group, the above-described alkyl group, an alkoxy group (e.g., methoxy, ethoxy, hydroxyethoxy, propoxy, hydroxypropoxy, n-butoxy, isobutoxy, sec-butoxy, tert-butoxy), an alkoxycarbonyl group (e.g., methoxycarbonyl, ethoxycarbonyl), an aralkyl group (e.g., benzyl, phenethyl, cumyl), an aralkyloxy group, an acyl group (e.g., formyl, acetyl, butyryl, benzoyl, cyanamyl, valeryl), an acyloxy group (e.g., butyryloxy), the above-described alkenyl group, an akenyloxy group (e.g., vinyloxy, propenyloxy, allyloxy, butenyloxy), the above-described aryl group, an aryloxy group (e.g., phenoxy) and an aryloxycarbonyl group (e.g., benzoyloxy).

The substituent which the alicyclic structure of the cycloalkyl group as Z may have, is preferably an alkyl group having a carbon number of 1 to 20, an aryl group having a carbon number of 6 to 20, or an aralkyl group having a carbon number of 7 to 20. These substituents each may further have a substituent.

The aryl group of Z, which may have a substituent, is preferably an aryl group having a carbon number of 6 to 30, more preferably from 6 to 20, and examples thereof include a phenyl group, a 4-methylphenyl group, a 3-methylphenyl group, a 2-methylphenyl group, a 4-ethylphenyl group, a 3-ethylphenyl group, a 2-ethylphenyl group, a 4-n-propylphenyl group, a 3-n-propylphenyl group, a 2-n-propylphenyl group, a 4-1-propylphenyl group, a 3-1-propylphenyl group, a 2-1-propylphenyl group, a 4-cyclopropylphenyl group, a 3-cyclopropylphenyl group, a 2-cyclopropylphenyl group, a 4-n-butylphenyl group, a 3-n-butylphenyl group, a 2-n-butylphenyl group, a 4-1-butylphenyl group, a 3-1-butylphenyl group, a 2-1-butylphenyl group, a 4-tert-butylphenyl group, a 3-tert-butylphenyl group, a 2-tert-butylphenyl group, a 4-cyclobutylphenyl group, a 3-cyclobutylphenyl group, a 2-cyclobutylphenyl group, a 4-cyclopentylphenyl group, a 4-cyclohexylphenyl group, a 4-cycloheptenylphenyl group, a 4-cyclooctanylphenyl group, a 2-cyclopentylphenyl group, a 2-cyclohexylphenyl group, a 2-cycloheptenylphenyl group, a 2-cyclooctanylphenyl group, a 3-cyclopentylphenyl group, a 3-cyclohexylphenyl group, a 3-cycloheptenylphenyl group, a 3-cyclooctanylphenyl group, a 4-cyclopentyloxyphenyl group, a 4-cyclohexyloxyphenyl group, a 4-cycloheptenyloxyphenyl group, a 4-cyclooctanyloxyphenyl group, a 2-cyclopentyloxyphenyl group, a 2-cyclohexyloxyphenyl group, a 2-cycloheptenyloxyphenyl group, a 2-cyclooctanyloxyphenyl group, a 3-cyclopentyloxyphenyl group, a 3-cyclohexyloxyphenyl group, a 3-cycloheptenyloxyphenyl group, a 3-cyclooctanyloxyphenyl group, a 4-n-pentylphenyl group, a 4-n-hexylphenyl group, a 4-n-heptenylphenyl group, a 4-n-octanylphenyl group, a 2-n-pentylphenyl group, a 2-n-hexylphenyl group, a 2-n-heptenylphenyl group, a 2-n-octanylphenyl group, a 3-n-pentylphenyl group, a 3-n-hexylphenyl group, a 3-n-heptenylphenyl group, a 3-n-octanylphenyl group, a 2,6-diisopropylphenyl group, a 2,3-diisopropylphenyl group, a 2,4-diisopropylphenyl group, a 3,4-diisopropylphenyl group, a 3,6-di-tert-butylphenyl group, a 2,3-di-tert-butylphenyl group, a 2,4-di-tert-butylphenyl group, a 3,4-di-tert-butylphenyl group, a 2,6-di-n-butylphenyl group, a 2,3-di-n-butylphenyl group, a 2,4-di-n-butylphenyl group, a 3,4-di-n-butylphenyl group, a 2,6-di-1-butylphenyl group, a 2,3-di-1-butylphenyl group, a 2,4-di-1-butylphenyl group, a 3,4-di-1-butylphenyl group, a 2,6-di-tert-amylphenyl group, a 2,3-di-tert-amylphenyl group, a 2,4-di-tert-amylphenyl group, a 3,4-di-tert-amylphenyl group, a 2,6-di-1-amylphenyl group, a 2,3-di-1-amylphenyl group, a 2,4-di-1-amylphenyl group, a 3,4-di-1-amylphenyl group, a 2,6-di-n-pentylphenyl group, a 2,3-di-n-pentylphenyl group, a 2,4-di-n-pentylphenyl group, a 3,4-di-n-pentylphenyl group, a 4-adamantylphenyl group, a 2-adamantylphenyl group, a 4-isoboronylphenyl group, a 3-isoboronylphenyl group, a 2-isoboronylphenyl group, a 4-cyclopentyloxyphenyl group, a 4-cyclohexyloxyphenyl group, a 4-cycloheptenyloxyphenyl group, a 4-cyclooctanyloxyphenyl group, a 2-cyclopentyloxyphenyl group, a 2-cyclohexyloxy-phenyl group, a 2-cycloheptenyloxyphenyl group, a 2-cyclooctanyloxyphenyl group, a 3-cyclopentyloxyphenyl group, a 3-cyclohexyloxyphenyl group, a 3-cycloheptenyloxyphenyl group, a 3-cyclooctanyloxyphenyl group, a 4-n-pentyloxyphenyl group, a 4-n-hexyloxyphenyl group, a 4-n-heptenyloxyphenyl group, a 4-n-octanyloxyphenyl group, a 2-n-pentyloxyphenyl group, a 2-n-hexyloxyphenyl group, a 2-n-heptenyloxyphenyl group, a 2-n- octanyloxyphenyl group, a 3-n-pentyloxyphenyl group, a 3-n-hexyloxyphenyl group, a 3-n-heptenyloxyphenyl group, a 3-n-octanyloxyphenyl group, a 2,6-diisopropyloxyphenyl group, a 2,3-diisopropyloxyphenyl group, a 2,4-diisopropyloxyphenyl group, a 3,4-diisopropyloxyphenyl group, a 2,6-di-tert-butyloxyphenyl group, a 2,3-di-tert-butyloxyphenyl group, a 2,4-di-tert-butyloxyphenyl group, a 3,4-di-tert-butyloxyphenyl group, a 2,6-di-n-butyloxyphenyl group, a 2,3-di-n-butyloxyphenyl group, a 2,4-di-n-butyloxyphenyl group, a 3,4-di-n-butyloxyphenyl group, a 2,6-di-1-butyloxyphenyl group, a 2,3-di-1-butyloxyphenyl group, a 2,4-di-1-butyloxyphenyl group, a 3,4-di-1-butyloxyphenyl group, a 2,6-di-tert-amyloxyphenyl group, a 2,3-di-tert-amyloxyphenyl group, a 2,4-di-tert-amyloxyphenyl group, a 3,4-di-tert-amyloxyphenyl group, a 2,6-di-1-amyloxyphenyl group, a 2,3-di-1-amyloxyphenyl group, a 2,4-di-1-amyloxyphenyl group, a 3,4-di-1-amyloxyphenyl group, a 2,6-di-n-pentyloxyphenyl group, a 2,3-di-n-pentyloxyphenyl group, a 2,4-di-n-pentyloxyphenyl group, a 3,4-di-n-pentyloxyphenyl group, a 4-adamantyloxyphenyl group, a 3-adamantyloxyphenyl group, a 2-adamantyloxyphenyl group, a 4-isoboronyloxyphenyl group, a 3-isoboronyloxyphenyl group and a 2-isoboronyloxyphenyl group. These groups each may be further substituted within the above-described range, and the substituent is not limited to the substituents other than those described above.

The alkyloxycarbonyl group of Z, which may have a substituent, is preferably an alkyloxycarbonyl group having a carbon number of 2 to 8, and examples thereof include a methoxycarbonyl group, an ethoxycarbonyl and a propoxycarbonyl group.

The alkylcarbonyloxy group of Z, which may have a substituent is preferably an alkylcarbonyloxy group having a carbon number of 2 to 8, and examples thereof include a methylcarbonyloxy group and an ethylcarbonyloxy group.

The aralkyl group of Z, which may have a substituent, is preferably an aralkyl group having a carbon number of 7 to 16, and examples thereof include a benzyl group.

The lactone structure in Lc1 and Lc2 may be any structure as long as it has a lactone ring, but is preferably a 5- or 6-membered ring lactone structure. The lactone structure moiety may or may not have a substituent. Preferred examples of the substituent include an alkyl group having a carbon number of 1 to 8 which may have a substituent, a hydroxyl group, an alkoxy group having a carbon number of 1 to 8 which may have a substituent, a halogen atom, a cyano group, a nitro group, an acyl group having a carbon number of 1 to 8 which may have a substituent, an acyloxy group having a carbon number of 2 to 8 which may have a substituent, a cycloalkyl group having a carbon number of 4 to 10 which may have a substituent, an aryl group having a carbon number of 6 to 15 which may have a substituent, a carboxyl group, an alkyloxycarbonyl group having a carbon number of 2 to 8 which may have a substituent, an alkylcarbonyloxy group having a carbon number of 2 to 8 which may have a substituent, and an aralkyl group having a carbon number of 7 to 16 which may have a substituent.

Preferred examples of the lactone structure include lactone structures (LC1-1) to (LC1-12) shown below. These structures each may have the above-described substituent.

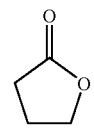

LC1-1

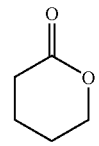

LC1-2

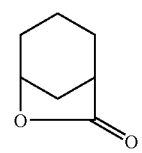

LC1-3

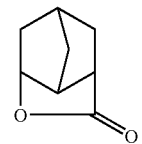

LC1-4

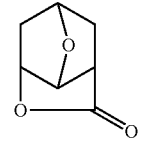

LC1-5

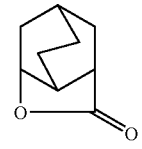

LC1-6

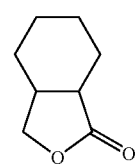

LC1-7

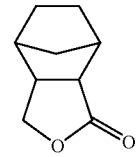

LC1-8

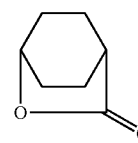

LC1-9

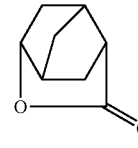

LC1-10

-continued

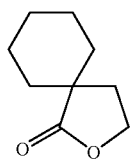
LC1-11

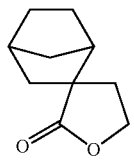
LC1-12

Examples of the alkyl group of Ra and Rb in formulae (B1) and (B2) are the same as those of the alkyl group as Z in formulae (B1) and (B2).

Examples of the alkoxy group of Ra and Rb are the same as those of the alkoxy group as Z in formulae (B1) and (B2).

Examples of the halogen atom of Ra and Rb are the same as those of the halogen atom as Z in formulae (B1) and (B2).

Examples of the acyl group of Ra and Rb are the same as those of the acyl group as Z in formulae (B 1) and (B2).

Examples of the acyloxy group of Ra and Rb are the same as those of the acyloxy group as Z in formulae (B1) and (B2).

Examples of the cycloalkyl group of Ra and Rb are the same as those of the cycloalkyl group as Z in formulae (B1) and (B2).

Examples of the aryl group of Ra and Rb are the same as those of the aryl group as Z in formulae (B1) and (B2).

Examples of the alkyloxycarbonyl group of Ra and Rb are the same as those of the alkyloxycarbonyl group as Z in formulae (B1) and (B2).

Examples of the alkylcarbonyloxy group of Ra and Rb are the same as those of the alkylcarbonyloxy group as Z in formulae (B1) and (B2).

Examples of the aralkyl group of Ra and Rb are the same as those of the aralkyl group as Z in formulae (B1) and (B2).

In formula (B1), it is preferred that the lactone structure formed by Lc1 is a lactone structure represented by the following formula (X1) and the lactone structure shares two adjacent carbon atoms with the aromatic ring of formula (B1).

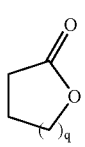
(X1)

wherein q represents an integer of 0 to 20.

Specific examples of the repeating unit represented by formula (B1) are set forth below, but the present invention is not limited thereto.

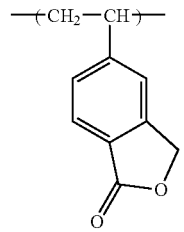
(B1-1)

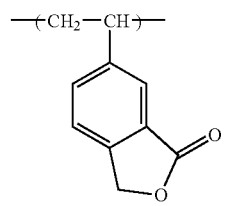
(B1-2)

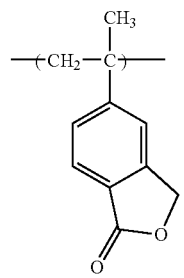
(B1-3)

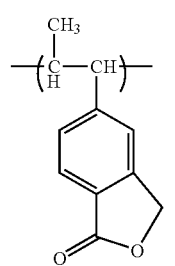
(B1-4)

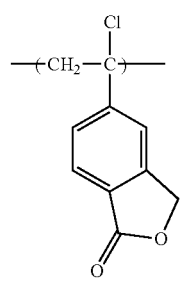
(B1-5)

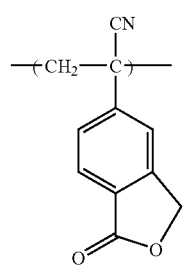
(B1-6)

(B1-7) 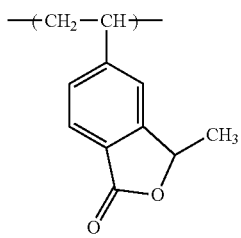

(B1-8) 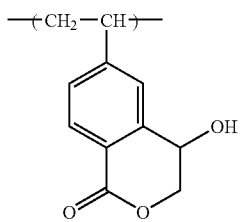

(B1-9) 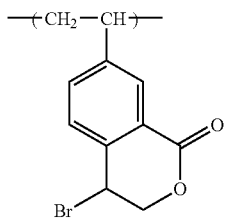

(B1-10) 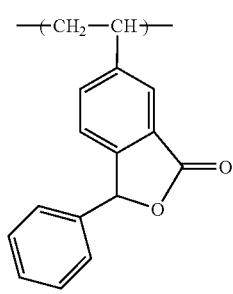

(B1-11) 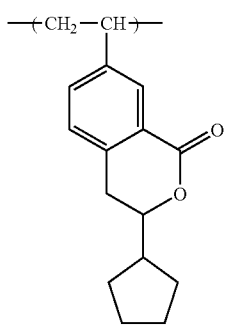

(B1-12) 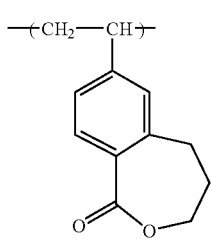

In formula (B2), Lc2 is preferably represented by the following formula (X2):

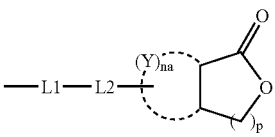

(X2)

wherein

L1 represents a single bond or a divalent linking group,

L2 represents a single bond or a group selected from alkylene, —O—, —OCO—, —COO—, —NHCO—, —CONH—, —S—, —SO$_2$— and —SO$_3$—, Y represents an atomic group for forming a crosslinked alicyclic structure together with two carbon atoms of the lactone structure, provided that when na is 0, L2 may be linked to any carbon atom of the lactone structure, na represents 0 or 1, and p represents an integer of 0 to 20.

In formula (X2), the divalent linking group as L1 is preferably a divalent linking group having a carbon number of 1 to 10, and examples thereof include a linear, branched or cyclic alkylene group, an arylene group, a heteroarylene group, an aralkylene group, —S—, —C(=O)—, —N(R$_7$)—, —SO—, —SO$_2$—, —CO$_2$—, —N(R$_7$)SO$_2$— and a divalent group comprising a combination of two or more of these groups. R$_7$ is a hydrogen atom or an alkyl group (specific examples of the alkyl group are the same as those for Z).

The alkylene as L2, which may be linear or branched, is preferably an alkylene having a carbon number of 1 to 20, and examples thereof include methylene, ethylene and propylene.

Examples of the crosslinked alicyclic structure formed by Y together with two carbon atoms of the lactone structure include those described as the cycloalkyl group of Z and having a crosslinked alicyclic structure.

The lactone ring in formula (X2) may have substituent. Examples of the substituent of the lactone ring include an alkyl group which may have a substituent, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group and an aralkyl group.

Specific examples of the repeating unit represented by formula (B2) are set forth below, but the present invention is not limited thereto.

(B2-1) 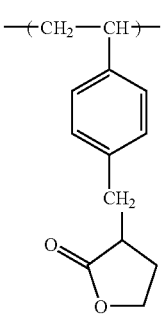

-continued
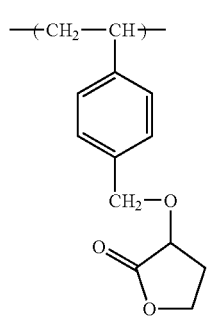
(B2-2)
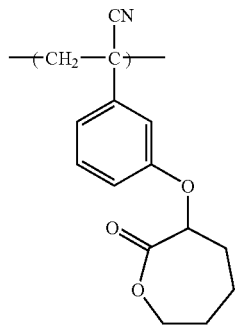
(B2-6)
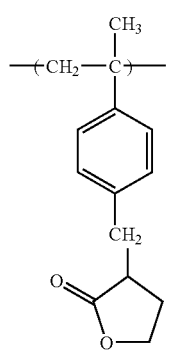
(B2-3)
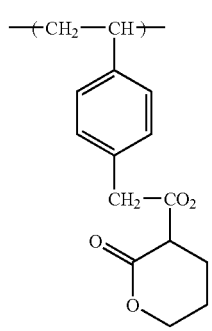
(B2-7)
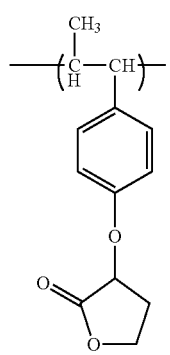
(B2-4)
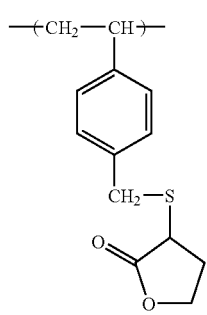
(B2-8)
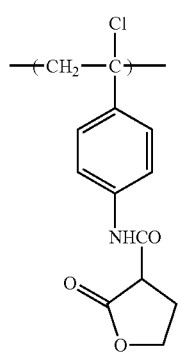
(B2-5)
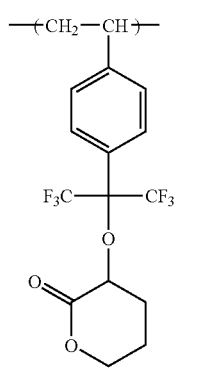
(B2-9)

-continued (B2-10)
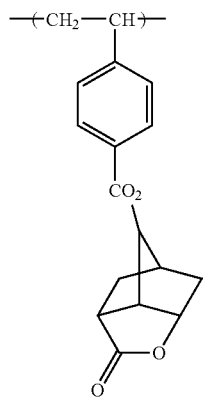

(B2-11)
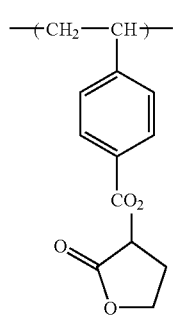

(B2-12)
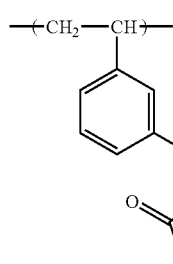

The acid-decomposable resin (B) has a group capable of decomposing under the action of an acid to increase the solubility in an alkali developer (hereinafter sometimes referred to as an "acid-decomposable group").

Examples of the acid-decomposable group include a goup where the hydrogen atom of an alkali-soluble group such as carboxylic acid group, sulfonic acid group, phenol group and thiol group, is protected by a group which desorbs under the action of an acid.

Examples of the group which desorbs under the action of an acid include —C($R_{36}$)($R_{37}$)($R_{38}$), —C($R_{01}$)($R_{02}$)(O$R_{39}$), C(=O)—O—O—$R_{39}$ and C—C(=O)—O—$R_{39}$.

In the formulae, $R_{36}$ to $R_{39}$ each independently represents an alkyl group, a cycloalkyl group, an aryl group, an aralkyl group or an alkenyl group, and $R_{36}$ and $R_{37}$ may combine with each other to form a ring.

$R_{01}$ and $R_{02}$ each independently represents a hydrogen atom, an alkyl group, a cycloalkyl group, an aryl group, an aralkyl group or an alkenyl group.

The repeating unit having an acid-decomposable group is preferably a repeating unit represented by the following formula (B3) or (B4).

(B3)
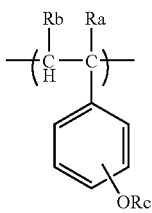

(B4)
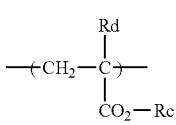

wherein

Ra and Rb each independently represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkyl-carbonyloxy group or an aralkyl group, Rc represents a group which desorbs under the action of an acid, and Rd represents a hydrogen atom, an alkyl group, a halogen atom or a cyano group.

Specific examples of the repeating unit having an acid-decomposable group are set forth below, but the present invention is not limited thereto.

(B-1)
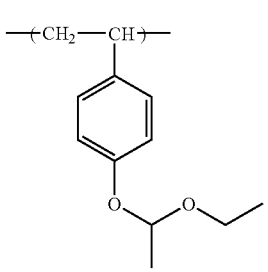

(B-2)
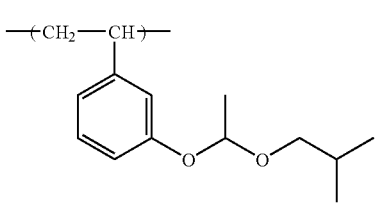

(B-3)
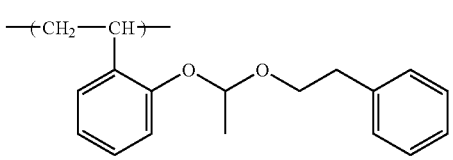

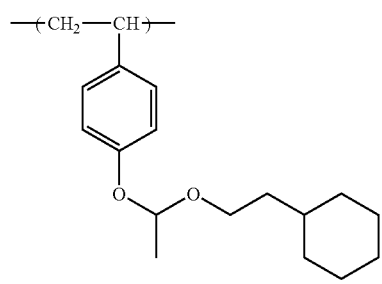 (B-4)
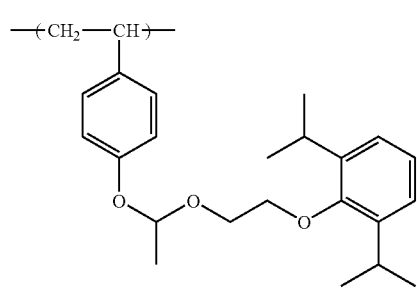 (B-5)
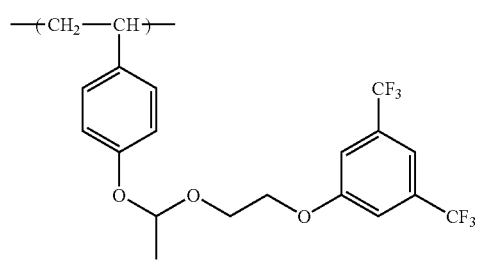 (B-6)
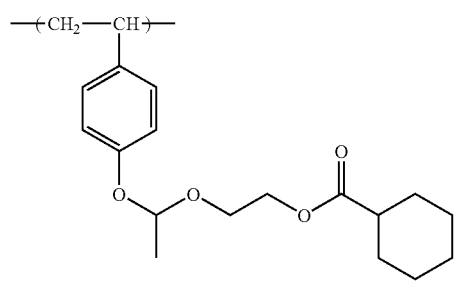 (B-7)
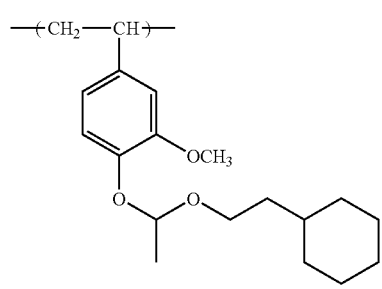 (B-8)
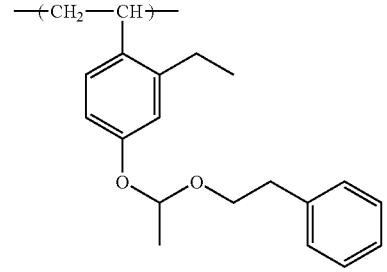 (B-9)
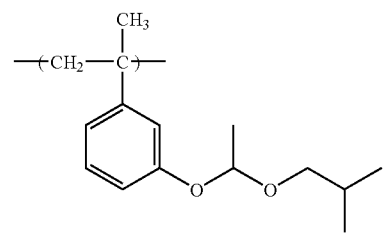 (B-10)
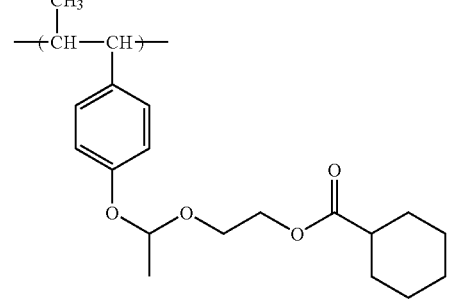 (B-11)
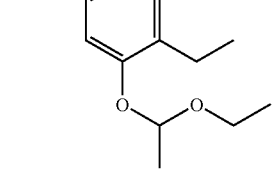 (B-12)
 (B-13)
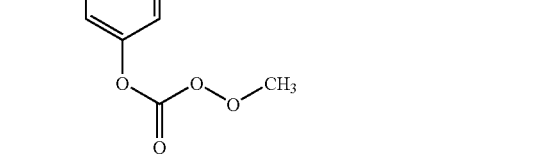 (B-14)

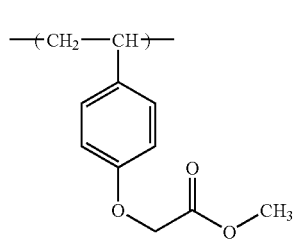 (B-15)

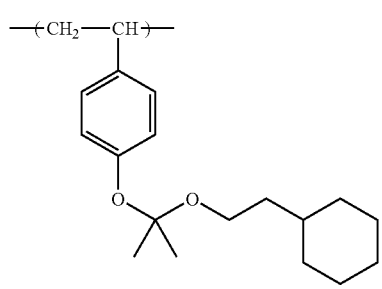 (B-16)

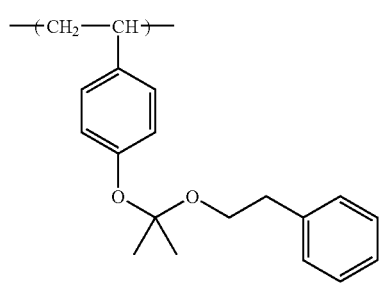 (B-17)

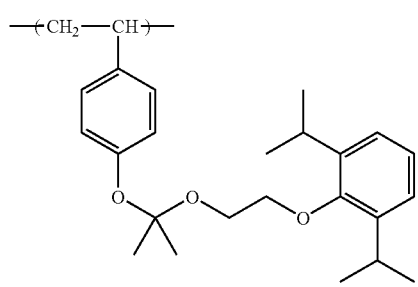 (B-18)

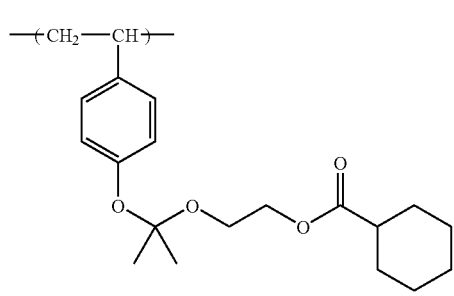 (B-19)

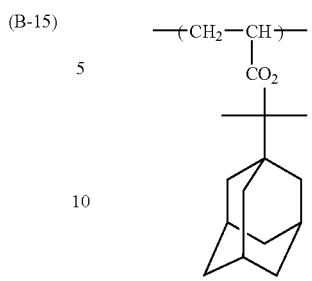 (B-20)

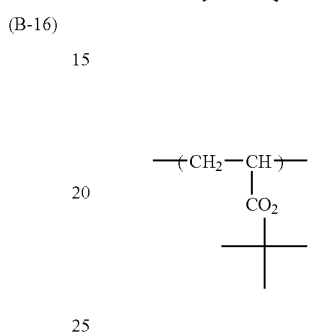 (B-21)

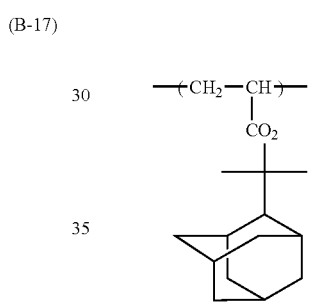 (B-22)

Among these specific examples of the repeating unit having an acid-decomposable group, a PHS acetal such as (B-1), (B-4), (B-5), (B-6), (B-7), (B-8), (B-9), (B-11) and (B-12) is preferred.

The acid-decomposable resin (B) preferably has a repeating unit comprising hydroxystyrenes.

In the acid-decomposable resin (B), a non-acid-decomposable repeating unit may also be introduced for the purpose of adjusting the alkali solubility. The non-acid-decomposable repeating unit is preferably introduced by a method of copolymerizing styrenes, non-acid-decomposable (meth)acrylic acid esters or non-acid-decomposable (meth) acrylic acid amides, or a method of protecting the hydroxyl group of hydroxystyrenes by a non-acid-decomposable substituent.

Preferred examples of the non-acid-decomposable substituent include, but are not limited to, an acetyl group, a mesyl group and a toluenesulfonyl group.

Examples of the styrenes include styrene, chlorostyrene, dichlorostyrene, bromostyrene, dibromostyrene, iodostyrene, methylstyrene, dimethylstyrene, ethylstyrene, isopropylstyrene, methoxystyrene, ethoxystyrene, phenylstyrene, tert-butylstyrene, tert-butoxystytrene. Among these, styrene, methylstyrene, tert-butylstyrene and tert-butoxystyrene are preferred.

Examples of the non-acid-decomposable (meth)acrylic acid esters include methyl(meth)acrylate, ethyl(meth)acrylate, propyl(meth)acrylate, allyl(meth)acrylate, glycidyl (meth)acrylate, benzyl(meth)acrylate and hydroxyethyl (meth)acrylate.

Examples of the non-acid-decomposable (meth)acrylic acid amides include (meth)acrylic acid amide, (meth)acrylic acid phenylamide and (meth)acrylic acid isopropylamide.

At the synthesis of the acid-decomposable resin (B), a copolymerizable monomer may be further copolymerized.

Examples of the copolymerizable monomer include a maleic acid derivative, a maleic anhydride derivative, (meth) acrylonitrile, vinylpyrrolidone, vinylpyridine and vinyl acetate.

In the acid-decomposable resin (B), the content of the repeating unit represented by formula (B1) or (B2) is preferably from 1 to 30 mol %, more preferably from 5 to 15 mol %.

In the acid-decomposable resin (B), the content of the repeating unit having an acid-decomposable group is preferably from 3 to 50 mol %, more preferably from 10 to 30 mol %.

In the acid-decomposable resin (B), the content of the repeating unit comprising hydroxystyrenes is preferably 60 mol % or more, more preferably 65 mol % or more, still more preferably from 70 to 90 mol %. When the content of the repeating unit comprising hydroxystyrenes is 60 mol % or more, the dry etching resistance or sensitivity can be improved.

The weight average molecular weight of the acid-decomposable resin (B) can be measured as a polystyrene-reduced molecular weight (Mw) by gel permeation chromatography (GPC). In view of the resolution, the weight average molecular weight is preferably from 2,000 to 200,000, more preferably from 2,500 to 20,000.

In view of the line edge roughness, the molecular weight dispersity (Mw/Mn) of the acid-decomposable resin (B) is preferably from 1.0 to 3.0, more preferably from 1.0 to 1.5, still more preferably from 1.0 to 1.3.

The acid-decomposable resin (B) having such a small molecular weight dispersity can be obtained by variously changing the synthesis conditions (amount of polymerization solvent, amount of polymerization initiator) of the acid-decomposable resin (B) or the purification conditions (kind and amount of reprecipitation solvent, number of reprecipitation operations) of the acid-decomposable resin (B). For example, the molecular weight may be adjusted by changing the amount of the polymerization solvent or initiator, and the dispersity of the resin may be reduced by changing the reprecipitation solvent or increasing the number of reprecipitation operations. Preferably, two or more kinds of solvents are mixed and used as the reprecipitation solvent, or the reprecipitation operation is performed twice or more times. More preferably, a reprecipitation operation using a reprecipitation solvent prepared by mixing two or more kinds of solvents is performed twice or more times. Alternatively, such an acid-decomposable resin may also be synthesized by preparing a polyvinylphenol having a low molecular weight dispersity through living anion, living radical or living cation polymerization and then acetalizing the polyvinylphenol with use of alkyl vinyl ethers.

The acid-decomposable resin (B) can be obtained, as disclosed, for example, in European Patent 254,853, JP-A-2-25850, JP-A-3-223860 and JP-A-4-251259, by reacting an acid-decomposable group precursor with an alkali-soluble resin such as polyhydroxystyrene or copolymerizing an alkali-soluble resin monomer having bonded thereto an acid-decomposable group with various monomers.

The content of the acid-decomposable resin (B) in the positive resist composition is usually from 70 to 98 mass %, preferably from 75 to 96 mass %, more preferably from 80 to 96 mass %, based on the solid content of the composition.

Specific examples of the acid-decomposable resin (B) are set forth below, but the present invention is not limited thereto.

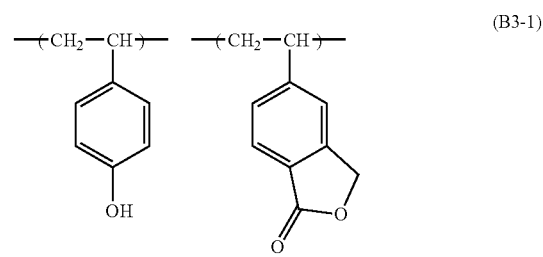

(B3-1)

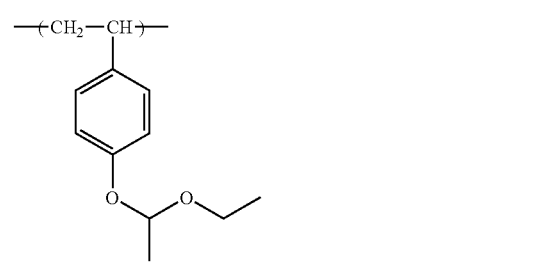

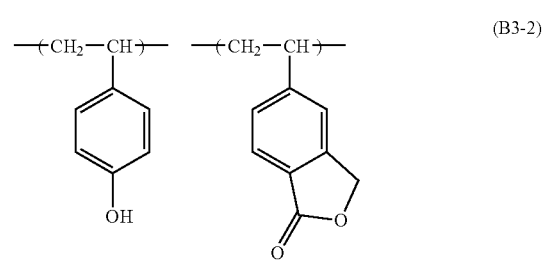

(B3-2)

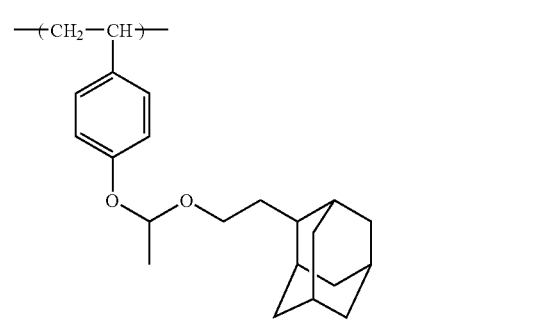

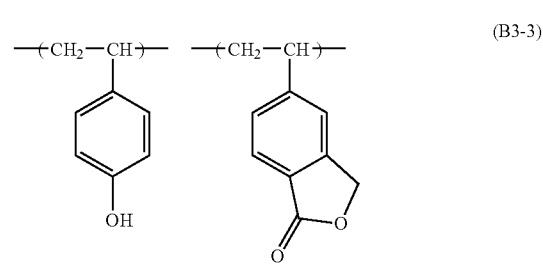

(B3-3)

-continued
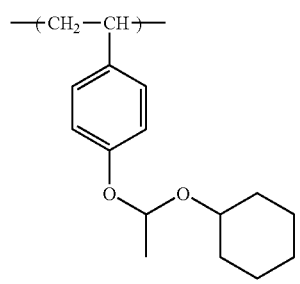
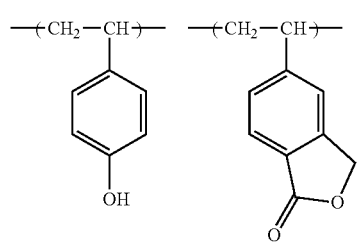
(B3-4)
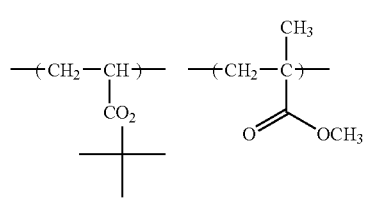
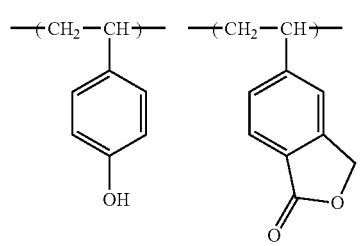
(B3-5)
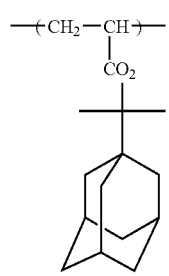
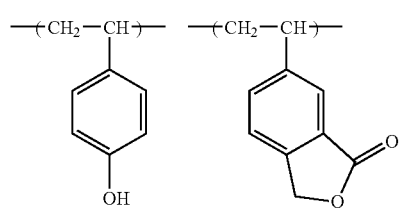
(B3-6)
-continued
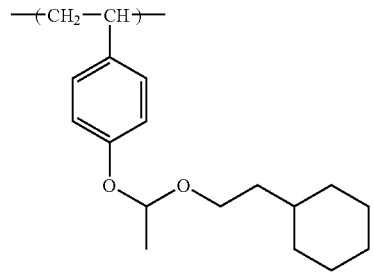
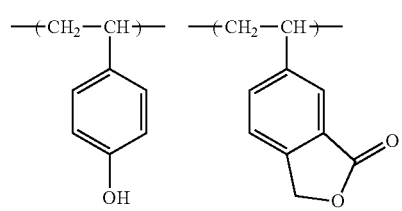
(B3-7)
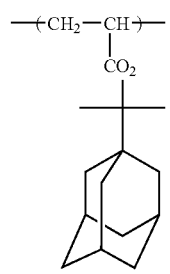
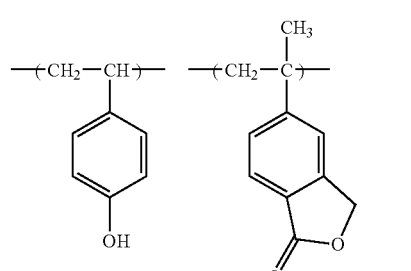
(B3-8)
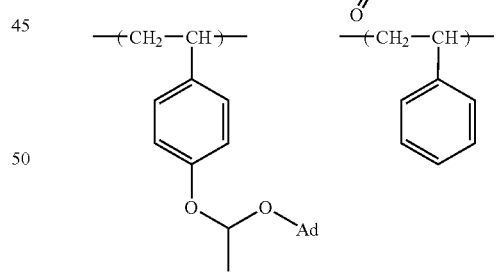
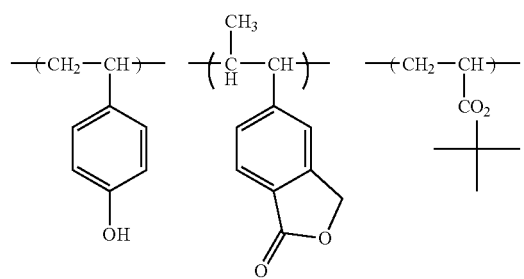
(B3-9)

-continued
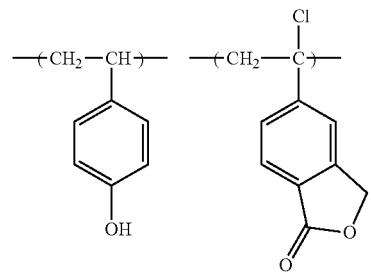
(B3-10)
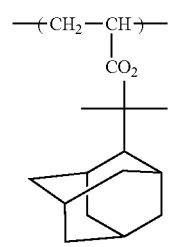
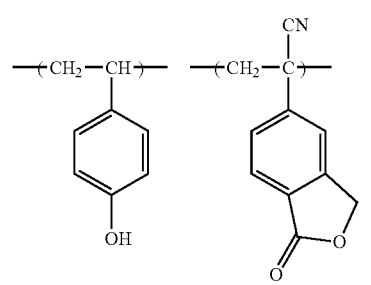
(B3-11)
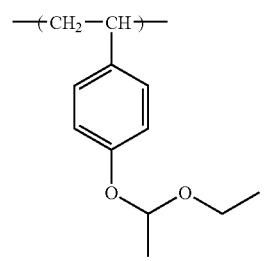
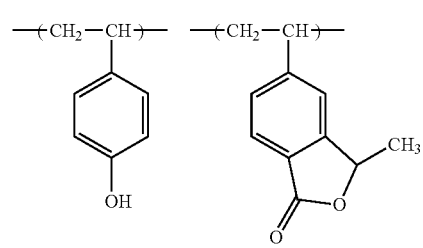
(B3-12)
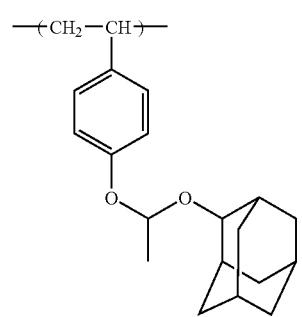
-continued
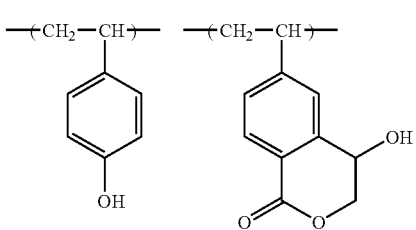
(B3-13)
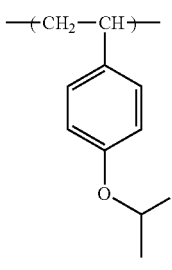
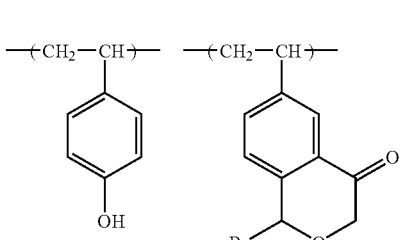
(B3-14)
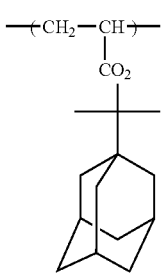
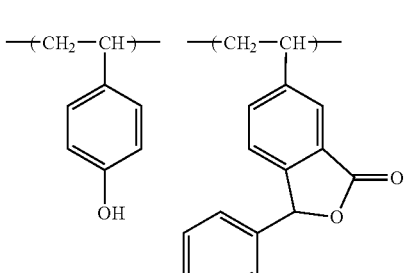
(B3-15)
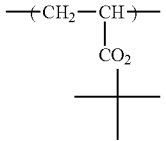

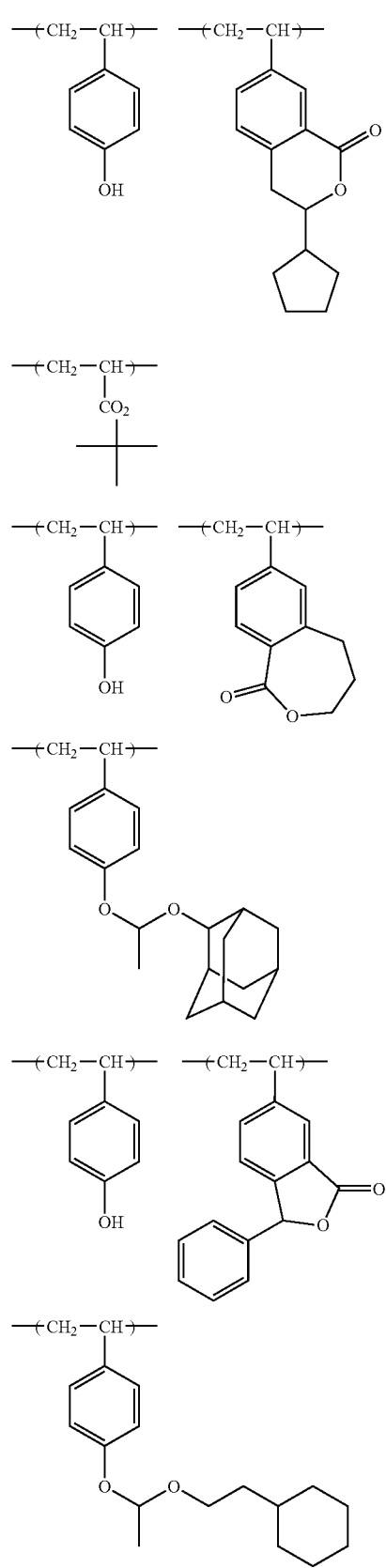
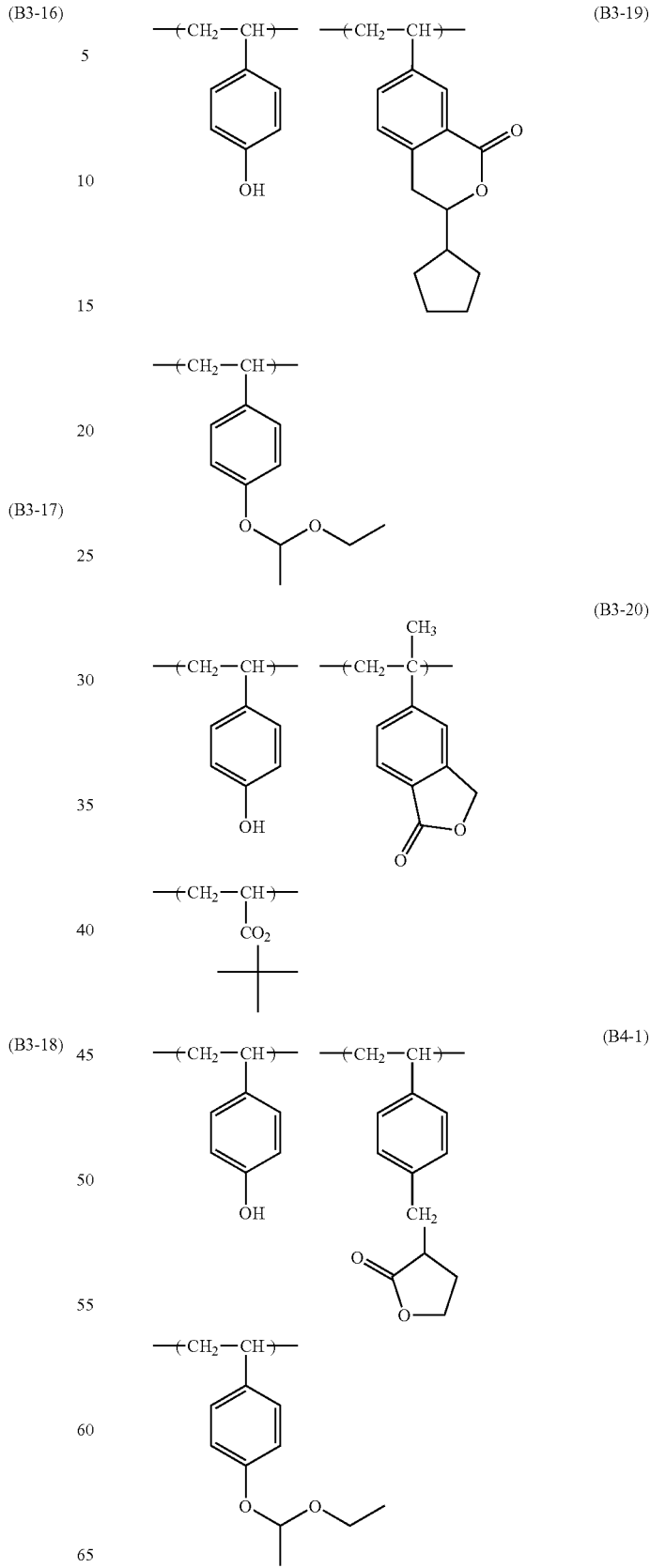

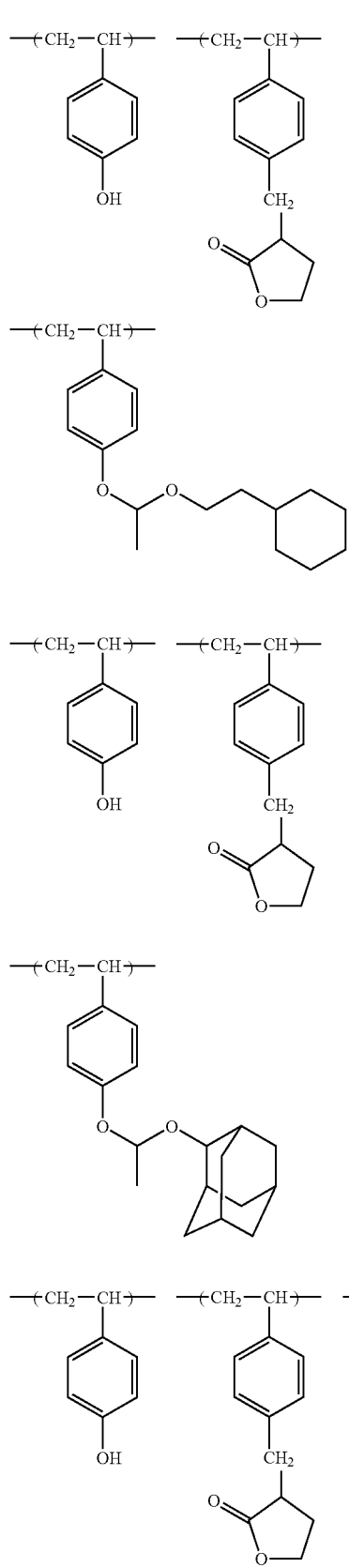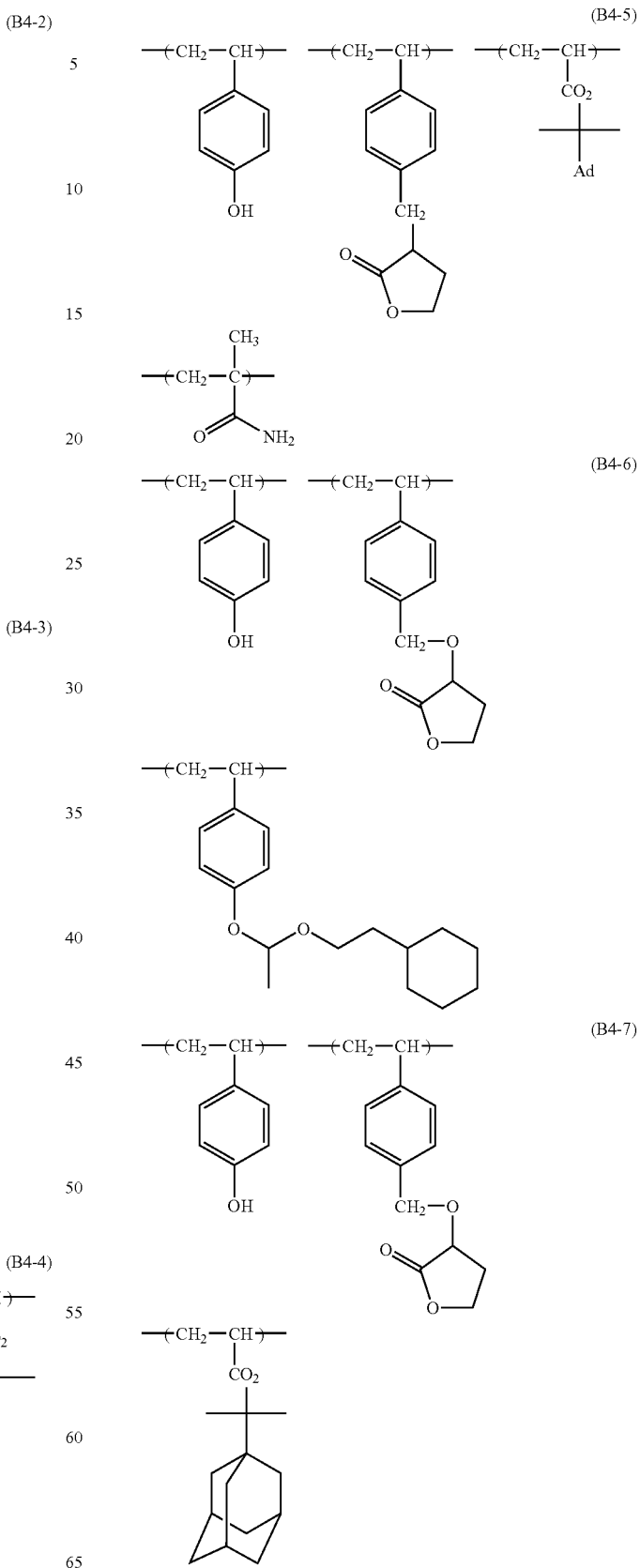

(B4-8)
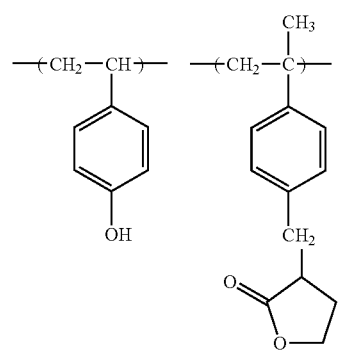
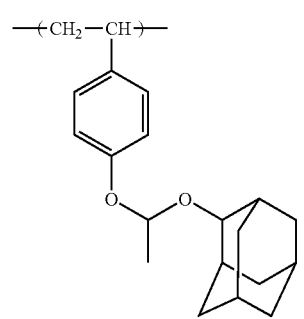
(B4-9)
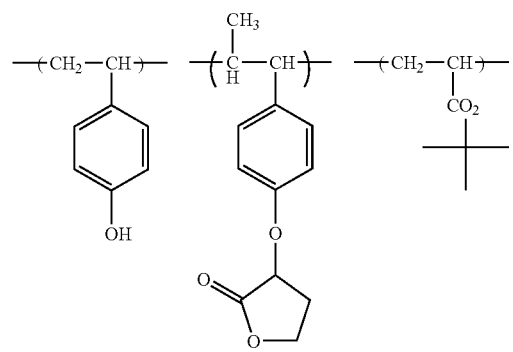
(B4-10)
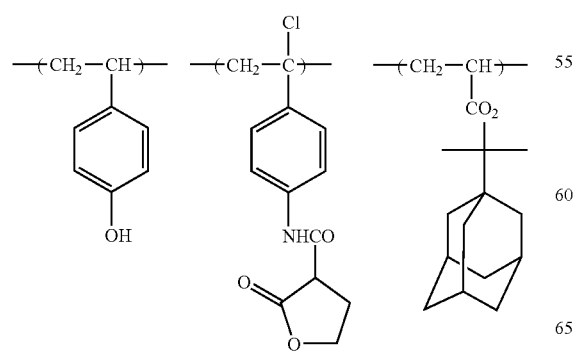
(B4-11)
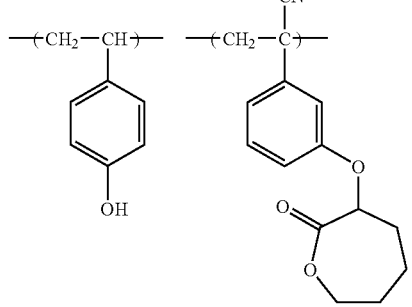
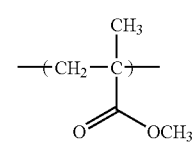
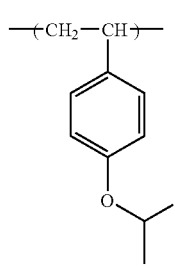
(B4-12)
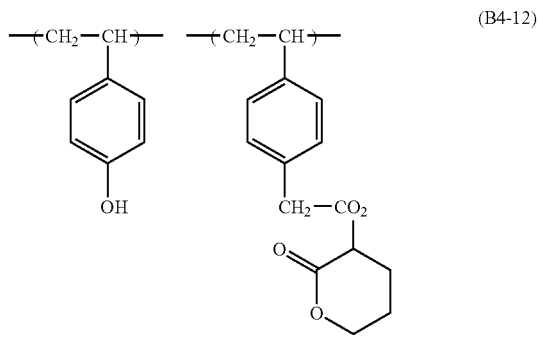
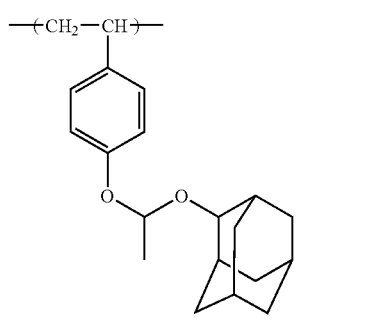
(B4-13)
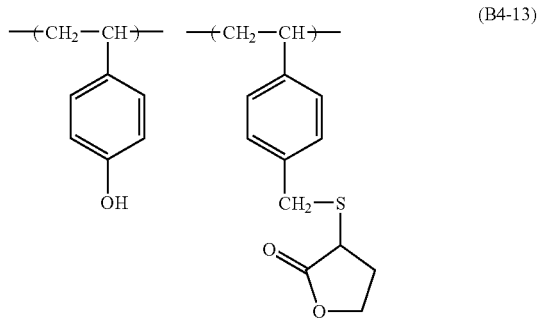

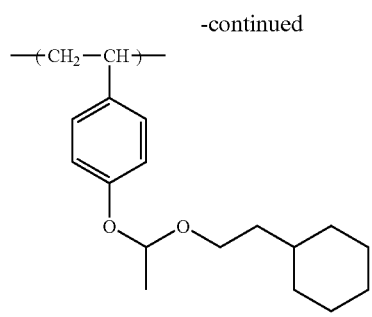
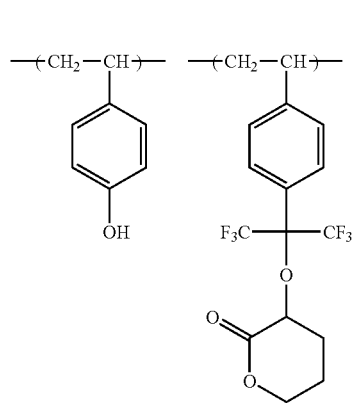
(B4-14)
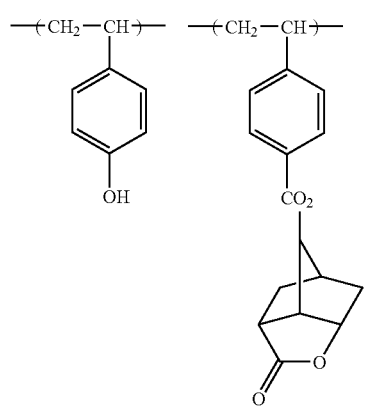
(B4-15)
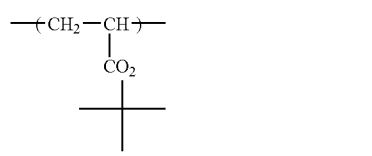
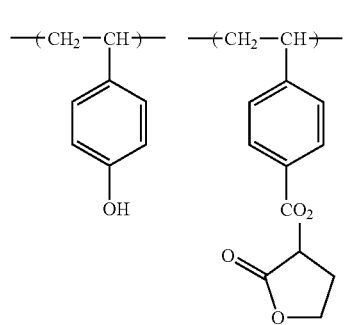
(B4-16)
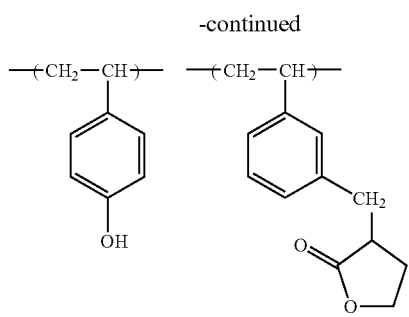
(B4-17)
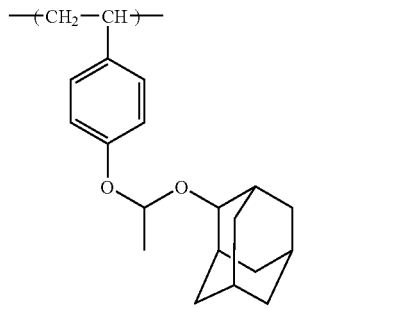
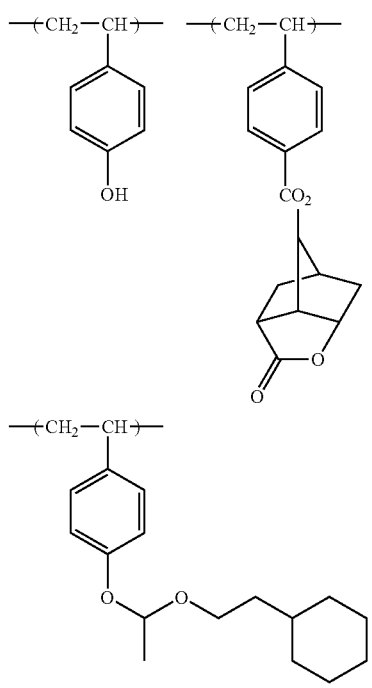
(B4-18)
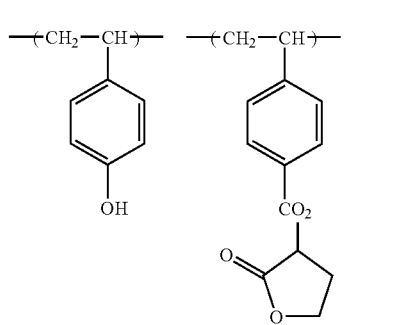
(B4-19)

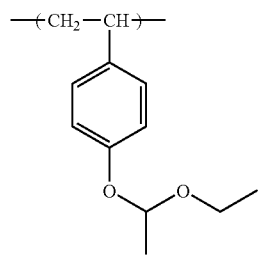
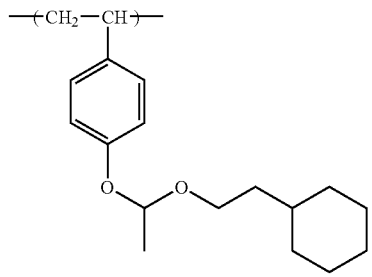
(B4-20)
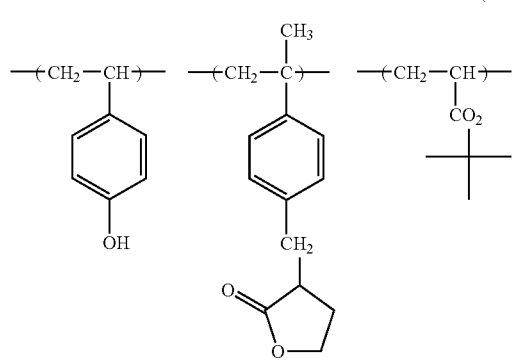
(B4-21)
(B4-22)
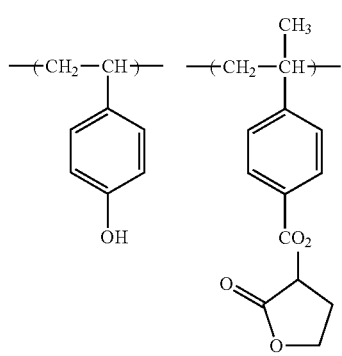
(B4-23)
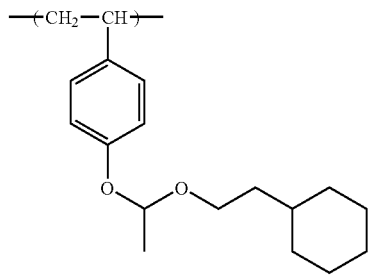
(B4-24)
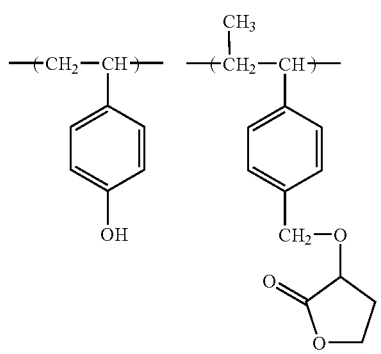
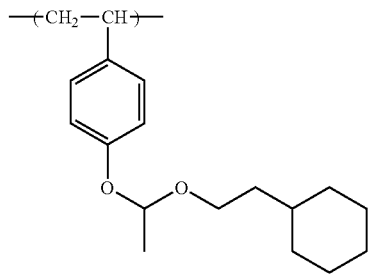

-continued (B4-25)

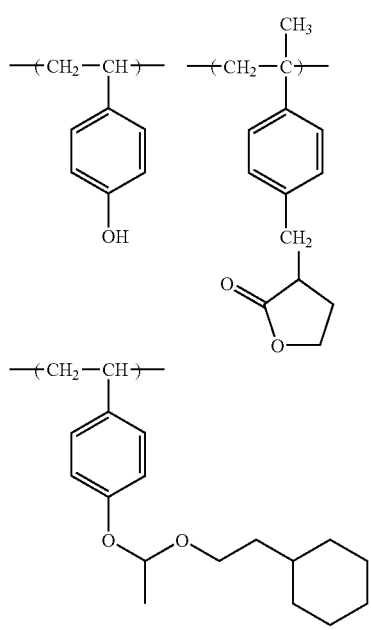

[3] (C) Basic Compound

The positive resist composition of the present invention preferably comprises (C) a basic compound for reducing the change of performance in aging from exposure to heating.

Preferred examples of the structure therefor include structures represented by the following formulae (A) to (E).

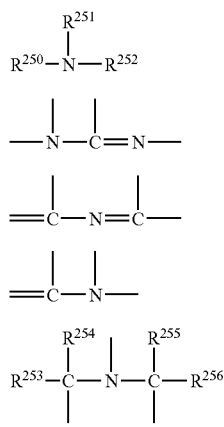

(A)

(B)

(C)

(D)

(E)

In formulae (A) to (E), $R^{250}$, $R^{251}$ and $R^{252}$ each independently represents a hydrogen atom, an alkyl group having a carbon number of 1 to 20, a cycloalkyl group having a carbon number of 3 to 20, or an aryl group having a carbon number of 6 to 20, and $R^{250}$ and $R^{251}$ may combine with each other to form a ring. The alkyl group or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

These groups each may contain an oxygen atom, a sulfur atom or a nitrogen atom in the alkyl chain.

$R^{253}$, $R^{254}$, $R^{255}$ and $R^{256}$ each independently represents an alkyl group having a carbon number of 1 to 6 or a cycloalkyl group.

Preferred examples of the compound include guanidine, aminopyrrolidine, pyrazole, pyrazo line, piperazine, aminomorpho line, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond. These compounds each may have a substituent.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include triarylsulfonium hydroxide, phenacylsulfonium hydroxide and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. Examples of the compound having an onium carboxylate structure include a compound having an onium hydroxide structure where the anion moiety is converted into a carboxylate, such as acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline.

These basic compounds are used individually or in combination of two or more thereof. The amount of the basic compound used is usually from 0.001 to 10 mass %, preferably from 0.01 to 5 mass %, based on the solid content of the positive resist composition. The amount used is preferably 0.001 mass % or more for obtaining a sufficiently high effect by the addition and preferably 10 mass % or less in view of sensitivity and developability of the unexposed part.

[4] (D) Fluorine- and/or Silicon-Containing Surfactant

The positive resist composition of the present invention preferably further comprises (D) any one fluorine- and/or silicon-containing surfactant (a fluorine-containing surfactant, a silicon-containing surfactant or a surfactant containing both a fluorine atom and a silicon atom), or two or more thereof.

When the positive resist composition of the present invention contains the surfactant (D), a resist pattern with good sensitivity, resolution and adhesion and less development defects can be obtained when an exposure light source of 250 nm or less, particularly 220 nm or less, is used.

Examples of the surfactant (D) include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K. K.), Florad FC430 and 431 (produced by Sumitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical). In addition, KP-341 (polysiloxane polymer, produced by Shin-Etsu Chemical Co., Ltd.) may also be used as the silicon-containing surfactant.

Other than those known surfactants, a surfactant using a polymer having a fluoro-aliphatic group derived from a fluoro-aliphatic compound which is produced by telomerization process (also called telomer process) or oligomerization process (also called oligomer process), may be used. The fluoro-aliphatic compound can be synthesized by the method described in JP-A-2002-90991.

The polymer having a fluoro-aliphatic group is preferably a copolymer of fluoro-aliphatic group-containing monomer with (poly(oxyalkylene))acrylate and/or (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of fluoro-aliphatic group-containing monomer and (poly(oxyalkylene))acrylate (or methacrylate) is not limited only to a binary copolymer but may also be a ternary or greater copolymer obtained by simultaneously copolymerizing two or more different fluoro-aliphatic group-containing monomers or two or more different (poly (oxyalkylene))acrylates (or methacrylates).

Examples thereof include, as the commercially available surfactant, Megafac F178, F-470, F-473, F-475, F-476 and F-472 (produced by Dainippon Ink & Chemicals, Inc.), and further include a copolymer of acrylate (or methacrylate) having a $C_6F_{13}$ group with (poly(oxyalkylene))acrylate (or methacrylate), a copolymer of acrylate (or methacrylate) having a $C_6F_{13}$ group with (poly(oxyethylene))acrylate (or methacrylate) and (poly(oxypropylene)) acrylate (or methacrylate), a copolymer of acrylate (or methacrylate) having a $C_8F_{17}$ group with (poly(oxyalkylene))acrylate (or methacrylate), and a copolymer of acrylate (or methacrylate) having a $C_8F_{17}$ group with (poly(oxyethylene))acrylate (or methacrylate) and (poly(oxypropylene))acrylate (or methacrylate).

The amount of the surfactant (D) used is preferably from 0.0001 to 2 mass %, more preferably from 0.001 to 1 mass %, based on the entire amount of the positive resist composition (excluding the solvent).

[5] Organic Solvent

The positive resist composition of the present invention is used by dissolving respective components in a predetermined organic solvent.

Examples of the organic solvent which can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethylsulfoxide, N-methylpyrrolidone and tetrahydrofuran.

In the present invention, these organic solvents may be used individually or as a mixture, but a mixed solvent obtained by mixing a solvent containing a hydroxyl group in the structure and a solvent not containing a hydroxyl group is preferably used. By using such a mixed solvent, the generation of particles during storage of the resist solution can be reduced.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the solvent not containing a hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Among these, propylene glycol monomethyl ether acetate, ethyl ethoxy-propionate, 2-heptanone, γ-butyrolactone, cyclohexanone and butyl acetate are preferred, and propylene glycol monomethyl ether acetate, ethyl ethoxypropionate and 2-heptanone are most preferred.

The mixing ratio (by mass) of the solvent containing a hydroxyl group and the solvent not containing a hydroxyl group is from 1/99 to 99/1, preferably from 10/90 to 90/10, more preferably from 20/80 to 60/40. A mixed solvent in which the solvent not containing a hydroxyl group is contained in an amount of 50 mass % or more is preferred in view of coating uniformity.

In the production or the like of a precision integrated circuit device, the step of forming a pattern on a resist film is performed by coating the positive resist composition of the present invention on a substrate (for example, a transparent substrate such as silicon/silicon dioxide coating, glass substrate, ITO substrate), drying it to form a resist film, irradiating the resist film with KrF excimer laser light, ArF excimer laser light, F2 excimer laser light, electron beam, EUV light or X-ray, and preferably after heating, subjecting the resist film to development, rinsing and drying, whereby a good resist pattern can be formed.

The thickness of the resist film formed by coating the positive resist composition of the present invention and drying it is preferably from 50 to 200 nm. When the thickness of the resist film is from 50 to 200 nm, the dry etching resistance and pattern profile can be enhanced and at the same time, the transmittance of the resist film can be increased.

The thickness of the resist film can be adjusted by the solid content concentration excluding the solvent of the composition, and the solid content concentration is preferably from 5 to 18 mass %, more preferably from 7 to 15 mass %, still more preferably from 9 to 14 mass %.

The alkali developer which can be used for the positive resist composition of the present invention is an aqueous solution of alkalis such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimetylethanolamine, triethanolamine), quaternary ammonium salts (e.g., tetramethylammonium hydroxide, tetraethylammonium hydroxide, choline) and cyclic amines (e.g., pyrrole, piperidine). In this aqueous solution of alkalis, alcohols such as isopropyl alcohol and a surfactant such as nonionic surfactant may be added each in an appropriate amount.

Among these developers, an aqueous solution of quaternary ammonium salt is preferred, and an aqueous solution of tetramethylammonium hydroxide or choline is more preferred.

The alkali concentration of the alkali developer is usually from 0.1 to 20 mass %, and the pH of the alkali developer is usually from 10.0 to 15.0.

EXAMPLES

The present invention is described in greater detail below by referring to Examples, but the present invention should not be construed as being limited thereto.

Synthesis Example 1

Synthesis of Monomer (B2-11)

α-Bromo-γ-butyrolactone (3.8 g) was dissolved in 100 ml of tetrahydrofuran, and 4 g of triethylamine was added thereto. Subsequently, 16.5 g of 4-vinylbenzoic acid was added dropwise over 30 minutes under ice cooling, and the reaction was allowed to proceed at room temperature for 10 hours. Thereafter, 500 ml of ethyl acetate was added to the reaction solution, and the organic layer was washed with water, dried and then concentrated, as a result, a crude product was obtained. This crude produce was purified by column chromatography to obtain 6.9 g of Monomer (B2-11) corresponding to Repeating Unit (B2-11).

Synthesis Example 2

Synthesis of Resin (B4-16)

In a nitrogen stream, 11.3 g of propylene glycol monomethyl ether acetate and 7.5 g of propylene glycol monomethyl ether were charged into a three-neck flask and heated at 80° C. Thereto, a solution obtained by dissolving 18.6 g of Monomer (B2-11), 9.6 g of p-hydroxystyrene and 13.7 g of tert-butyl acrylate in 101.5 g of propylene glycol monomethyl ether acetate, and dissolving V-602 (initiator, produced by Wako Pure Chemical Industries, Ltd.) to a concentration of 8 mol % based on the monomer in 67.6 g of propylene glycol monomethyl ether was added dropwise over 6 hours. After the completion of dropwise addition, the reaction was further allowed to proceed at 80° C. for 2 hours. The reaction solution was left standing to cool and then, poured in 2,200 ml of hexane/245 ml of ethyl acetate, and the powder precipitated was collected by filtration and dried, as a result, 37.5 g of Resin (B4-16) was obtained. The weight average molecular weight of the obtained resin was 8,400 and the dispersity (Mw/Mn) was 1.20.

The weight average molecular weight, compositional ratio (molar ratio) and dispersity (Mw/Mn) of the acid-decomposable resin (B) used in Examples 1 to 20 and Comparative Example are shown in Table 1 below. The acid-decomposable resin (B) in Table 1 are the resins having the repeating units exemplified above in amount of the compositional ratio (molar ratio starting from the left-side repeating unit) in Table 1.

TABLE 1

|       | Weight Average Molecular Weight | Compositional Ratio* | Dispersity |
|-------|--------------------------------|---------------------|------------|
| B3-1  | 8000  | 70/10/20    | 1.65 |
| B3-4  | 8500  | 70/10/10/10 | 1.25 |
| B3-8  | 10000 | 65/15/15/5  | 1.30 |
| B3-14 | 9000  | 75/5/20     | 1.55 |
| B3-18 | 9000  | 70/10/20    | 1.35 |
| B4-2  | 9000  | 70/10/20    | 1.55 |
| B4-5  | 12000 | 65/10/15/10 | 1.05 |
| B4-9  | 8500  | 70/15/15    | 1.60 |
| B4-15 | 8000  | 75/5/20     | 1.40 |
| B4-16 | 8400  | 70/10/20    | 1.20 |
| P1    | 8000  | 70/30       | 1.35 |

The structure of Resin (P1) used in Comparative Example is shown below.

(P1):

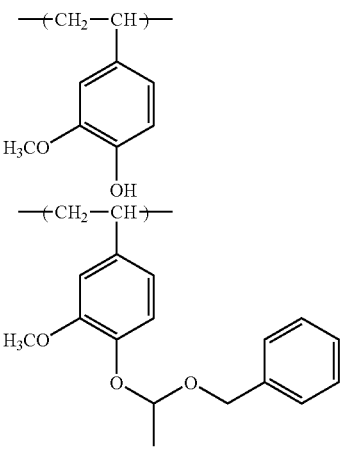

Synthesis of Acid Generator

Synthesis Example 1

Synthesis of 10-tolyl-9-oxothioxanthenium Nonafluorobutanesulfonate (Za1)

Thioxanthen-9-one (10 g) was stirred in 40 ml of trifluoroacetic acid, and a solution prepared by mixing 5.4 ml of aqueous 30% hydrogen peroxide and 10.8 ml of trifluoroacetic acid was gradually added thereto under ice cooling. The resulting solution was stirred for 30 minutes under ice cooling and then stirred at room temperature for 1 hour. The reaction solution obtained was poured in water, and the crystal precipitated was collected by filtration. The obtained crystal was recrystallized from acetonitrile to obtain 4.6 g of a sulfoxide form. Subsequently, 3 g of the sulfoxide form was stirred in 20 ml of toluene, and 3.7 ml of trifluoroacetic anhydride and 2.2 ml nonafluorobutanesulfonic acid were added thereto under ice cooling. The reaction solution obtained was gradually heated to room temperature and then stirred for 1 hour. The crystal was precipitated by adding diisopropyl ether to the reaction solution and then recrystallized from a mixed solvent of ethyl acetate and diisopropyl ether to obtain 3.9 g of 10-tolyl-9-oxothioxanthenium nonafluorobutanesulfonate (Za1).

$^1$H-NMR (400 MHz, CDCl$_3$): δ 2.38 (s, 3H), 7.34 (d, 2H), 7.72 (m, 2H), 7.95 (m, 4H), 8.28 (m, 2H), 8.63 (d, 2H).

Synthesis Example 2

Synthesis of 10-tolyl-9-oxothioxanthenium 3,5-bistrifluoromethylbenzenesulfonate (Za2)

Using 1.5 g of 10-tolyl-9-oxothioxanthenium nonafluorobutanesulfonate (Za1) obtained in Synthesis Example 1, 1.5 g of 10-tolyl-9-oxothioxanthenium nonafluorobutanesulfonate was dissolved in a methanol/water (=1/1) solution, and the resulting solution was passed through an ion exchange resin (Amberlite IRA402C1 in which the anion is replaced by OH with use of aqueous NaOH). After adding 1 g of 3,5-bistrifluoromethylbenzenesulfonic acid thereto, the solution was extracted with chloroform to obtain 1.7 g of 10-tolyl-9-oxothioxanthenium 3,5-bistrifluoromethylbenzenesulfonate (Za2) as a compound changed in the counter salt.

$^1$H-NMR (400 MHz, CDCl$_3$): δ 2.37 (s, 3H), 7.34 (d, 2H), 7.79 (m, 3H), 7.93 (m, 4H), 8.34 (m, 4H), 8.62 (d, 2H).

Synthesis Example 3

Synthesis of 2-acetyl-10-tolyl-9-oxothioxanthenium Nonafluorobutanesulfonate (Za8)

Thiosalicylic acid (15 g) and 20 g of 4-bromoacetophenone were stirred in 200 ml of dimethylformamide in the presence of 12 g of sodium carbonate and 0.2 g of copper catalyst at 170° C. for 6 hours, and the reaction solution obtained was poured in an aqueous hydrochloric acid solution and filtered. The collected crystal was recrystallized from acetonitrile to obtain 16 g of sulfide. Subsequently, 10 g of the sulfide obtained was stirred in 100 g of polyphosphoric acid at 60° C. for 5 hours and then poured in ice water. The crystal was collected by filtration, washed with an aqueous sodium hydrogencarbonate solution and water, and then recrystallized from ethanol to obtain 5 g of 2-acetyl-9H-thioxan-9-one. Furthermore, 3 g of 2-acetyl-9H-thioxan-9-one obtained was stirred in 12 ml of trifluoroacetic acid under ice cooling, and a mixed solution containing 1.4 ml of aqueous 30% hydrogen peroxide and 2.7 ml of trifluoroacetic acid was gradually added thereto. After the addition, the solution was stirred for 30 minutes under ice cooling and then stirred at room temperature for 1 hour, thereby completing the reaction. The reaction solution obtained was poured in water and subjected to liquid separation with ethyl acetate and an aqueous sodium hydroxide solution, and the organic layer was removed by distillation under reduced pressure to obtain 3.6 g of a sulfoxide form. This sulfoxide form was stirred in 15 g of toluene, and 3.3 ml of trifluoroacetic anhydride and 1.9 ml of nonafluorobutanesulfonic acid were added thereto under ice cooling, followed by stirring for 30 minutes under ice cooling and then at room temperature for 1 hour. The reaction solution obtained was subjected to crystallization by adding diisopropyl ether, and the crystal obtained was recrystallized from a mixed solvent of ethyl acetate and diisopropyl ether to obtain 1 g of 2-acetyl-10-tolyl-9-oxothioxanthenium nonafluorobutanesulfonate (Za8).

$^1$H-NMR (400 MHz, CDCl$_3$): δ 2.39 (s, 3H), 2.74 (s, 3H), 7.37 (d, 2H), 7.72 (m, 2H), 7.97 (m, 2H), 8.19 (m, 1H), 8.39 (m, 2H), 8.67 (d, 1H), 9.09 (s, 1H).

Other sulfonium salts (AI) were synthesized in the same manner.

Synthesis Example 4

Synthesis of tri(4-hydroxyphenyl)sulfonium Nonafluorobutanesulfonate (Zb1)

4,4'-Thiodiphenol (10 g) was stirred in 40 ml of trifluoroacetic acid, and a solution prepared by mixing 5.4 ml of aqueous 30% hydrogen peroxide and 10.8 ml of trifluoroacetic acid was gradually added thereto under ice cooling. The resulting solution was stirred for 30 minutes under ice cooling and then stirred at room temperature for 1 hour. The reaction solution obtained was poured in water, and the crystal precipitated was collected by filtration. The obtained crystal was recrystallized from acetonitrile to obtain 4.6 g of a sulfoxide form. Subsequently, 3 g of the sulfoxide form was stirred in 20 ml of toluene, and 3.7 ml of trifluoroacetic anhydride and 2.2 ml nonafluorobutanesulfonic acid were added thereto under ice cooling. The reaction solution obtained was gradually heated to room temperature and then stirred for 1 hour. The crystal was precipitated by adding diisopropyl ether to the reaction solution and then recrystallized from a mixed solvent of ethyl acetate and diisopropyl ether to obtain 3.9 g of tri(4-hydroxyphenyl)sulfonium nonafluorobutanesulfonate (Zb1).

Other compounds (AII) can be synthesized in the same manner.

Examples 1 to 10 and Comparative Example 1

(1) Preparation and Coating of Positive Resist

An acid-decomposable resin, an acid generator, a basic compound and a surfactant were dissolved as shown in Table 2 in propylene glycol monomethyl ether acetate to prepare a solution having a solid content concentration of 8.5 mass %, and the obtained solution was microfiltered through a membrane filter having a pore size of 0.1 μm to obtain a resist composition. This resist solution was coated on a 6-inch silicon wafer by using a spin coater, Mark 8, manufactured by Tokyo Electron Ltd. and then baked at 110° C. for 90 seconds to obtain a resist film having a thickness of 0.30 μm.

(ii) Formation and Evaluation of Positive Resist Pattern

This resist film was then irradiated with electron beams by using an electron beam image-drawing apparatus, HL750 (manufactured by Hitachi Ltd., accelerating voltage: 50 KeV). After the irradiation, the resist film was baked at 110° C. for 90 seconds, dipped in an aqueous 2.38 mass % tetramethylammonium hydroxide (TMAH) solution for 60 seconds, rinsed with water for 30 seconds and then dried. The obtained pattern was evaluated by the following methods.

Sensitivity

The cross-sectional profile of the pattern obtained was observed by using a scanning electron microscope (S-4300, manufactured by Hitachi, Ltd.). The minimum irradiation energy for resolving a 0.15-μm line (line:space=1:1) was defined as the sensitivity.

Resolution

The limiting resolution (the line and space were separated and resolved) at the irradiation dose of giving the above-described sensitivity was defined as the resolution.

Pattern Profile

The cross-sectional profile of a 0.15-μm line pattern at the irradiation dose of giving the above-described sensitivity was observed by using a scanning electron microscope (S-4300, manufactured by Hitachi, Ltd.) and evaluated on a three-stage scale of rectangular, slightly tapered, and tapered.

Line Edge Roughness

With respect to the region of 50 μm in the longitudinal direction of a 0.15-μm line pattern at the irradiation dose of giving the above-described sensitivity, the line width was measured at arbitrary 30 points, and the fluctuation thereof was evaluated in terms of 3σ.

The evaluation results are shown in Table 2.

The abbreviations in Table 2 indicate the followings.

Basic Compound

E-1: tri-n-hexylamine

E-2: 2,4,6-triphenylimidazole

E-3: tetra-(n-butyl)ammonium hydroxide

Surfactant

W-1: a fluorine-containing surfactant, Megafac F-176 (produced by Dainippon Ink & Chemicals, Inc.)

W-2: a fluorine/silicon-containing surfactant, Megafac R08 (produced by Dainippon Ink & Chemicals, Inc.)

W-3: a silicon-containing surfactant, polysiloxane polymer KP-341 (produced by Shin-Etsu Chemical Co., Ltd.)

(TMAH) solution for 60 seconds, the resist film surface was observed by AFM (atomic force microscope). The results are shown in Table 3.

TABLE 3

|  | Sensitivity (mJ/cm$^2$) | Surface Roughness (nm) |
|---|---|---|
| Example 11 | 1.8 | 6.0 |
| Example 12 | 2.2 | 6.0 |
| Example 13 | 2.8 | 7.5 |
| Example 14 | 2.8 | 8.0 |
| Example 15 | 2.0 | 5.5 |
| Comparative Example 2 | 4.0 | 14.0 |

It is seen from Table 3 that in the characteristic evaluation by the irradiation with EUV light, the positive resist composition of the present invention is excellent in the sensitivity and surface roughness.

Examples 16 to 20 and Comparative Example 3

Using each resist composition of Examples 4, 6, 8, 9 and 10 and Comparative Example 1, a resist film was formed by the same method as in Example 1 except for changing the resist film thickness to 0.40 μm. The obtained resist film was

TABLE 2

|  | Acid-Decomposable Resin (g) | Acid Generator (g) | Basic Compound (g) | Surfactant (g) | Sensitivity (μC/cm$^2$) | Resolution (μm) | Pattern Profile | Line Edge Roughness (nm) |
|---|---|---|---|---|---|---|---|---|
| Example 1 | B3-4 (91.6) | Z5 (8.0) | E-1 (0.3) | W-1 (0.1) | 5.0 | 0.09 | rectangular | 5.5 |
| Example 2 | B3-4 (91.6) | Z7 (8.0) | E-1 (0.3) | W-1 (0.1) | 7.0 | 0.13 | rectangular | 7.5 |
| Example 3 | B3-8 (91.1) | Z10 (8.5) | E-1 (0.3) | W-1 (0.1) | 5.5 | 0.10 | rectangular | 5.5 |
| Example 4 | B3-14 (91.6) | Z19 (8.0) | E-3 (0.3) | W-2 (0.1) | 5.5 | 0.10 | rectangular | 6.0 |
| Example 5 | B3-18 (93.6) | Z11 (6.0) | E-2 (0.3) | W-2 (0.1) | 6.0 | 0.09 | rectangular | 6.5 |
| Example 6 | B4-2 (91.6) | Z20 (8.0) | E-1 (0.3) | W-1 (0.1) | 5.5 | 0.10 | rectangular | 5.5 |
| Example 7 | B4-5 (91.3) | Z3 (8.3) | E-1 (0.3) | W-1 (0.1) | 6.5 | 0.11 | rectangular | 8.0 |
| Example 8 | B4-16 (91.2) | Z4 (8.4) | none | W-1 (0.1) | 6.5 | 0.11 | rectangular | 7.5 |
| Example 9 | B4-16 (91.2) | Z2 (8.4) | E-1 (0.3) | W-1 (0.1) | 7.0 | 0.13 | rectangular | 8.0 |
| Example 10 | B4-16 (91.6) | Z4 (8.4) | E-1 (0.3) | W-1 (0.1) | 5.0 | 0.09 | rectangular | 5.5 |
| Comparative Example 1 | P1 (91.6) | Z4 (8.0) | E-1 (0.3) | W-1 (0.1) | 8.0 | 0.15 | slightly tapered | 11.0 |

It is seen from Table 2 that in the pattern formation by the irradiation with electron beams, the positive resist composition of the present invention is assured of high sensitivity and high resolution and excellent in the pattern profile and line edge roughness. Examples 11 to 15 and Comparative Example 2:

Using each resist composition of Examples 1, 6, 8, 9 and 10 and Comparative Example 1, a resist film was formed by the same method as in Example 1 except for changing the resist film thickness to 0.15 μm. The obtained resist film was subjected to surface exposure with use of EUV light (wavelength: 13.5 nm, by Litho Tech Japan Corp.) by changing the exposure amount in steps of 0 to 5.0 mJ and then baked at 110° C. for 90 seconds. Thereafter, the dissolution rate of the film at each exposure amount was measured by using an aqueous 2.38 mass % tetramethylammonium hydroxide (TMAH) solution, and the sensitivity was determined.

Furthermore, a sample irradiated with EUV light in an exposure amount corresponding to ½ of the sensitivity determined above was prepared and after development with an aqueous 2.38 mass % tetramethylammonium hydroxide subjected to pattern exposure with use of a KrF excimer laser stepper (PA3000EX, manufactured by Canon Inc., wavelength: 248 nm). The treatment after exposure was performed in the same manner as in Example 1. The results are shown in Table 4 below.

TABLE 4

|  | Sensitivity (mJ/cm$^2$) | Resolution (μm) | Pattern Profile | Line Edge Roughness (nm) |
|---|---|---|---|---|
| Example 16 | 15 | 0.12 | rectangular | 6.5 |
| Example 17 | 18 | 0.12 | rectangular | 6.0 |
| Example 18 | 21 | 0.13 | rectangular | 7.0 |
| Example 19 | 20 | 0.14 | rectangular | 7.5 |
| Example 20 | 17 | 0.11 | rectangular | 6.5 |
| Comparative Example 3 | 28 | 0.17 | slightly tapered | 13.0 |

It is seen from Table 4 that in the pattern formation by the exposure with a KrF excimer laser, the positive resist composition of the present invention is assured of high sensitivity and high resolution and excellent in the pattern profile and line edge roughness as compared with Comparative Example.

The weight average molecular weight, compositional ratio (in terms of molar ratio of respective repeating units, starting from the left) and the weight average molecular weight of the acid-decomposable resin (B) used in Examples 21 to 104 later are shown in Table 6 below.

TABLE 6

| | Weight Average Molecular Weight | Compositional Ratio (molar ratio) | Dispersity |
|---|---|---|---|
| B3-1 | 8000 | 68/10/22 | 1.15 |
| B3-2 | 6500 | 69/12/19 | 1.10 |
| B3-3 | 10000 | 69/10/21 | 1.20 |
| B3-4 | 12000 | 60/10/25/5 | 1.35 |
| B3-5 | 8500 | 70/9/21 | 1.10 |
| B3-6 | 8000 | 70/9/21 | 1.15 |
| B3-7 | 9000 | 68/12/20 | 1.50 |
| B3-8 | 9500 | 65/10/20/5 | 1.20 |
| B3-9 | 15000 | 60/13/27 | 1.25 |
| B3-10 | 8600 | 64/11/25 | 1.35 |
| B3-11 | 9700 | 64/12/24 | 1.05 |
| B3-12 | 10500 | 69/10/21 | 1.35 |
| B3-13 | 7600 | 69/10/21 | 1.20 |
| B3-14 | 5500 | 69/10/21 | 1.20 |
| B3-15 | 6800 | 69/9/22 | 1.05 |
| B3-16 | 10000 | 71/7/22 | 1.10 |
| B3-17 | 9500 | 71/6/23 | 1.25 |
| B3-18 | 9600 | 73/5/22 | 1.50 |
| B3-19 | 6000 | 69/8/23 | 1.35 |
| B3-20 | 9000 | 60/15/25 | 1.30 |
| B4-1 | 8800 | 73/10/17 | 1.20 |
| B4-2 | 6900 | 66/5/29 | 1.15 |
| B4-3 | 13000 | 60/13/27 | 1.35 |
| B4-6 | 9900 | 67/14/19 | 1.10 |
| B4-7 | 8800 | 63/13/24 | 1.20 |
| B4-9 | 7000 | 64/12/24 | 1.65 |
| B4-10 | 8000 | 67/7/26 | 1.10 |
| B4-11 | 9500 | 60/15/20/5 | 1.40 |
| B4-13 | 8000 | 72/8/20 | 1.45 |
| B4-14 | 9000 | 63/15/22 | 1.35 |
| B4-15 | 9700 | 66/13/21 | 1.50 |
| B4-16 | 10000 | 69/11/20 | 1.25 |
| B4-17 | 11000 | 66/9/25 | 1.05 |
| B4-18 | 9500 | 65/8/27 | 1.25 |
| B4-21 | 9000 | 66/13/21 | 1.20 |
| B4-22 | 8500 | 65/10/25 | 1.15 |
| B4-23 | 10000 | 68/5/27 | 1.55 |
| B4-24 | 9500 | 66/14/20 | 1.05 |
| B4-25 | 8000 | 67/12/21 | 1.40 |

Examples 21 to 62 and Comparative Examples 4 and 5

Preparation of Positive Resist Composition

A resin: 0.948 g (in terms of solid content),
an acid generator: 0.05 g,
a basic compound: 0.003 g, and
a surfactant: 0.002 g shown in Tables 7 and 8 below were dissolved in 16.79 g of propylene glycol monomethyl ether acetate to prepare a solution having a solid content concentration of 5.0 mass %. This solution was filtered through a 0.1-μm tetrafluoroethylene-made filter to obtain a positive resist solution.

Formation and Evaluation of Pattern

The thus-prepared positive resist solution was uniformly coated by a spin coater on a silicon wafer treated with hexamethyldisilazane and then dried under heating at 120° C. for 90 seconds to form a positive resist film having a film thickness of 0.15 μm. The obtained resist film was subjected to surface exposure with use of EUV light (wavelength: 13 nm) by changing the exposure amount in steps of 0.5 mJ from 0 to 10.0 mJ and then baked at 110° C. for 90 seconds. Thereafter, the dissolution rate of the film at each exposure amount was measured by using an aqueous 2.38 mass % tetramethylammonium hydroxide (TMAH) solution, and a sensitivity curve was obtained. The exposure amount when the dissolution rate of resist was saturated in this sensitivity curve, was designated as the sensitivity.

Subsequently, a sample irradiated with EUV light in an exposure amount corresponding to ½ of the sensitivity determined above was prepared and after development with an aqueous 2.38 mass % tetramethylammonium hydroxide (TMAH) solution for 60 seconds, the resist film surface was observed by AFM (atomic force microscope) (surface roughness).

Also, a resist film was irradiated in an irradiation dose 2.0 times the irradiation dose (mJ/cm$^2$) at the sensitivity determined by performing surface exposure with EUV light, the film thickness after exposure (before post-heating) was measured, and the coefficient of variation was determined from the thickness when the resist film was not exposed, according to the following formula (outgassing):

Coefficient of variation of film thickness=(film thickness when not exposed–film thickness after exposure)/film thickness when not exposed The evaluation results are shown in Tables 7 and 8.

TABLE 7

| | | Composition | | | | Evaluation | | |
|---|---|---|---|---|---|---|---|---|
| | | Resin | Acid Generator | Basic Compound | Surfactant | Sensitivity (mJ/cm$^2$) | Surface Roughness (nm) | Outgassing (evaluation of film thickness) (%) |
| Example | 21 | B3-1 | Za1 | E-1 | W-1 | 2.3 | 5.5 | 99.0 |
| | 22 | B3-2 | Za36 | E-2 | W-2 | 2.1 | 5.4 | 98.6 |
| | 23 | B3-3 | Za14 | E-3 | W-1 | 2.4 | 5.0 | 98.5 |
| | 24 | B3-4 | Za2 | E-1 | W-3 | 2.1 | 5.3 | 98.6 |
| | 25 | B3-5 | Za35 | E-1 | W-1 | 2.2 | 5.2 | 97.9 |
| | 26 | B3-6 | Za3 | E-3 | W-3 | 2.1 | 5.5 | 98.6 |
| | 27 | B3-7 | Za4 | E-2 | W-1 | 2.0 | 5.2 | 98.3 |

TABLE 7-continued

| | | Composition | | | Evaluation | | |
|---|---|---|---|---|---|---|---|
| | | | | | | Surface | Outgassing (evaluation of |
| | Resin | Acid Generator | Basic Compound | Surfactant | Sensitivity (mJ/cm$^2$) | Roughness (nm) | film thickness) (%) |
| 28 | B3-8 | Za34 | E-1 | W-1 | 2.3 | 5.5 | 98.1 |
| 29 | B3-9 | Za23 | E-1 | W-3 | 2.3 | 5.1 | 98.2 |
| 30 | B3-10 | Za48 | E-1 | W-1 | 2.6 | 5.8 | 98.3 |
| 31 | B3-11 | Za5 | E-1 | W-2 | 2.1 | 5.0 | 98.4 |
| 32 | B3-12 | Za33 | E-3 | W-1 | 2.0 | 5.3 | 97.9 |
| 33 | B3-13 | Za18 | E-2 | W-2 | 2.3 | 5.5 | 97.8 |
| 34 | B3-14 | Za6 | E-2 | W-2 | 2.4 | 5.4 | 98.8 |
| 35 | B3-15 | Za22 | E-2 | W-3 | 2.0 | 5.0 | 98.8 |
| 36 | B3-16 | Za31 | E-1 | W-2 | 2.0 | 5.3 | 98.6 |
| 37 | B3-17 | Za7 | E-2 | W-3 | 2.3 | 5.2 | 98.3 |
| 38 | B3-18 | Za41 | E-3 | W-1 | 2.3 | 5.5 | 98.1 |
| 39 | B3-19 | Za44 | E-2 | W-1 | 2.0 | 5.1 | 98.2 |
| 40 | B3-20 | Za45 | E-1 | W-1 | 2.6 | 5.7 | 98.3 |
| 41 | B4-1 | Za18 | E-3 | W-3 | 2.1 | 5.5 | 98.4 |
| 42 | B4-2 | Za8 | E-2 | W-1 | 2.0 | 5.2 | 97.9 |
| 43 | B4-3 | Za9 | E-1 | W-1 | 2.6 | 5.7 | 99.5 |
| 44 | B4-6 | Za47 | E-2 | W-3 | 2.7 | 5.8 | 98.4 |
| 45 | B4-7 | Za15 | E-2 | W-3 | 2.1 | 5.0 | 98.7 |

TABLE 8

| | | | Composition | | | Evaluation | | |
|---|---|---|---|---|---|---|---|---|
| | | | | | | | Surface | Outgassing (evaluation of |
| | | Resin | Acid Generator | Basic Compound | Surfactant | Sensitivity (mJ/cm$^2$) | Roughness (nm) | film thickness) (%) |
| Example | 46 | B4-9 | Za10 | E-2 | W-1 | 2.0 | 5.5 | 98.6 |
| | 47 | B4-10 | Za40 | E-2 | W-1 | 2.3 | 5.4 | 98.0 |
| | 48 | B4-11 | Za11 | E-2 | W-1 | 2.4 | 5.0 | 98.0 |
| | 49 | B4-13 | Za38 | E-1 | W-2 | 2.0 | 5.3 | 98.3 |
| | 50 | B4-14 | Za12 | E-2 | W-3 | 2.0 | 5.5 | 98.1 |
| | 51 | B4-15 | Za30 | E-3 | W-2 | 2.7 | 5.7 | 98.2 |
| | 52 | B4-16 | Za13 | E-1 | W-3 | 2.0 | 5.0 | 98.3 |
| | 53 | B4-17 | Za21 | E-3 | W-3 | 2.1 | 5.3 | 98.4 |
| | 54 | B4-18 | Za20 | E-1 | W-1 | 2.1 | 5.2 | 97.9 |
| | 55 | B4-21 | Za17 | E-3 | W-2 | 2.0 | 5.5 | 97.9 |
| | 56 | B4-22 | Za42 | E-2 | W-3 | 2.3 | 5.1 | 97.8 |
| | 57 | B4-23 | Za17 | E-1 | W-1 | 2.3 | 5.4 | 98.8 |
| | 58 | B4-24 | Za42 | E-3 | W-2 | 2.3 | 5.0 | 98.8 |
| | 59 | B4-25 | Za17 | E-2 | W-2 | 2.1 | 5.3 | 99.0 |
| | 60 | B3-6 | z18 | E-1 | W-1 | 3.0 | 6.5 | 94.3 |
| | 61 | B3-11 | z15 | E-1 | W-1 | 3.1 | 6.3 | 93.6 |
| | 62 | B4-10 | z3 | E-1 | W-1 | 3.2 | 6.8 | 94.0 |
| Comp. Exam. 4 | | P1 | Za17 | E-1 | W-1 | 3.0 | 8.8 | 98.0 |
| Comp. Exam. 5 | | P1 | Za9 | E-1 | W-1 | 3.2 | 10.2 | 98.4 |

It is seen from the results in Tables 7 and 8 that in the characteristic evaluation by the irradiation with EUV light, the positive resist composition of the present invention is excellent in the sensitivity, surface roughness and outgassing.

Examples 63 to 104 and Comparative Examples 6 and 7

Preparation of Positive Resist Composition

A resin: 0.948 g (in terms of solid content),
an acid generator: 0.05 g,
a basic compound: 0.003 g, and
a surfactant: 0.002 g
shown in Tables 9 and 10 below were dissolved in 16.79 g of propylene glycol monomethyl ether acetate to prepare a solution having a solid content concentration of 5.0 mass %. This solution was filtered through a 0.1-µm tetrafluoroethylene-made filter to obtain a positive resist solution.

Formation and Evaluation of Pattern

The thus-prepared positive resist solution was uniformly coated by a spin coater on a silicon wafer treated with hexamethyldisilazane and then dried under heating at 120° C. for 90 seconds to form a positive resist film having a film thickness of 0.15 µm. The obtained resist film was subjected to surface exposure with use of EUV light (wavelength: 13 nm) by changing the exposure amount in steps of 0.5 mJ from 0 to 10.0 mJ and then baked at 110° C. for 90 seconds. Thereafter, the dissolution rate of the film at each exposure amount was measured by using an aqueous 2.38 mass % tetramethylammonium hydroxide (TMAH) solution, and a sensitivity curve was obtained. The exposure amount when the dissolution rate of resist was saturated in this sensitivity curve, was designated as the sensitivity. Also, the dissolution contrast (γ value) was calculated from the gradient in the straight line part of the sensitivity curve. As the γ value is larger, the dissolution contrast is higher.

Subsequently, a sample irradiated with EUV light in an exposure amount corresponding to ½ of the sensitivity determined above was prepared and after development with an aqueous 2.38 mass % tetramethylammonium hydroxide (TMAH) solution for 60 seconds, the resist film surface was observed by AFM (atomic force microscope) (surface roughness).

Furthermore, a resist film was irradiated in an irradiation dose 2.0 times the irradiation dose (mJ/cm²) at the sensitivity determined by performing surface exposure with EUV light, the film thickness after exposure (before post-heating) was measured, and the coefficient of variation was determined from the thickness when the resist film was not exposed, according to the following formula (outgassing):

Coefficient of variation of film thickness=(film thickness when not exposed−film thickness after exposure)/film thickness when not exposed After the exposure, the resist film was heated (PEB) on a hot plate at a temperature of 107° C. and 113° C. for 90 seconds, and the difference in the sensitivity was determined according to the following formula and evaluated as the PEB temperature dependency. A resist film showing a smaller value is more excellent.

(PEB Temperature dependency)=(sensitivity of 113° C.)−(sensitivity of 107° C.)

The evaluation results are shown in Tables 9 and 10.

As for the acid generator (Compound (AII)) used, the structure is shown together with the boiling point at 1 atm of the alkane and arene corresponding to $R^{1b}$ to $R^{3b}$ in formula (AII), that is, $R^{1b}$—H, $R^{2b}$—H and $R^{3b}$—H. Here, for the sake of convenience, the compounds are designated as Ra—H, Rb—H and Rc—H in the order of increasing the boiling point.

TABLE 9

| | | Composition | | | Acid Generator | | | Evaluation | | | | |
|---|---|---|---|---|---|---|---|---|---|---|---|---|
| | | Resin | Basic Compound | Surfactant | Structure | Boiling Point (° C.) | | | Sensitivity (mJ/cm²) | Surface Roughness (nm) | γ Value | Coefficient of Variation of Film Thickness after Exposure (%) | PEB Temperature Dependency (mJ/cm²) |
| | | | | | | Ra-H | Rb-H | Rc-H | | | | | |
| Example | 63 | B3-1 | E-1 | W-1 | Zb1 | 181.8 | 181.8 | 181.8 | 2.3 | 5.5 | 5.8 | 1.1 | 0.20 |
| | 64 | B3-2 | E-2 | W-2 | Zb2 | 168.5 | 168.5 | 168.5 | 2.1 | 5.4 | 6.4 | 1.6 | 0.23 |
| | 65 | B3-3 | E-3 | W-1 | Zb3 | 170 | 170 | 170 | 2.4 | 5.0 | 6.3 | 1.7 | 0.24 |
| | 66 | B3-4 | E-1 | W-3 | Zb4 | 191.1 | 191.1 | 191.1 | 2.7 | 5.7 | 5.5 | 0.7 | 0.30 |
| | 67 | B3-5 | E-1 | W-1 | Zb5 | 168.5 | 168.5 | 181.8 | 2.2 | 5.2 | 6.3 | 0.8 | 0.15 |
| | 68 | B3-6 | E-3 | W-3 | Zb6 | 211.03 | 211.03 | 211.03 | 2.1 | 5.5 | 6.5 | 0.4 | 0.11 |
| | 69 | B3-7 | E-2 | W-1 | Zb7 | 202 | 202 | 202 | 2.0 | 5.2 | 6.6 | 0.6 | 0.12 |
| | 70 | B3-8 | E-1 | W-1 | Zb8 | 201 | 201 | 201 | 2.3 | 5.5 | 6.7 | 0.6 | 0.11 |
| | 71 | B3-9 | E-1 | W-3 | Zb9 | 290 | 290 | 290 | 2.3 | 5.1 | 6.2 | 0.4 | 0.09 |
| | 72 | B3-10 | E-1 | W-1 | Zb10 | 250 | 250 | 250 | 2.1 | 5.4 | 6.0 | 0.4 | 0.08 |
| | 73 | B3-11 | E-1 | W-2 | Zb11 | 255.3 | 255.3 | 255.3 | 2.6 | 5.7 | 5.5 | 0.4 | 0.32 |
| | 74 | B3-12 | E-3 | W-1 | Zb12 | 191.1 | 193 | 211.03 | 2.3 | 5.3 | 6.0 | 1.0 | 0.21 |
| | 75 | B3-13 | E-2 | W-2 | Zb13 | 193 | 193 | 193 | 2.4 | 5.2 | 5.7 | 0.9 | 0.24 |
| | 76 | B3-14 | E-2 | W-2 | Zb14 | 169.5 | 169.5 | 169.5 | 2.0 | 5.5 | 5.8 | 1.6 | 0.23 |
| | 77 | B3-15 | E-2 | W-3 | Zb15 | 259 | 259 | 259 | 2.0 | 5.2 | 5.9 | 0.4 | 0.20 |
| | 78 | B3-16 | E-1 | W-2 | Zb1 | 181.8 | 181.8 | 181.8 | 2.3 | 5.5 | 5.8 | 1.5 | 0.19 |
| | 79 | B3-17 | E-2 | W-3 | Zb2 | 168.5 | 168.5 | 168.5 | 2.0 | 5.1 | 6.4 | 1.6 | 0.24 |
| | 80 | B3-18 | E-3 | W-1 | Zb1 | 181.8 | 181.8 | 181.8 | 2.3 | 5.4 | 6.3 | 1.4 | 0.23 |
| | 81 | B3-19 | E-2 | W-1 | Zb2 | 168.5 | 168.5 | 168.5 | 2.0 | 5.0 | 6.4 | 1.7 | 0.20 |
| | 82 | B3-20 | E-1 | W-1 | Zb1 | 181.8 | 181.8 | 181.8 | 2.1 | 5.3 | 6.3 | 1.5 | 0.19 |
| | 83 | B4-1 | E-3 | W-3 | Zb1 | 181.8 | 181.8 | 181.8 | 2.1 | 5.5 | 6.5 | 1.5 | 0.12 |
| | 84 | B4-2 | E-2 | W-1 | Zb2 | 168.5 | 168.5 | 168.5 | 2.0 | 5.4 | 6.6 | 1.5 | 0.11 |
| | 85 | B4-3 | E-1 | W-1 | Zb3 | 170 | 170 | 170 | 2.4 | 5.5 | 6.7 | 1.5 | 0.24 |
| | 86 | B4-6 | E-2 | W-3 | Zb4 | 191.1 | 191.1 | 191.1 | 2.7 | 5.7 | 5.5 | 0.9 | 0.31 |
| | 87 | B4-7 | E-2 | W-3 | Zb5 | 168.5 | 168.5 | 181.8 | 2.1 | 5.0 | 6.0 | 1.4 | 0.20 |
| | 88 | B4-9 | E-2 | W-1 | Zb6 | 211.03 | 211.03 | 211.03 | 2.0 | 5.5 | 5.7 | 0.5 | 0.19 |
| | 89 | B4-10 | E-2 | W-3 | Zb7 | 202 | 202 | 202 | 2.3 | 5.4 | 6.0 | 0.6 | 0.24 |
| | 90 | B4-11 | E-2 | W-1 | Zb8 | 201 | 201 | 201 | 2.4 | 5.3 | 5.9 | 0.6 | 0.23 |

TABLE 10

| | | Composition | | | Acid Generator | | | | Evaluation | | | | |
|---|---|---|---|---|---|---|---|---|---|---|---|---|---|
| | | | Basic | | | Boiling Point (° C.) | | | Sensitivity | Surface Roughness | γ Value | Coefficient of Variation of Film Thickness after Exposure (%) | PEB Temperature Dependency |
| | Resin | Compound | Surfactant | Structure | Ra-H | Rb-H | Rc-H | (mJ/cm²) | (nm) | | | | (mJ/cm²) |
| Example 91 | B4-13 | E-1 | W-2 | Zb9 | 290 | 290 | 290 | 2.0 | 5.5 | 5.8 | 0.4 | 0.22 |
| 92 | B4-14 | E-2 | W-3 | Zb10 | 250 | 250 | 250 | 2.3 | 5.4 | 6.4 | 0.4 | 0.20 |
| 93 | B4-15 | E-3 | W-2 | Zb11 | 255.3 | 255.3 | 255.3 | 2.6 | 5.7 | 5.4 | 0.4 | 0.30 |
| 94 | B4-16 | E-1 | W-3 | Zb12 | 191.1 | 193 | 211.03 | 2.0 | 5.1 | 6.4 | 0.7 | 0.24 |
| 95 | B4-17 | E-3 | W-1 | Zb13 | 193 | 193 | 193 | 2.3 | 5.0 | 6.3 | 0.7 | 0.17 |
| 96 | B4-18 | E-1 | W-1 | Zb14 | 169.5 | 169.5 | 169.5 | 2.3 | 5.5 | 6.5 | 1.4 | 0.15 |
| 97 | B4-21 | E-3 | W-2 | Zb1 | 181.8 | 181.8 | 181.8 | 2.0 | 5.4 | 6.6 | 1.2 | 0.11 |
| 98 | B4-22 | E-2 | W-1 | Zb2 | 168.5 | 168.5 | 168.5 | 2.0 | 5.0 | 6.4 | 1.4 | 0.12 |
| 99 | B4-23 | E-1 | W-1 | Zb1 | 181.8 | 181.8 | 181.8 | 2.3 | 5.3 | 5.9 | 1.2 | 0.24 |
| 100 | B4-24 | E-3 | W-2 | Zb2 | 168.5 | 168.5 | 168.5 | 2.0 | 5.5 | 6.1 | 1.3 | 0.17 |
| 101 | B4-25 | E-2 | W-2 | Zb1 | 181.8 | 181.8 | 181.8 | 2.1 | 5.4 | 5.8 | 1.3 | 0.22 |
| 102 | B3-6 | E-1 | W-1 | B'1 | 80 | 80 | 80 | 3.2 | 6.5 | 4.1 | 7.6 | 0.91 |
| 103 | B3-11 | E-1 | W-1 | B'2 | 159 | 159 | 159 | 3.1 | 6.6 | 3.8 | 8.3 | 0.78 |
| 104 | B4-10 | E-1 | W-1 | B'2 | 159 | 159 | 159 | 3.1 | 6.8 | 3.6 | 9.6 | 1.03 |
| Comp. Exam. 6 | P1 | E-1 | W-1 | Zb7 | 202 | 202 | 202 | 3.1 | 8.2 | 3.2 | 0.7 | 0.98 |
| Comp. Exam. 7 | P1 | E-1 | W-1 | Zb4 | 191.1 | 191.1 | 191.1 | 3.2 | 9.6 | 3.5 | 1.2 | 1.00 |

The abbreviations in Tables 9 and 10 indicate the followings.

Acid Generator

Zb'1: triphenylsulfonium pentafluorobenzenesulfonate boiling point of decomposition product (benzene): 80.2° C. (literature value) boiling point of decomposition product (propylbenzene): 159.2° C. (literature value)

(Zb'2)

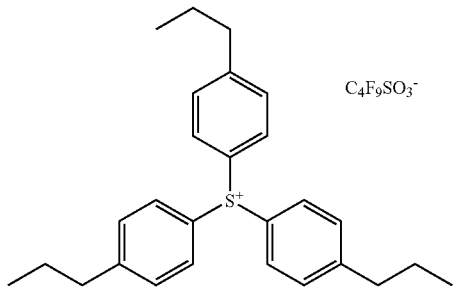

It is seen from the results in Tables 9 and 10 that in the characteristic evaluation by the irradiation with EUV light, the positive resist composition of the present invention is excellent in view of sensitivity, surface roughness, dissolution contrast, coefficient variation of film thickness after exposure, and PEB temperature dependency. The small coefficient of variation of film thickness means less occurrence of outgassing.

This application is based on Japanese patent application JP 2005-081527, filed on Mar. 22, 2005, the entire content of which is hereby incorporated by reference, the same as if set forth at length.

What is claimed is:

1. A positive resist composition comprising: (A) a compound capable of generating an acid upon irradiation with actinic rays or radiation; and (B) a resin of which solubility in an alkali developer increases under the action of an acid, the resin comprising at least a repeating unit represented by the following formula (B1) or (B2):

(B1)

(B2)

wherein

Z represents an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group, Lc1 represents an atomic group for forming a lactone structure together with two carbon atoms of the aromatic ring, Lc2 represents a group having a lactone structure, Ra and Rb each independently represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group, m represents an integer of 1 to 4, and n represents an integer of 0 to 4.

2. The positive resist composition as claimed in claim 1, wherein in formula (B1), the lactone structure formed by Lc1 is a lactone structure represented by the following formula (X1) and said lactone structure shares two adjacent carbon atoms with the aromatic ring of formula (B1):

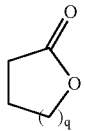

(X1)

wherein q represents an integer of 0 to 20.

3. The positive resist composition as claimed in claim 1, wherein in formula (B2), Lc2 is represented by the following formula (X2):

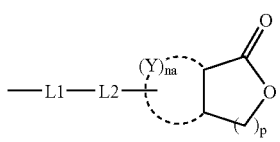

(X2)

wherein

L1 represents a single bond or a divalent linking group,

L2 represents a single bond or a group selected from alkylene, —O—, —OCO—, —COO—, —NHCO—, —CONH—, —S—, —SO$_2$— and —SO$_3$—, Y represents an atomic group for forming a crosslinked alicyclic structure together with two carbon atoms of the lactone structure, provided that when na is 0, L2 may be linked to any carbon atom of the lactone structure, na represents 0 or 1, and p represents an integer of 0 to 20.

4. The positive resist composition as claimed in claim 1, wherein the compound (A) is a compound capable of generating an organic sulfonic acid upon irradiation with actinic rays or radiation.

5. The positive resist composition as claimed in claim 1, wherein the compound (A) is a compound capable of generating a benzenesulfonic acid upon irradiation with actinic rays or radiation.

6. The positive resist composition as claimed in claim 1, wherein the compound (A) is a sulfonium salt (AI) containing a cation represented by the following formula (AI):

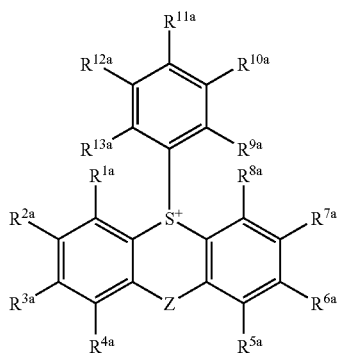

(AI)

wherein $R^{1a}$ to $R^{13a}$ each independently represents a hydrogen atom or a substituent and may combine with each other to form a ring, and Z represents a single bond or a divalent linking group.

7. The positive resist composition as claimed in claim 1, wherein the compound (A) is a compound (AII) represented by the following formula (AII):

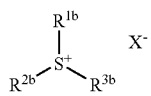

(AII)

wherein $R^{1b}$, $R^{2b}$ and $R^{3b}$ each independently represents an alkyl group, a cycloalkyl group or an aryl group, provided that the compounds ($R^{1b}$—H), ($R^{2b}$—H) and ($R^{3b}$—H) all have a boiling point of 160° C. or more (1 atm), and X⁻ represents a non-nucleophilic anion.

8. The positive resist composition as claimed in claim 1, which further comprises an organic basic compound.

9. The positive resist composition as claimed in claim 1, wherein the actinic rays or radiation is EUV.

10. The positive resist composition as claimed in claim 1, wherein the actinic rays or radiation is KrF.

11. A pattern forming method comprising: forming a resist film from the positive resist composition claimed in claim 1; and exposing and developing said resist film.

* * * * *